United States Patent [19]
Fukuyama et al.

[11] Patent Number: 5,654,207
[45] Date of Patent: Aug. 5, 1997

[54] METHOD OF MAKING TWO-TERMINAL NONLINEAR DEVICE AND LIQUID CRYSTAL APPARATUS INCLUDING THE SAME

[75] Inventors: Toshiaki Fukuyama, Nara; Masakazu Matoba, Tenri; Yoshihisa Ishimoto, Sakai; Masahiro Kishida, Nabari; Toshiyuki Yoshimizu, Soraku-gun; Takeshi Seike, Kitakatsuragi-gun, all of Japan

[73] Assignee: Sharp Kabushiki Kaisha, Osaka, Japan

[21] Appl. No.: 409,451

[22] Filed: Mar. 23, 1995

Related U.S. Application Data

[63] Continuation-in-part of Ser. No. 188,818, Jan. 31, 1994, Pat. No. 5,442,224.

[30] Foreign Application Priority Data

| Feb. 3, 1903 | [JP] | Japan | 5-016569 |
| Mar. 8, 1993 | [JP] | Japan | 5-046959 |
| May 31, 1993 | [JP] | Japan | 5-129775 |
| Aug. 11, 1993 | [JP] | Japan | 5-199790 |
| Mar. 25, 1994 | [JP] | Japan | 6-056310 |

[51] Int. Cl.[6] .......................... H01L 21/285; H01L 21/84
[52] U.S. Cl. ........................................ 204/192.17; 438/957
[58] Field of Search .................. 204/192.12, 192.15, 204/192.26, 192.29, 298.26, 298.28, 192.17; 437/192, 195, 21, 187, 245

[56] References Cited

U.S. PATENT DOCUMENTS

| 3,148,129 | 9/1964 | Basseches et al. |
| 3,521,765 | 7/1970 | Kauffman et al. ............... 118/49 |
| 3,847,658 | 11/1974 | Kumagai ........................... 204/192 |
| 3,878,079 | 4/1975 | Schauer ........................ 204/298.26 |
| 4,058,445 | 11/1977 | Anders ............................. 204/192 |
| 4,364,099 | 12/1982 | Koyama et al. ................. 361/305 |
| 4,413,883 | 11/1983 | Baraff et al. .................... 350/334 |
| 5,128,784 | 7/1992 | Suzuki et al. ..................... 359/58 |
| 5,274,485 | 12/1993 | Narita et al. ...................... 359/58 |
| 5,281,485 | 1/1994 | Colgan et al. ................ 204/192.15 |
| 5,281,554 | 1/1994 | Shimada et al. ................. 437/187 |

FOREIGN PATENT DOCUMENTS

| 0388986 | 9/1990 | European Pat. Off. |
| 46-17267 | 5/1971 | Japan . |
| 61-32673 | 7/1986 | Japan . |
| 61-32674 | 7/1986 | Japan . |
| 1-281437 | 11/1989 | Japan ............................ 359/58 |
| 2-257123 | 10/1990 | Japan . |
| 2-298921 | 12/1990 | Japan . |
| 3-45931 | 2/1991 | Japan ........................ 204/192.15 |
| 3-42885 | 2/1991 | Japan ........................ 204/192.15 |
| 3-48826 | 3/1991 | Japan . |
| 3-73932 | 3/1991 | Japan . |
| 5-179437 | 7/1993 | Japan . |
| 2091468 | 7/1982 | United Kingdom . |

OTHER PUBLICATIONS

S. Wolf & R.N. Tauber, "Silicon Processing for the VLSI Era", vol. I, pp. 362–365. Jan. 1986.

Y. Koana et al., Japanese Laid-Open Patent Publication No. 62-205656, Laid open on Sep. 10, 1987 with partial English translation (which is cited in the English text, p. 4, lines 27–28).

(List continued on next page.)

*Primary Examiner*—Charles L. Bowers, Jr.
*Assistant Examiner*—Leon Radomsky
*Attorney, Agent, or Firm*—Nixon & Vanderhye P.C.

[57] ABSTRACT

A two-terminal nonlinear device according to the present invention includes a lower electrode of a thin Ta film doped with nitrogen which is formed on a substrate, an anodized oxide film formed by anodizing a surface of the lower electrode, and an upper electrode of a metal thin film which is formed on the anodized oxide film, wherein the thin Ta film includes a structure in which first portions and second portions are alternately deposited, the first portions containing a different amount of nitrogen from that contained in the second portions.

7 Claims, 43 Drawing Sheets

OTHER PUBLICATIONS

Y. Shimada et al., Japanese Laid–Open Patent Publication No. 4–13861, Laid open on Jan. 17, 1992 with partial English translation (which is cited in the English text, p. 5, lines 7–8).

Y. Shimada et al., Japanese Laid–Open Patent Publication No. 5–47708, Laid opn on Feb. 28, 1993 with partial English translation (which is cited in the English text, p. 5, lines 7–8).

H. Yamanaka, Japanese Patent Publication No. 46–17267, Published on May 13, 1971 with partial English translation (which is cited in the English text, p. 4, lines 14–15).

H. Nomura, Japanese Patent Publication No. 61–32673, Published on Jul. 28, 1986 with partial English translation (which is cited in the English text, p. 2, lines 25–26).

H. Nomura, Japanese Patent Publication No. 61–32674, Published on Jul. 28, 1986 with partial English translation (which is cited in the English text, p. 2, lines 25–26).

Y. Mori, Japanese Laid–Open Patent Publication No. 2–298921, Laid open on Dec. 11, 1990 with partial English translation.

K. Suzuki et al., Japanese Laid–Open Patent Publication No. 3–73932, Laid open on Mar. 28, 1991 with partial English translation.

N. Ono, Japanese Laid–Open Patent Publication No. 2–257123, Laid open Oct. 17, 1990 with partial English translation.

Fig. 25A

CONTENT OF NITROGEN IN TARGET  N = 3%

FLOW RATE RATIO OF $N_2$ GAS    $N_2$ = 2%

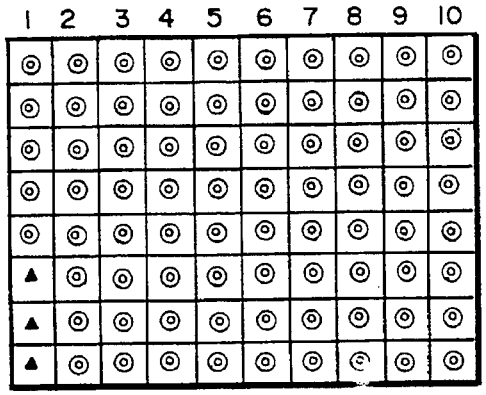

Fig. 25B

CONTENT OF NITROGEN IN TARGET  N = 5%

FLOW RATE RATIO OF $N_2$ GAS    $N_2$ = 0%

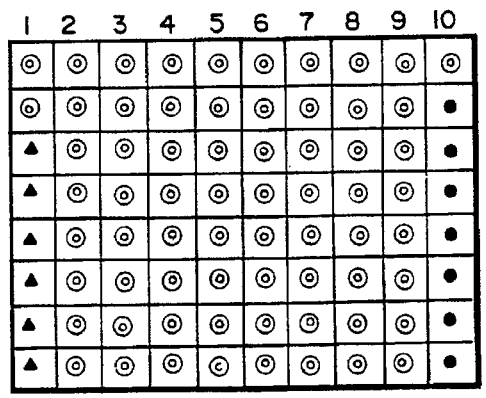

Fig. 25C

CONTENT OF NITROGEN IN TARGET  N = 0%

FLOW RATE RATIO OF $N_2$ GAS    $N_2$ = 2.9%

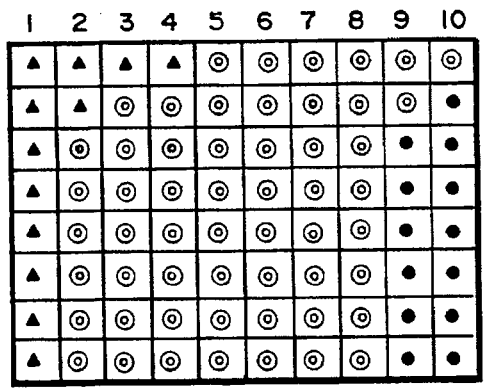

Fig. 25D

CONTENT OF NITROGEN IN TARGET  N = 0%

FLOW RATE RATIO OF $N_2$ GAS    $N_2$ = 4.3%

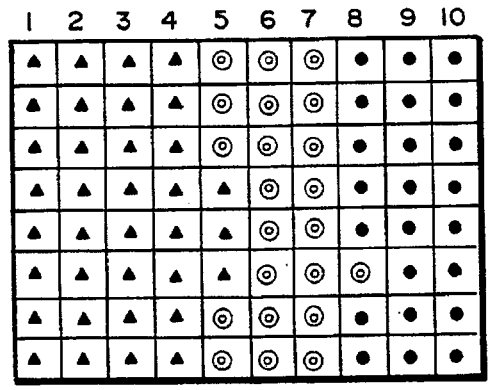

- ● -- Difference from Average Value    ~ -20%
- ◉ -- Difference from Average Value - 20%    ~ 20%
- ▲ -- Difference from Average Value   20%    ~

$t_1$ : FORMATION OF UPPER ELECTRODE $t_2$: FORMATION OF PIXEL ELECTRODE $t_3$: FORMATION OF ORIENTATION FILM $t_4$: COMPLETION OF LIQUID CRYSTAL CELL

METHOD OF MAKING TWO-TERMINAL NONLINEAR DEVICE AND LIQUID CRYSTAL APPARATUS INCLUDING THE SAME

CROSS-REFERENCE TO RELTED APPLICTION

This application is a continuation-in-part of application Ser. No. 08/188,818, filed Jan. 31, 1994, U.S. Pat. No. 5,442,224.

BACKGROUND OF THE INVENTION

1. Field of the Invention

The present invention relates to a two-terminal nonlinear device. Such a device may be used, for instance, in a liquid crystal display apparatus, as a switching element.

2. Description of the Related Art

In recent years, liquid crystal display apparatuses have been widely used in various fields, such as an audio visual (AV) field and an office automation (OA) field. In particular, products of the low end are equipped with twisted nematic (TN), or super twisted nematic (STN) passive type liquid crystal display apparatuses, and products of high quality are equipped with active matrix type liquid crystal display apparatuses using thin film transistors (TFTs) which are three-terminal nonlinear devices.

The active matrix liquid crystal display apparatus is superior to a cathode ray tube (CRT) for its characteristics of color reproducibility, saving space, light weight, and lower power. Due to such characteristics, applications thereof have been rapidly developed. However, in the case of using the TFTs as switching elements, from 6 to 8 times or more fabrication processes of a thin film and a photolithography process are required for forming the TFTs, thus increasing the manufacturing costs. On the other hand, the liquid crystal display apparatus using two-terminal nonlinear devices as the switching elements is superior to the liquid crystal display apparatus using the TFTs for its savings in cost, and superior to a liquid crystal display apparatus of a passive type for its display quality. Thus, the liquid crystal display apparatus using two-terminal nonlinear devices has been rapidly developed.

As the above-mentioned two-terminal nonlinear device, two-terminal nonlinear devices of a Schottky diode type, a varistor type, and an MIM (metal-insulator-metal) type have conventionally been known. In recent years, two-terminal nonlinear devices of a D$^2$R (double diode plus reset) type and an organic ferroelectric thin film type have been widely studied. However, only the MIM and D$^2$R two-terminal nonlinear devices are in practical use. The MIM two-terminal nonlinear device (hereinafter, referred to as "the MIM device") includes upper and lower electrodes interposing an insulator therebetween. For example, the MIM device disclosed in Japanese Patent Publication Nos. 61-32673 and 61-32674, and U.S. Pat. No. 4,413,883 is explained. The lower electrode is formed of a thin Ta film on a substrate or a base coating film formed thereon. The insulator is formed by the anodization of the surface of the lower electrode. In this case, the insulator is a Ta$_2$O$_5$ layer. The upper electrode of one of Ta, Cr, Ti and Al is formed thereon. The MIM device can be produced using less than one third of processes required for fabricating the TFT. Therefore, the MIM devices are mainly used in the liquid crystal display apparatus using the two-terminal nonlinear devices.

The liquid crystal display apparatus using the MIM devices includes an active matrix substrate on which MIM devices and pixel electrodes are formed and a counter substrate on which the wiring of an ITO transparent conductive film or the like, is formed in a stripe shape so as to cross the wiring provided on the active matrix substrate at right angles. The two substrates are attached to each other by pressure and heat, thereby fabricating a liquid crystal cell.

The liquid crystal cell is fabricated as follows:

First, an orientation film formed of polyimide type organic polymer is coated onto each of the active matrix substrate and the counter substrate, then subjected to a rubbing treatment so as to align liquid crystal molecules. Successively, a sealing agent is coated onto one substrate and a spacer is dispersed on the other substrate. The two substrates in this state are attached to each other and pressed by heat. After that, liquid crystal is injected between the substrates and the resulting substrates are sealed. In this way, the liquid crystal cell is fabricated.

In order to realize a display with high quality, it is required that the MIM device has a symmetrical curve of a current-voltage characteristic while a positive voltage and a negative voltage are applied to the lower electrode. Further, the MIM device capacity should be smaller than the liquid crystal capacity. The asymmetrical curve of the current-voltage characteristic causes the occurrence of a residual image on the display. There is a problem regarding crosstalk, in the case where the MIM device capacity is not small enough with respect to the liquid crystal capacity.

In order to prevent the residual image and crosstalk, various techniques have been studied. For example, an insulator is usually formed by anodizing a lower electrode. As described in Japanese Patent Publication No. 46-17267, anodization is a conventionally established method. An insulator having high through-put and superior productivity can be obtained by the anodization. Further, a technique in which the resistance of wiring is reduced in order to obtain a display apparatus of a larger size and high quality has been studied. For example, a thin Ta film used for the wiring is doped with nitrogen so as to reduce the specific resistance. In this case, it has been confirmed that the specific resistance of the Ta thin film can be reduced down to 40–100 μΩcm.

Japanese Laid-Open Patent Publication No. 62-205656 discloses a method for reducing the specific resistance of a thin film used as a lower electrode and an electrode line by mixing Ta with Mo (molybdenum). It is described that the specific resistance of the thin film can be reduced to 40 μΩcm by this method. However, when Ta is mixed with Mo to form an alloy, Mo in the thin film is eluted during anodization of the lower electrode and the electrode line. The resultant oxide insulator film is not as fine-grained as the oxide film obtained by anodic oxidation of a thin film formed of only Ta.

Japanese Laid-Open Patent Publication Nos. 4-13861 and 5-47708 each disclose a method for reducing the specific resistance of a thin film used as a lower electrode and an electrode line by doping Ta with nitrogen, using Kr (krypton) gas mixed with nitrogen gas as the sputtering gas. It is described that the specific resistance can be decreased to 40 μΩcm by this method.

If the specific resistance of the Ta thin film is excessively low, the specific resistance of a TaO$_x$ film formed by anodic oxidation of a surface of the Ta thin film is raised. As a result, the symmetry of the current-voltage characteristic of the MIM device in the positive levels of the voltage and in the negative levels of the voltage is lowered. The inventors of the present invention have found that, when the specific resistance of the Ta thin film is 40 μΩcm or lower, such symmetry is too low to prevent generation of residual images on a display panel of the liquid crystal display device. Accordingly, in the case where a Ta thin film is used as the lower electrode of an MIM device, a specific resistance of the Ta thin film should not be low. By the methods disclosed in the above-mentioned three publications, the specific resistance of the Ta thin film is 40 μΩcm, which is not preferable.

However, while forming the liquid crystal cell, the active matrix substrate and the counter substrate are pressed and attached to each other by a heat treatment of relatively high temperature (approximately in the range of 150° to 200° C.). As shown in FIG. 45, the nonlinearity of the MIM device is gradually reduced, as the time for the heat treatment increases. The deterioration of the nonlinearity of the MIM device can be remarkably observed, particularly in the case where a thin film of Ta having a β structure (hereinafter, referred to as "a β-Ta film") is used as a lower electrode.

The β-Ta film has conventionally been used in various fields. The β-Ta film is deposited by sputtering in an atmosphere of Ar (argon) gas using a pure Ta target with a purity of 99.99%. Namely, the β-Ta film is deposited by a reactive sputtering method using a piece of target. In the case of using the β-Ta film as the lower electrode of the MIM device, immediately after the MIM device is formed, the nonlinearity of the MIM device is satisfactory; however, since the active matrix substrate where the MIM device is formed is thermally treated as described above, after the formation of the MIM device, the nonlinearity thereof is remarkably deteriorated. Accordingly, the temperature for the heat treatment should be decreased. However, the active matrix substrate and the counter substrate are not satisfactorily attached to each other by heat and pressure under low temperature, thus reducing reliability of the liquid crystal display apparatus.

On the contrary, the specific resistance of the thin Ta film is conventionally reduced by doping nitrogen into the Ta thin film, which can prevent the deterioration of the nonlinearity of the MIM device. In generally, Ta thin film is disposed with nitrogen using (Ar+$N_2$) gas or (Kr+$N_2$) gas as the sputtering gas. Such a method is generally referred to as "reactive sputtering". In reactive sputtering, nitrogen reacts to Ta while sputtering and is then taken into the thin film. Accordingly, it is important that nitrogen gas should flow uniformly in the sputtering chamber. The inventors of the present invention have found that, when the flow rate ratio of nitrogen gas with respect to Kr gas exceeds around 4%, the amount of nitrogen taken into the Ta thin film is non-uniform. This problem is not solved by the present technology of operating the sputtering apparatus. Hereinafter, the study conducted by the inventors of the present invention will be described.

SUMMARY OF THE INVENTION

Inventors of the present invention fabricated the MIM device having a thin Ta film doped with nitrogen which was deposited by the reactive sputtering method using a piece of target in an atmosphere of (Ar=$N_2$) gas, and examined the nonlinearity of the MIM device. FIG. 46 shows the change of the nonlinearity of the MIM device, in the case where the thin Ta film doped with nitrogen is deposited with various kinds of the flow rate ratio of $N_2$ gas.

It is understood from FIG. 46 that as the density of nitrogen gas becomes smaller (i.e., the amount of nitrogen in the thin Ta film becomes smaller), the nonlinearity of the MIM device becomes generally smaller. In contrast, when the density of nitrogen gas is large (i.e., the amount of nitrogen is large), the deterioration of the nonlinearity of the MIM device can be prevented. However, in the case of a high flow rate ratio of $N_2$ gas, there is a problem in that the nonlinearity of the MIM device is not uniform and therefore unstable at high temperature.

As one of factors making unstable the nonlinearity of the MIM device unstable, the uneven thickness of the insulator, is considered.

The uneven thickness of the insulator is caused as follows:

For example, in a reactive sputtering method in an atmosphere of (Ar+$N_2$) gas, nitrogen in $N_2$ gas is taken in the thin Ta film which is deposited. Thus, it is important that $N_2$ gas is uniformly introduced into a sputtering chamber. However, the inventors' studies show that when the flow rate ratio of $N_2$ gas to Ar gas is more than approximately 4%, the number of nitrogen atoms taken in the Ta film is not uniform, making it extremely difficult to uniformly regulate the number of the nitrogen atoms in the thin Ta film. Due to this, the thickness of the insulator formed by anodizing the Ta film doped with nitrogen is not uniform.

Table 1 shows the relationships of the flow ratio of $N_2$ gas in an atmosphere of (Ar+$N_2$) gas, the nonlinearity of the MIM device using a thin Ta film and the resistance value of the thin Ta film, in the case of forming the thin Ta film doped with nitrogen by reactive sputtering. As is understood from Table 1, when the flow rate ratio of $N_2$ gas is more than approximately 4%, the amount of nitrogen in the thin Ta film is not uniform, so that the resistance value is not uniform. In this case, when the thin Ta film is anodized, an insulator having an uneven thickness will be formed, because the resistance value of the thin Ta film is not uniform.

TABLE 1

| Flow Rate Ratio of $N_2$ gas to (Ar + $N_2$) gas | MIM Device Characteristics (Nonlinearity) | Uniformity (Resistance) | Note |
| --- | --- | --- | --- |
| 2.2% | ☆☆ | ☆☆☆☆ | |
| 2.9% | ☆☆☆ | *☆☆☆☆ | *FIG. 7 |
| 3.1% | ☆☆☆☆ | ☆☆☆☆ | |
| 3.6% | ☆☆☆☆☆ | ☆☆☆☆ | |
| 4.3% | ☆☆☆☆☆ | *☆☆☆ | *FIG. 7 |

[ ☆☆☆☆☆ — Very good
  ☆☆☆ — Good
  ☆☆ — Poor ]

In a liquid crystal display apparatus using the MIM devices, the amount of nitrogen in the thin Ta film contributes to the characteristics of the MIM device, particularly to thermal stability of the nonlinearity thereof. Moreover, as shown in FIG. 47, the amount of nitrogen in the thin Ta film helps to improve the temperature dependence of the contrast. A liquid crystal display apparatus using a thin Ta film formed under the condition that the flow rate ratio of $N_2$ gas is 4.3 vol % (a dash-dot line) has a varied contrast smaller than that of a liquid crystal display device using a Ta film formed under the condition that the flow rate ratio of $N_2$ gas is 2.9 vol % (a broken line). In an MIM device having a Ta thin film doped with nitrogen as a lower electrode, nitrogen contained in the Ta thin film contributes to improvement of the characteristics of the MIM device, especially to the stability of the nonlinearity against temperature changes and thus prevents deterioration by heat. Nitrogen is also effective in improving the characteristics of the liquid crystal display device, especially in alleviating the dependency of the contrast ratio on temperature. However, when the Ta thin film is doped with an excessive amount of nitrogen, the amount of nitrogen contained in the Ta thin film becomes nonuniform and thus decreases the stability of the nonlinearity of the MIM device.

A two-terminal nonlinear device according to the present invention includes a lower electrode of a thin Ta film doped with nitrogen which is formed on a substrate, an anodized oxide film formed by anodizing a surface of the lower electrode, and an upper electrode of a metal thin film which is formed on the anodized oxide film, wherein the thin Ta film includes a structure in which first portions and second portions are alternately deposited, the first portions containing a different amount of nitrogen from that contained in the second portions.

In one embodiment of the invention, the first portions and the second portions are alternately deposited in a thickness direction of the thin Ta film.

In another embodiment of the invention, the ratio of a peak value of a profile of the intensity of $^{14}N^+$ emission with regard to the intensity of $^{181}Ta^+$ emission in the first portions to that in the second portions is substantially in the range of 1:1.54 to 1:1.71.

In still another embodiment of the invention, the ratio of intensity of X-ray diffraction of (110) to the intensity of X-ray diffraction of (002) of the thin Ta film is substantially 1:0.248.

In still another embodiment, the thin Ta film is formed by a reactive sputtering using two or more pieces of Ta target with a purity of 99.99% in a mixed gas of argon gas and nitrogen gas; the ratio of a flow rate of the nitrogen gas to a flow rate of the mixed gas is substantially 3% to 7%; and the two or more pieces of Ta target are aligned in series in a direction where the substrate is conveyed.

In still another embodiment, a specific resistance of the thin Ta film is substantially in a range of 90 µΩcm to 165 µΩcm.

In still another embodiment, the specific resistance of the thin Ta film is substantially in a range of 105 µΩcm to 150 µΩcm.

In still another embodiment, the thin Ta film is formed by sputtering using two or more pieces of sintered TaN target in a mixed gas of argon gas and nitrogen gas; the ratio of a flow rate of the nitrogen gas to a flow rate of the mixed gas is substantially 4% or less; and the two or more pieces of sintered TaN target are aligned in series in a direction where the substrate is conveyed.

In still another embodiment of the invention, each of the two or more pieces of sintered TaN target contains nitrogen in amount of 5 mol % or less.

In still another embodiment of the invention, the thin Ta film is formed with a sputtering power of 4 W/cm² for a unit area of the sintered TaN target.

In still another embodiment of the invention, a specific resistance of the thin Ta film is substantially in a range of 80 µΩcm to 165 µΩcm.

In still another embodiment of the invention, the specific resistance of the thin Ta film is substantially in a range of 95 µΩcm to 150 µΩcm.

A two-terminal nonlinear device according to the present invention includes a lower electrode of a thin Ta film doped with nitrogen which is formed on a substrate, an anodized oxide film formed by anodizing a surface of the lower electrode, and an upper electrode of a metal thin film formed on the anodized oxide film, wherein the thin Ta film doped with nitrogen is formed by sputtering using sintered TaN target containing nitrogen in amount of 4 mol % to 7 mol %.

In one embodiment of the invention, the thin Ta film doped with nitrogen is formed by a DC sputtering at a predetermined sputtering power so that a conductivity coefficient 1nA represented by a Poole-Frenkel current flowing between the lower electrode and the upper electrode is substantially in the range of −32 to −28.

In another embodiment of the invention, the thin Ta film doped with nitrogen is formed under the conditions that a sputtering power, a temperature and the time for heating the substrate, a conveyance rate of the substrate, a distance between the substrate and the sintered TaN target, and a sputtering gas pressure are in the range of 2.2 kW to 3.2 kW, 100° C., 180 seconds, 100 mm/min, 77 mm, and 0.40 Pa, respectively.

In still another embodiment of the invention, a specific resistance of the thin Ta film is substantially in the range of 70 µΩcm to 165 µΩcm.

In still another embodiment of the invention, the specific resistance of the thin Ta film is substantially in a range of 85 µΩcm to 150 µΩcm.

A method for fabricating a two-terminal nonlinear device having a lower electrode, an insulator and an upper electrode, according to the present invention, includes the steps of: forming the lower electrode on a substrate, forming an anodized oxide film by anodizing the lower electrode, and forming the upper electrode on the anodized oxide film, the step for forming the lower electrode including the steps of: depositing a thin Ta film doped with nitrogen by a reactive sputtering using two or more pieces of target of Ta in a mixed gas of argon gas and nitrogen gas, while conveying the substrate in a desired direction, the two or more pieces of Ta target being aligned in series in a direction where the substrate is conveyed, and patterning the thin Ta film into a desired shape to form the lower electrode.

In one embodiment of the invention, the target of Ta is pure Ta target with a purity of 99.99% and the ratio of a flow rate of nitrogen gas to a flow rate of the mixed gas is substantially in the range of 3% to 7%.

In another embodiment of the invention, the target of Ta is a sintered TaN target and the ratio of a flow rate of nitrogen gas to a flow rate of the mixed gas is substantially 4% or less In still another embodiment of the invention, the amount of nitrogen contained in the sintered TaN target is 5 mol % or less.

In still another embodiment of the invention, the thin Ta film is deposited at a sputtering power of 4 W/cm² for a unit area of the sintered TaN target.

In still another embodiment of the invention, the thin Ta film is deposited by using an in-line sputtering apparatus.

In still another embodiment of the invention, the thin Ta film is deposited by using a rotary sputtering apparatus.

In still another embodiment of the invention, the step for forming the anodized oxide film is conducted in a solution containing an ammonium group.

A method for fabricating a two-terminal nonlinear device having a lower electrode, an insulator, and an upper electrode, according to the present invention, includes the steps of: forming a lower electrode on a substrate, forming an anodized oxide film by anodizing the lower electrode, and forming the upper electrode on the anodized oxide film, the step for forming the lower electrode including the steps of: depositing a thin Ta film doped with nitrogen on the substrate by sputtering using sintered TaN target containing nitrogen in amount of substantially in the range of 4 mol % to 7 mol %, while conveying the substrate, and patterning the thin Ta film into a desired shape to form the lower electrode.

In one embodiment of the invention, the step for forming the thin Ta film is conducted by a DC sputtering at such a sputtering power that a resistance coefficient 1nA represented by a Poole-Frenkel current flowing between the upper electrode and the lower electrode is substantially in the range of −32 to −28.

In another embodiment of the invention, the step for forming the thin Ta film is conducted under the condition that a sputtering power, a temperature and the time for heating the substrate, a conveyance rate of the substrate, a distance between the substrate and the sintered TaN target, and a sputtering gas pressure are in the range of 2.2 kW to 3.2 kW, 100° C., 180 seconds, 100 mm/min, 77 mm, and 0.40 Pa, respectively.

A liquid crystal display device according to the present invention includes: two plates opposed to each other; a liquid crystal material interposed between the two plates; a plurality of two-terminal nonlinear devices located on one of the two plates, each of the two-terminal nonlinear devices including a lower electrode formed of Ta, an insulator formed by anodic oxidation of a surface of the lower electrode, and an upper electrode formed of a metal thin film located on the insulator; and a plurality of pixel electrodes located in a matrix respectively connected to the plurality of two-terminal linear devices, wherein the deviation of specific resistances of the lower electrode is within ±5%, and the standard deviation thereof is 0.1 at the maximum in each of the two-terminal nonlinear devices.

In one embodiment of the invention, the lower electrode is formed by sputtering using a sintered TaN body including nitrogen in Ta and using an inert gas of a O-group element having an atomic weight is at least equal to the atomic weight of Kr as sputtering gas.

A method for producing a liquid crystal display device having two plates opposed to each other and a liquid crystal material interposed between the two plates, one of the two plates having, on a surface thereof opposed to the other plate, a plurality of pixel electrodes arranged in a matrix and a plurality of two-terminal nonlinear devices respectively connected to the plurality of pixel electrodes, according to the present invention, includes the steps of: forming a Ta thin film used as a lower electrode of each two-terminal nonlinear device on the surface of the one of the plates by depositing Ta by sputtering using a sintered TaN body as a sputtering target and using an inert gas of a O-group element having an atomic weight which is at least equal to the atomic weight of Kr as sputtering gas; forming an insulator on the Ta thin film; and forming a metal thin film used as an upper electrode of the two-terminal nonlinear device on the insulator.

A method for producing a two-terminal nonlinear device including a lower electrode, an insulator and an upper electrode, according to the present invention, includes the steps of: depositing Ta by sputtering using a sintered TaN body as a sputtering target and using an inert gas of a O-group element having an atomic weight which is at least equal to the atomic weight of Kr as sputtering gas to form a Ta thin film used as the lower electrode; performing anodic oxidation of a surface of the Ta thin film to form the insulator; and forming a metal thin film used as the upper electrode on the insulator.

A liquid crystal display device, according to the present invention, including two plates opposed to each other and a liquid crystal material interposed between the two plates, one of the two plates having, on a surface thereof opposed to the other plate, a plurality of pixel electrodes arranged in a matrix and a plurality of two-terminal nonlinear devices respectively connected to the plurality of pixel electrodes, is produced by a method including the steps of: forming a Ta thin film used as a lower electrode of each two-terminal nonlinear device on the surface of the one of the plates by depositing Ta by sputtering using a sintered TaN body as a sputtering target and using an inert gas of a O-group element having an atomic weight which is at least equal to the atomic weight of Kr as sputtering gas; forming an insulator on the Ta thin film; and forming a metal thin film used as an upper electrode of the two-terminal nonlinear device on the insulator.

In still another embodiment of the invention, the sintered TaN body contains nitrogen at a ratio of 3 to 7 mol %, and the sputtering gas has a flow rate of 30 to 300 SCCM.

In another embodiment of the invention, the sintered TaN body is supplied with an input power density of 5.0 to 11.5 W/cm$^2$.

In another embodiment of the invention, the lower electrode is formed as part of consecutive formation of a plurality of lower electrodes using one of an in-line sputtering apparatus and a rotary sputtering apparatus.

In another embodiment of the invention, the sintered TaN body contains nitrogen at a ratio of 4 to 5 mol %, and the sputtering gas has a flow rate of 100 to 200 SCCM.

In another embodiment of the invention, the sintered TaN body is supplied with an input power density of 7.0 to 10.0 W/cm$^2$.

According to the present invention, the lower electrode of the MIM device is formed by sputtering using a sintered TaN body as a sputtering target and using an inert gas of a O-group element having an atomic weight which is equal to or higher than the atomic weight of Kr as sputtering gas. Due to use of the sintered TaN body as the sputtering target, the amount of nitrogen contained in the Ta thin film used as the lower electrode is uniform. The O-group element having an atomic weight which is equal to or higher than that of Kr has ion energy higher than that of Ar. Accordingly, gas of such an element has a high sputtering ratio and thus can be sputtered at a high sputtering rate. Due to such a high sputtering rate, the influence of the conditions of the sputtering apparatus on thin film formation is alleviated. As a result, Ta thin films formed using such gas as the sputtering gas are uniform with very small batch-by-batch deviation. The area-by-area deviation in one Ta thin film is also very small. In this specification, "deviation" means the ratio of the difference of each measured value from the average value, the average value obtained by averaging all values.

The sputtering rate can also be increased by raising the input power density applied to the sputtering target. However, the inventors of the present invention have found that such a rise in the input power density results in a rise in the specific resistance of the Ta thin film. By using sputtering gas of a O-group element having an atomic weight which is equal to or higher than that of Kr, the sputtering rate can be increased without raising the input power density.

When a two-terminal nonlinear device is used as the switching device of a liquid crystal display device, the contrast ratio of the liquid crystal display device can be increased by using a sintered TaN body containing nitrogen at a ratio of 3 to 7 mol % as a sputtering target. By introducing Kr gas at a flow rate of 30 to 300 SCCM for sputtering, the area-by-area deviation of the specific resistances of the Ta thin film in one and the same cell can be reduced to a level lower than that of the Ta thin film on the plate obtained using Ar gas as the sputtering gas. Especially when the flow rate of the sputtering gas is 100 to 200 SCCM, the discharge state in the sputtering apparatus is stable, and the gas flow is not disturbed much. Accordingly, the batch-by-batch and area-by-area deviation of the specific resistances of the Ta thin film is small, realizing stable thin film formation.

By using a sintered TaN body containing nitrogen at a ratio of 4 to 5 mol %, deterioration of the MIM device by heat caused when the liquid crystal display device is turned on and generation of residual images are prevented. By setting the input power density applied to the sputtering target to the range of 5.0 to 11.5 W/cm$^2$, coefficient 1nA expressed by the Poole-Frenkel current is in the range of −35 to −27.5, which provides the MIM device with satisfactory characteristics. By restricting the input power density to the range of 7.0 to 10.0 W/cm$^2$, the characteristics of the MIM device are further improved, and thus the contrast ratio of the liquid crystal display device is raised.

By a method according to the present invention, the Ta thin films are uniform in the specific resistance both batch by batch and area by area even when produced consecutively in an in-line sputtering apparatus or a rotary sputtering apparatus.

Thus, the invention described herein makes possible the advantages of (1) providing two-terminal nonlinear devices of an MIM type having an uniform and thermally stable nonlinearity, (2) providing a liquid crystal display apparatus using the MIM devices as switching elements in which a residual image does not occur on a display, and (3) providing a liquid crystal display device which includes a two-terminal nonlinear device having a Ta thin film with a uniform and stable specific resistance and thus has stability against temperature changes and also prevents generation of residual images on a screen thereof, and a method for producing such a liquid crystal display device.

These and other advantages of the present invention will become apparent to those skilled in the art upon reading and understanding the following detailed description with reference to the accompanying figures.

BRIEF DESCRIPTION OF THE DRAWINGS

FIGS. 25A to 25D show diagrams showing the unevenness in a sheet resistivity of a thin Ta film in each of Example 3 and Comparative Examples 1 to 3.

DESCRIPTION OF THE PREFERRED EMBODIMENTS

Hereinafter, the present invention will be described by way of examples, with reference to the accompanying drawings.

EXAMPLE 1

Figure 1:
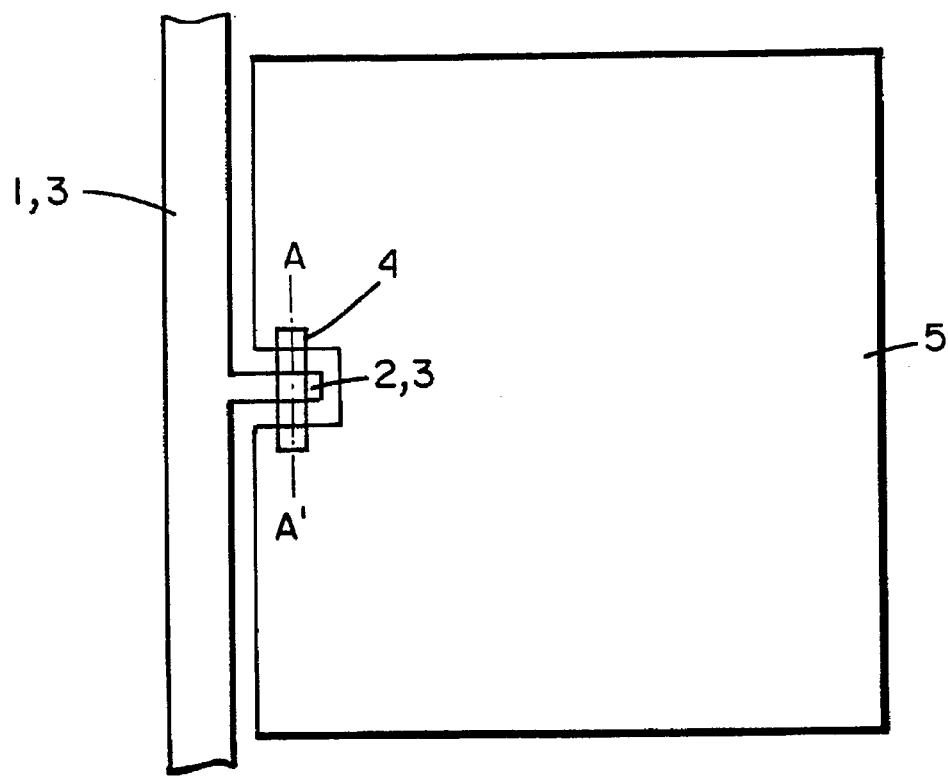
FIG. 1 is a plan view showing an active matrix substrate on which two-terminal nonlinear devices of an MIM type (hereinafter, referred to as "MIM devices") of Example 1 of the present invention are formed as switching elements.
Figure 2:
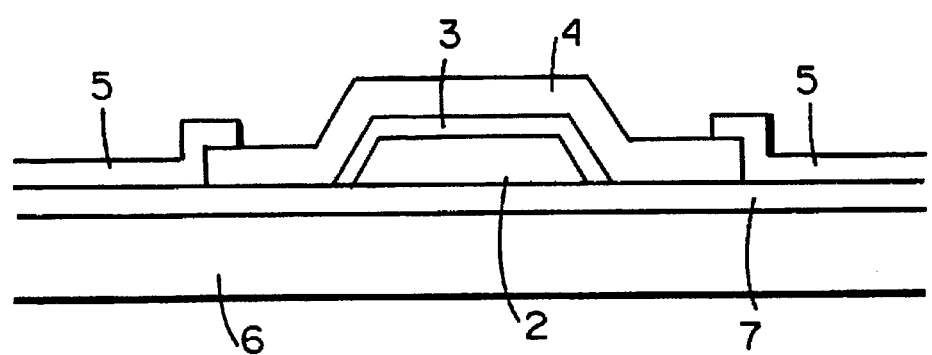
FIG. 2 is a cross-sectional view taken along a line A—A' of FIG. 1.

FIG. 1 shows a plan view of an active matrix substrate on which two-terminal nonlinear devices of an MIM type (hereinafter, referred to as "MIM devices") as a first example of the present invention. FIG. 2 shows a cross-sectional view taken along a line A—A' in FIG. 1. In this example, the MIM devices are used as switching elements of the liquid crystal display apparatus. In addition, FIG. 1 shows the active matrix substrate for 1 pixel.

The structure of the active matrix substrate will be described with reference to FIG. 2. The active matrix substrate comprises a substrate 6 formed of glass or the like. A base coating insulator 7 is provided on the glass substrate 6 and a plurality of signal lines 1 (as shown in FIG. 1) formed of a thin Ta film are provided thereon in parallel. Further, lower electrodes 2 branched from the signal lines 1 are formed on the base coating insulator 7. Insulators 3 are formed on the signal lines 1 and the lower electrodes 2 by anodizing surfaces of the signal lines 1 and lower electrodes 2. Upper electrodes 4 formed of a Ta, Cr, Ti, Al film or the like are formed on the insulators 3. The MIM device comprises one lower electrode 2, one upper electrode 4 and one insulator 3 sandwiched therebetween. The upper electrode 4 is electrically connected to a corresponding one of the pixel electrodes 5 formed of an ITO transparent conductive film or the like. Further, the thin Ta film used for the signal line 1 and lower electrode 2 has a structure in which portions having a small amount of nitrogen (hereinafter, referred to as "poor portions") and portions having a large amount of nitrogen (hereinafter, referred to as "rich portions") are alternately deposited in the thickness direction of the thin Ta film.

The active matrix substrate shown in FIGS. 1 and 2 is fabricated as follows, under the condition that a liquid crystal cell has a reflective monochrome TN liquid crystal mode having 160×160 dots and 0.25 mm pitch; the width of each signal line 1 is 30 μm; the size of the MIM device is 5 μm×5 μm; and the ratio of the MIM capacity to the liquid crystal capacity is approximately 1:10.

First, the base coating insulator 7 of $Ta_2O_5$ or the like is formed on the glass substrate 6 by sputtering or the like so as to have a thickness of 5000 angstroms. No-alkali glass, borosilicate glass and soda glass may be used for the glass substrate 6. In this example, #7059 Fusion Pilex Glass (manufactured by Corning Japan Co., Ltd.) is used for the glass substrate 6. The base coating insulator 7 can be omitted; however, thin films formed on the base coating insulator 7 can be prevented from being contaminated by the substrate 6, whereby further excellent characteristics of the MIM device can be obtained.

Successively, the thin Ta film is deposited on the glass substrate 6 by a reactive sputtering so as to have a thickness of 3000 angstroms. In the reactive sputtering, three pieces of target of Ta with a purity of 99.99% are aligned in series in the direction where the glass substrate 6 is conveyed. Moreover, argon (Ar) gas and nitrogen ($N_2$) gas are used as the reactive gas. The amount of nitrogen contained in the deposited thin Ta film can be varied depending on the flow rate ratio of $N_2$ gas to $(Ar+N_2)$ gas. In this example, the flow rate ratio of $N_2$ gas to $(Ar+N_2)$ gas is adjusted so that the flow rate ratio is set at 2.2%, 2.9%, 3.6%, 4.1%, 4.3%, 5.7% and 8.3% for sputtering. Further, the thicknesses of the poor and rich portions can be changed by appropriately adjusting intervals between the pieces of Ta target and conditions such as the sputtering power and the conveyance rate of the glass substrate 6. In this example, sputtering is conducted under the conditions that each piece of target has a size of 5 inches×16 inches; each interval between the pieces of target is 10 cm; the sputtering power is 4.5 kW (current: 8.5 A, voltage: 530 V), the conveyance rate of the substrate is 460 mm/min; the temperature is 100° C., and the sputtering rate is 200 nm/min.

Figure 3:
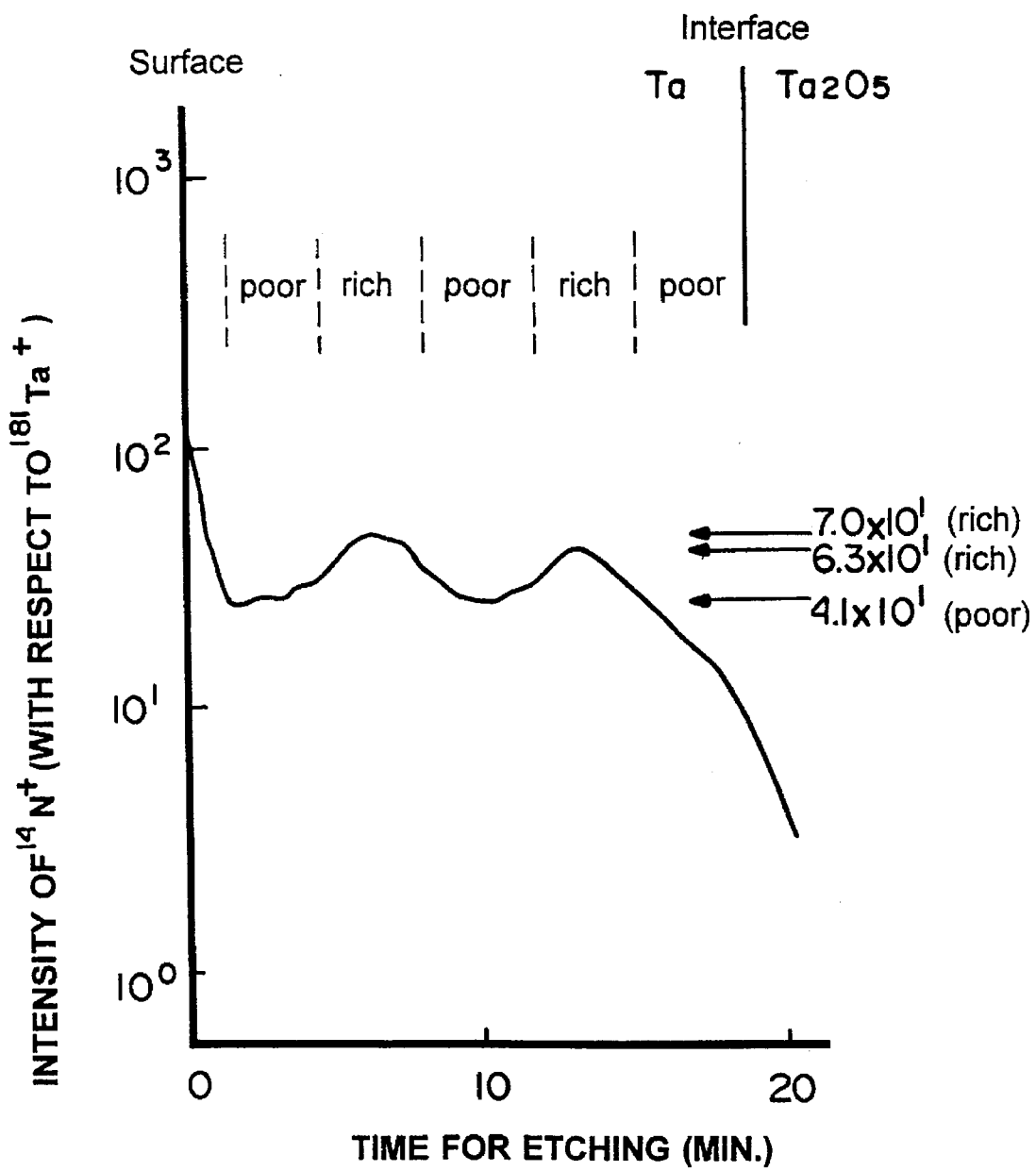
FIG. 3 is a diagram showing a profile of $^{14}N^+$ secondary ion emission from a thin Ta film (flow rate ratio of N$_2$ gas to (Ar+N$_2$) gas: 4.3%) (distribution of nitrogen in the thin Ta film in the thickness direction of the thin Ta film) of Example 1 of the present invention.
Figure 4:
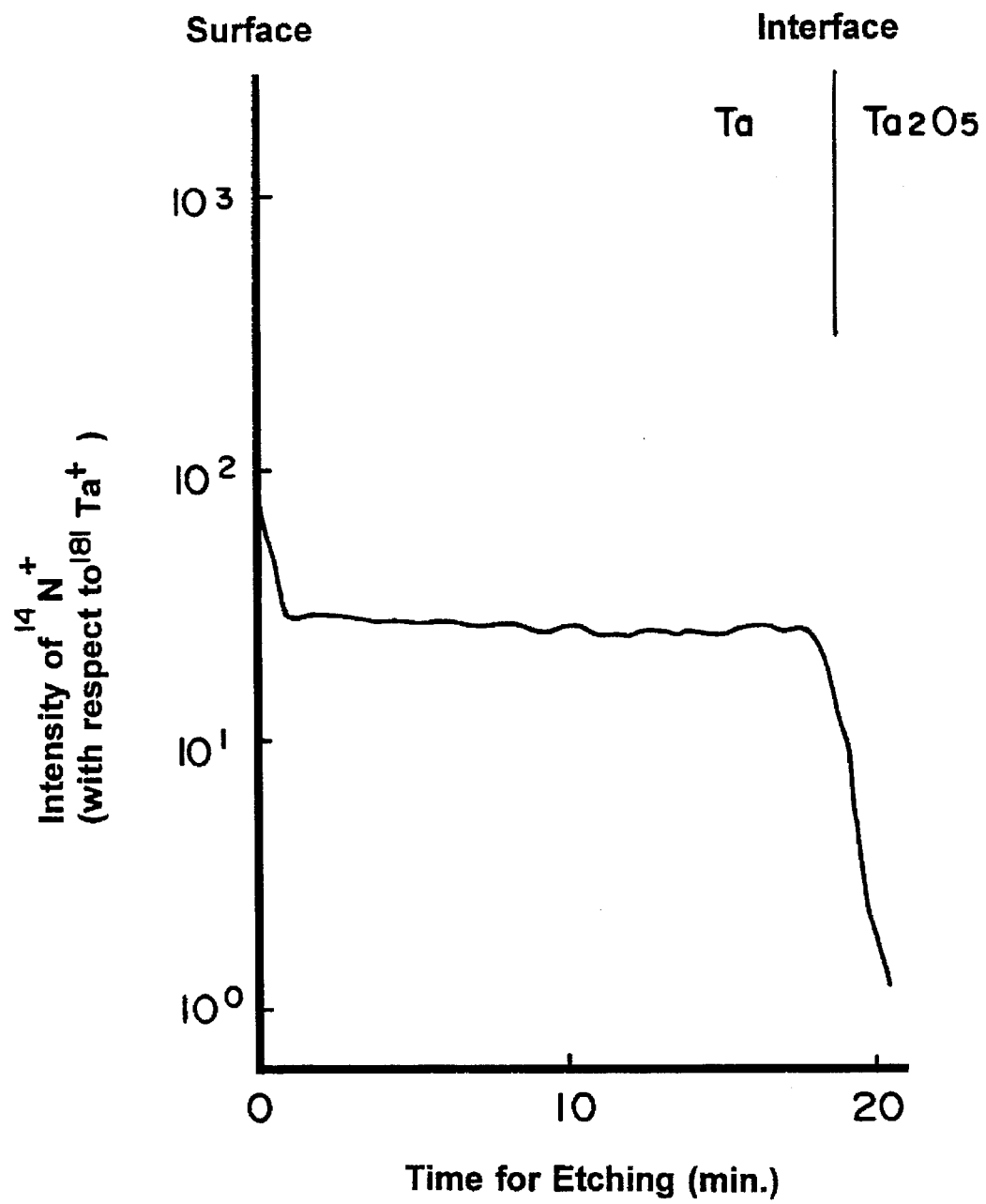
FIG. 4 is a diagram showing a profile of $^{14}N^+$ secondary ion emission from a conventional thin Ta film (flow rate ratio of N$_2$: 5%).

The thin Ta film thus obtained is analyzed by a SIMS (Secondary Ion Mass Spectrometry). FIG. 3 shows a profile of secondary ion emission from the Ta thin film. In this figure, the intensity of $^{14}N^+$ emission with regard to the intensity of $^{181}Ta^+$ emission is plotted. As shown in FIG. 3, the thin Ta film has a structure in which the poor portions and rich portions are alternately deposited in the thickness direction of the thin Ta film, excluding portions in the vicinity of a surface thereof. On the other hand, a thin Ta film uniformly containing nitrogen is obtained by the conventional reactive sputtering using a single piece of Ta target, as shown in FIG. 4.

The thin Ta film thus obtained is patterned into a desired shape by photolithography, thereby forming the signal lines 1 and lower electrodes 2. Then, the exposed portions of the signal lines 1 and lower electrodes 2 excluding terminal portions to be connected to the external driving circuit are anodized in 1 wt % of ammonium tartrate, thereby forming an anodized oxide film 3 (insulator 3). In this example, the anodization is conducted under the conditions that the temperature of an electrolyte, i.e., 1 wt % of ammonium tartrate, a voltage, and a current are approximately 25° C., 27 V and 0.7 mA, respectively, thereby obtaining the anodized oxide film 3 formed of $Ta_2O_5$ with a thickness of 600 angstroms.

After forming the anodized oxide film 3, a metal thin film is deposited over the substrate 6 by sputtering or the like. The deposited metal thin film is patterned into a desired shape by the photolithography, thereby forming the upper electrodes 4. In general, examples of materials for the upper electrode 4 include Ta, Cr, Ti, Al or the like. In this example, a Ti film is deposited so as to have a thickness of 4000 angstroms and patterned to form the upper electrodes 4. Each of the upper electrodes 4 is a rectangular shape having a length of 20 μm and a width of 5 μm.

Further, a transparent conductive film formed of ITO or the like is deposited over the resulting substrate 6 and patterned to form the pixel electrodes 5. In this way, the active matrix substrate is fabricated.

The active matrix substrate and counter substrate are attached to each other, thereby forming a liquid crystal cell. A plurality of strips of the transparent conductive film are formed on the counter substrate so that respective strips cross the signal lines 1 at right angles when the counter substrate is attached to the active matrix substrate. In this example, the strips are formed at 0.25 mm pitch. In this fabrication process of the counter substrate, if a color filter layer is formed on the counter substrate, a liquid crystal display apparatus capable of displaying color can be obtained.

The liquid crystal cell as mentioned above is fabricated as follows:

First, an orientation film is formed on a face of each of the active matrix substrate and the counter substrate at a temperature of approximately 200° C. Then, both of the substrates with the orientation films are rubbed in a prearranged direction in order to obtain liquid crystal molecule alignments.

Next, a sealing agent is coated onto one substrate and a spacer is uniformly dispersed on the other substrate; and the resulting substrates are attached to each other so that faces thereof with wirings face each other. The substrates are arranged so that the liquid crystal molecules will make a 90° twist going from one substrate to the other substrate. In this case, the strips of the transparent conductive film formed on the counter substrate and the signal lines 1 formed on the active matrix substrate should cross each other at right angles. The attached substrates are heated at a temperature of approximately 150° to 200° C. to cure the sealing agent while the substrate are pressed. After that, liquid crystal is injected between the substrates and then the resulting substrates are sealed. In this way, the liquid crystal cell is fabricated.

In addition, a transmitting polarizer having a transmittance of 44.5%, the degree of polarization of 96.5% is provided on a front face of the liquid crystal cell; and a reflective polarizer obtained by forming an Al reflective plate on the same polarizer as that provided on the front face is provided on the back face thereof. In this way, an electro-optic characteristic is added to the liquid crystal cell, thereby completing a liquid crystal display apparatus.

Figure 5:
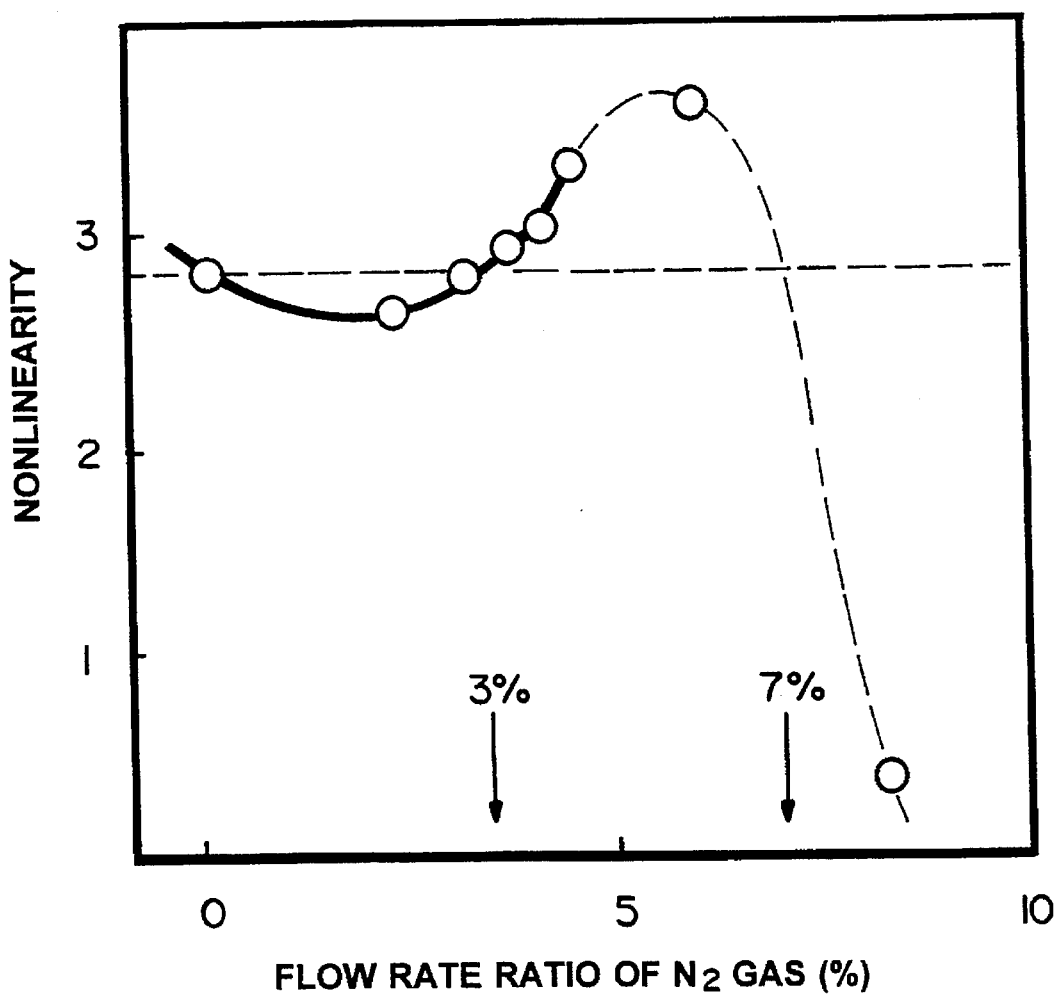
FIG. 5 is a diagram showing the relationship between the nonlinearity of an MIM device of Example 1 of the present invention and the flow rate ratio of N$_2$gas.
Figure 46:
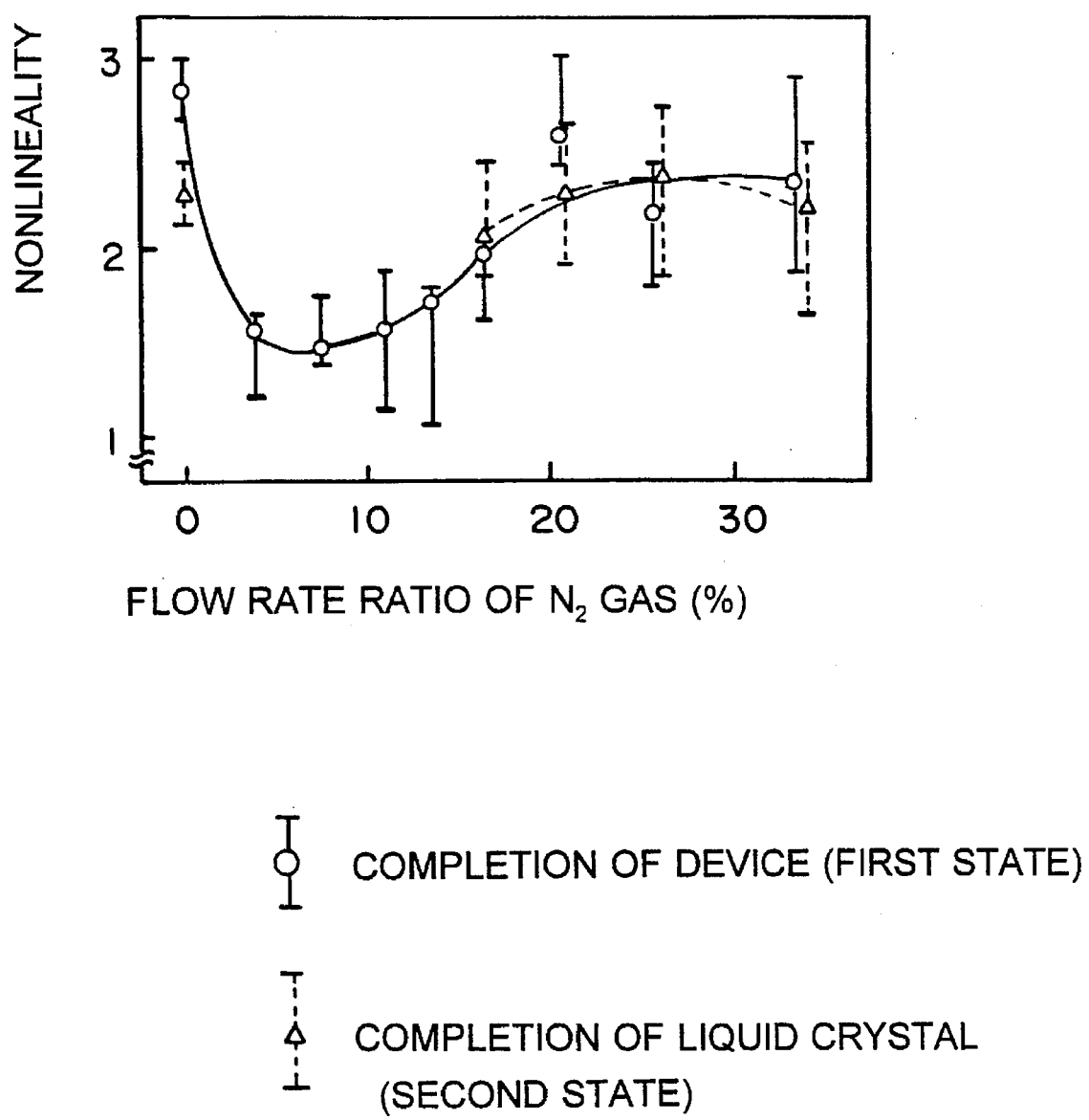
FIG. 46 is a diagram showing a relationship between the nonlinearity of a conventional MIM device and the flow rate ratio of $N_2$ gas to $(Ar+N_2)$ gas, while forming a thin Ta film.
Figure 47:
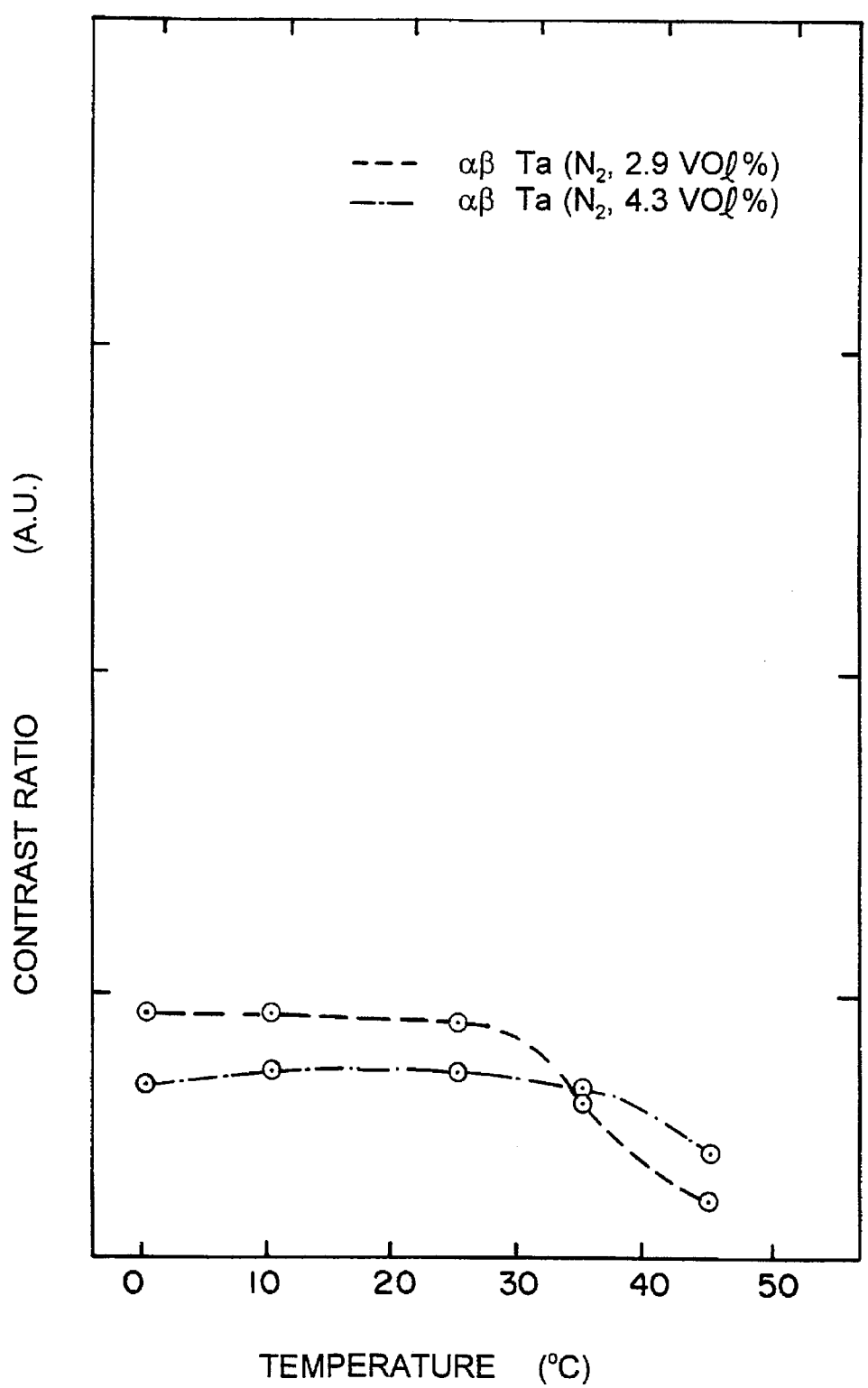
FIG. 47 is a diagram showing the temperature dependence of the contrast ratio of a liquid crystal display apparatus comprising conventional MIM devices.

FIG. 5 and Table 2 show the nonlinearity of the MIM device obtained in the above-mentioned manner. Table 2 also shows, as a Comparative Example, the nonlinearity of the MIM device of a liquid crystal display apparatus obtained by the same manner as in this example except that the lower electrodes formed of a thin Ta film are formed by the conventional reactive sputtering using a single piece of Ta target. The nonlinearity of the MIM device of the Comparative Example is as shown in FIG. 46. In the Comparative Example, sputtering is conducted under the condition that the flow rate ratio of $N_2$ gas to $(Ar+N_2)$ gas is set at 0%, 3.8%, 7.4%, 10.7%, 13.8%, 16.7%, 20.0%, 25.0% and 33.3%. Analyses of the inventors of the present invention show that nitrogen is contained in the thin Ta film with 5% more by amount with respect to the flow rate ratio of $N_2$ gas in the Comparative Example.

TABLE 2

| Flow rate ratio of $N_2$ gas (%) | Nonlinearity | | Sputtering method (Reactive sputtering) |
|---|---|---|---|
| | First state | Second state | |
| Example | | | |
| 2.2 | 2.6 | 2.6 | 3 pieces of |
| 2.9 | 2.8 | 2.8 | target in series |
| 3.6 | 3.0 | 3.0 | |
| 4.1 | 3.3 | 3.2 | |
| 4.3 | 3.3 | 3.3 | |
| 5.7 | 3.6 | 3.4 | |
| Comparative Example | | | |
| 0 | 2.9 | 2.3 | A single |
| 3.8 | 1.6 | — | piece of |
| 7.4 | 1.5 | — | target |

TABLE 2-continued

| Flow rate | Nonlinearity | | Sputtering method |
|---|---|---|---|
| ratio of $N_2$ gas (%) | First state | Second state | (Reactive sputtering) |
| 10.7 | 1.6 | — | |
| 13.8 | 1.8 | — | |
| 16.7 | 1.9 | 2.1 | |
| 20.0 | 2.6 | 2.3 | |
| 25.0 | 2.2 | 2.3 | |
| 33.3 | 2.4 | 2.2 | |

First State: The state after MIM Device is fabricated
Second State: The state when Liquid Crystal Display Apparatus is completed In Table 2, the first state represents a state immediately after the MIM device is fabricated, and the second state represents a state where the liquid crystal display apparatus is completed.

As is understood from FIG. 46 and Table 2, the nonlinearity of the MIM device of the Comparative Example is not satisfactory in the case where the flow rate ratio of $N_2$ gas to (Ar+$N_2$) gas is low (i.e., the amount of nitrogen contained in the thin Ta film is small). In this case, the deterioration of nonlinearity is caused, because a $\beta$ phase structure and an $\alpha$ phase structure are coexistent in the thin Ta film or the $\alpha$ phases monopolize the thin Ta film. In contrast, the nonlinearity of the MIM device is relatively satisfactory in the case of high flow rate ratio of $N_2$ gas. However, the nonlinearity is greatly different in respective MIM devices, and no MIM device having a uniform nonlinearity is obtained. In this case, the deposited film by sputtering becomes a thin TaN film. Further, in the case where the flow rate ratio of $N_2$ gas is 0%, a thin Ta film of a $\beta$ phase structure (hereinafter, referred to as "a $\beta$-Ta") is formed and the nonlinearity of the MIM device fabricated by use of such a thin Ta film is excellent. However, the nonlinearity is greatly deteriorated after the fabrication of the liquid crystal display apparatus through the heat treatment (second state), compared with the nonlinearity when the MIM device is fabricated (first state).

On the other hand, the MIM device of this example has an excellent nonlinearity and thermal stability, as shown in FIG. 5 and Table 2. Further, a uniform nonlinearity is obtained among the MIM devices. In particular, the nonlinearity of the MIM device is as good as or better than that of the MIM device fabricated by using the thin $\beta$-Ta film as the lower electrode, in the case where the thin Ta film is deposited by adjusting the flow rate ratio of $N_2$ gas to (Ar+$N_2$) gas in the range of 3% to 7%. In this case, the nonlinearity does not deteriorate due to the heat treatment, and an excellent nonlinearity is obtained even in the second state. Further, MIM devices having the most excellent nonlinearity and thermal stability are obtained in the case where the flow rate ratio of $N_2$ gas to (Ar+$N_2$) gas is in the range of 4.3% to 5.7%.

Figure 6:
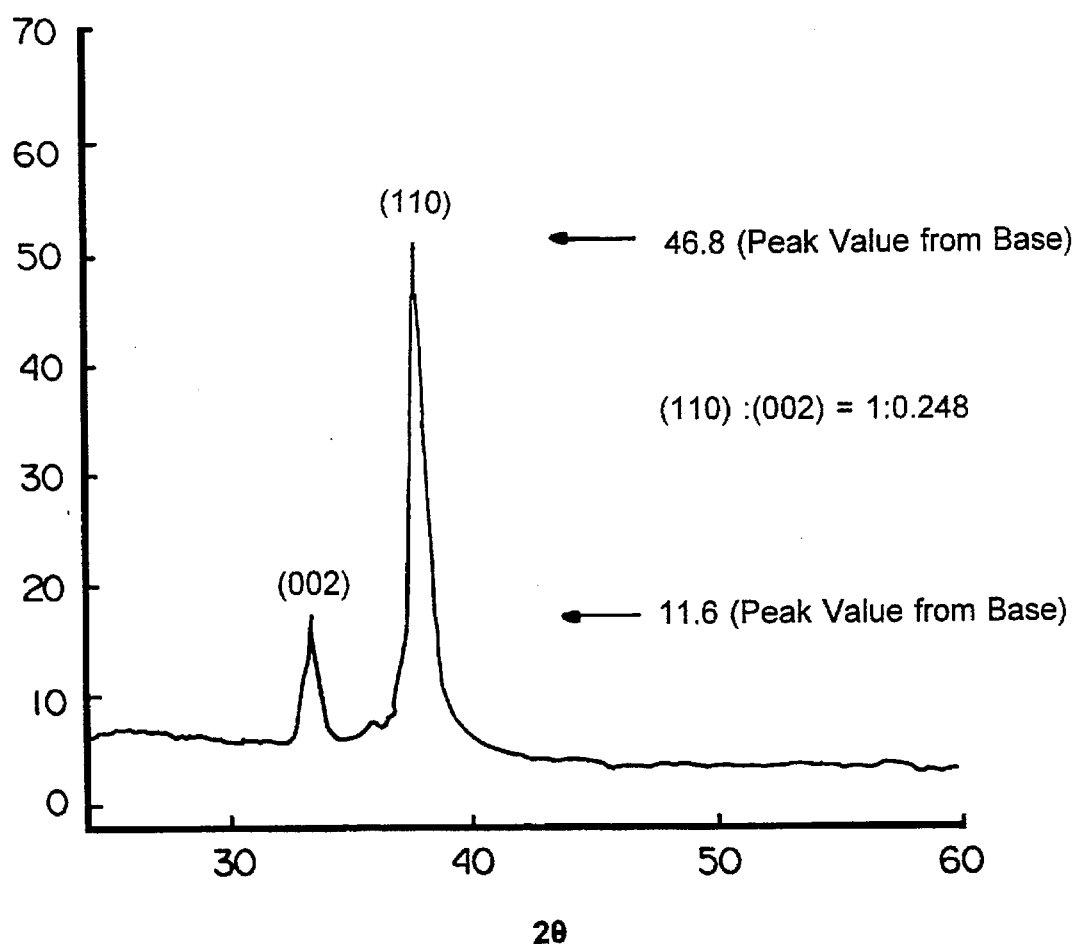
FIG. 6 is a diagram showing a profile of the intensity of X-ray diffraction of a thin Ta film (flow rate ratio of N$_2$ gas: 4.3%) of Example 1 of the present invention.
Figure 7:
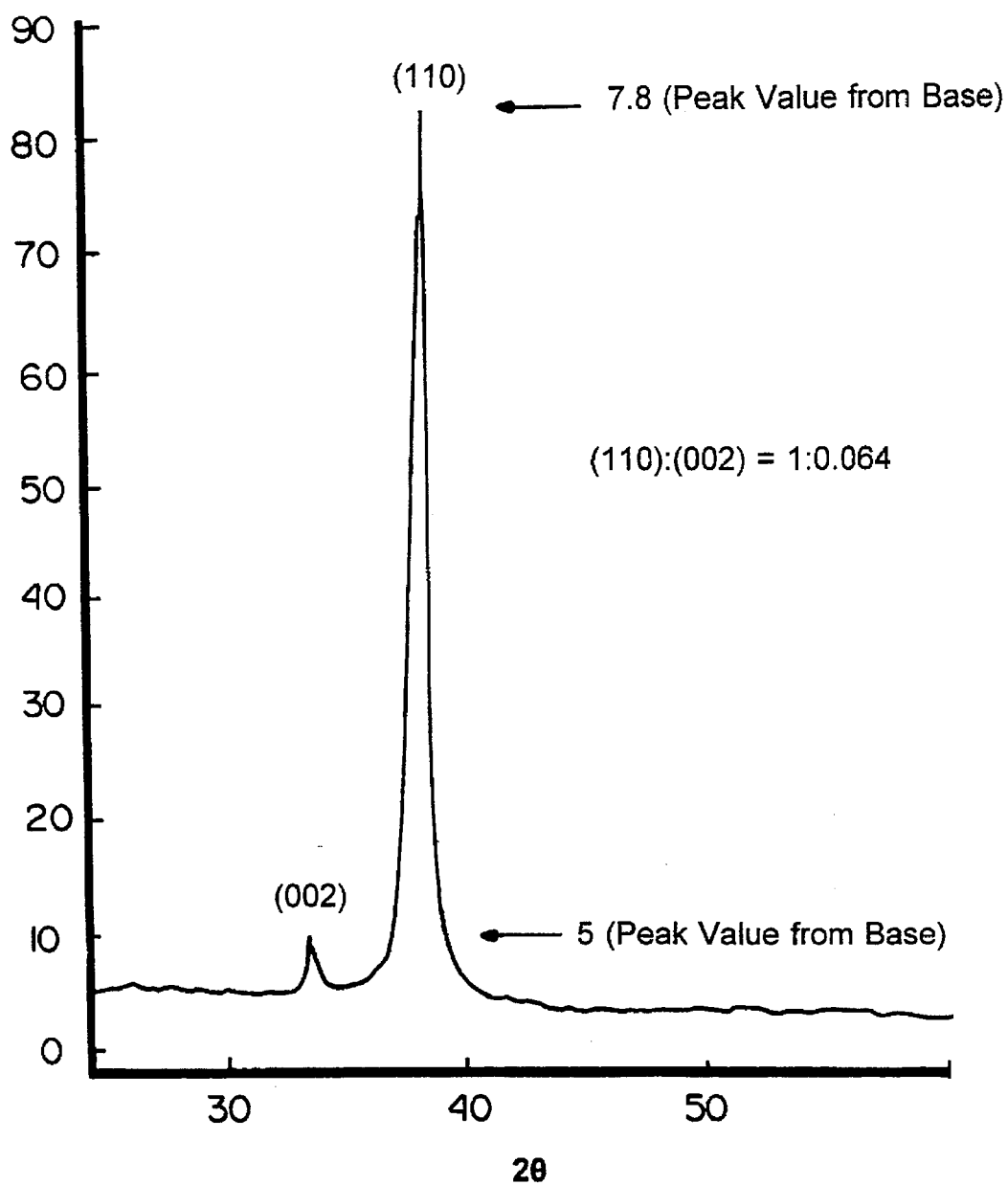
FIG. 7 is a diagram showing a profile of the intensity of X-ray diffraction of a thin Ta film (flow rate ratio of N$_2$ gas: 8.3%) of Example 1 of the present invention.

FIGS. 6 and 7 show the results of the X-ray investigation of the thin Ta films which are obtained under the conditions that the flow ratio of $N_2$ gas to (Ar+$N_2$) gas is 4.3% and 8.3%, respectively. In these figures, the peak (110) of the profile represents a Ta structure of $\alpha$ phase (hereinafter, referred to as "an $\alpha$-Ta"), and the peak of (002) of the profile represents the $\beta$-Ta. As shown in FIG. 6, the ratio of the X-ray intensity of (110) to the X-ray intensity of (002) is 1:0.248, in the case where the flow rate ratio of $N_2$ gas is 4.3%. Further, as shown in FIG. 7, the ratio of the X-ray intensity of (110) to the X-ray intensity of (002) is 1:0.064 in the case where the flow rate ratio of $N_2$ gas is 8.3%.

As shown in the result of the investigation by SIMS in FIG. 3, the ratio of the peak intensity of the $^{14}N^+$ emitted from the poor portion to that of the rich portion is in the range of 1:1.54 to 1:1.71, in the case where the thin Ta film is deposited under the condition that the flow rate ratio of $N_2$ gas to (Ar+$N_2$) gas is 4.3%.

Figure 8:
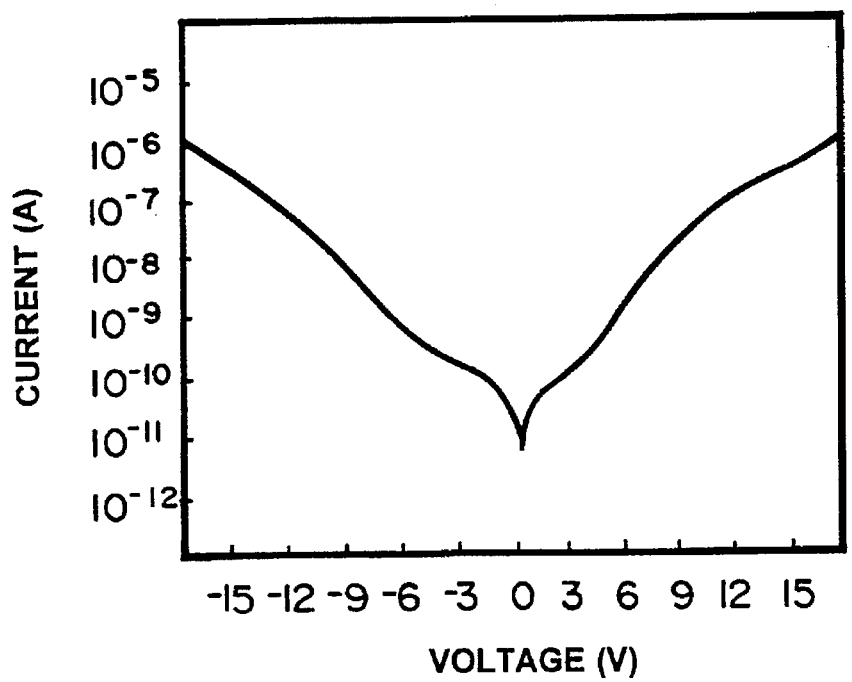
FIG. 8 is a diagram showing a current-voltage characteristic of an MIM device (flow rate ratio of N$_2$ gas to (Ar+N$_2$) gas: 4.3%) of Example 1 of the present invention.

FIG. 8 shows a voltage-current characteristic of the MIM device of this example. As is understood from FIG. 8, the symmetry of current curves of a negative applied voltage and a positive applied voltage can also be obtained in the MIM device of this example.

Figure 9:
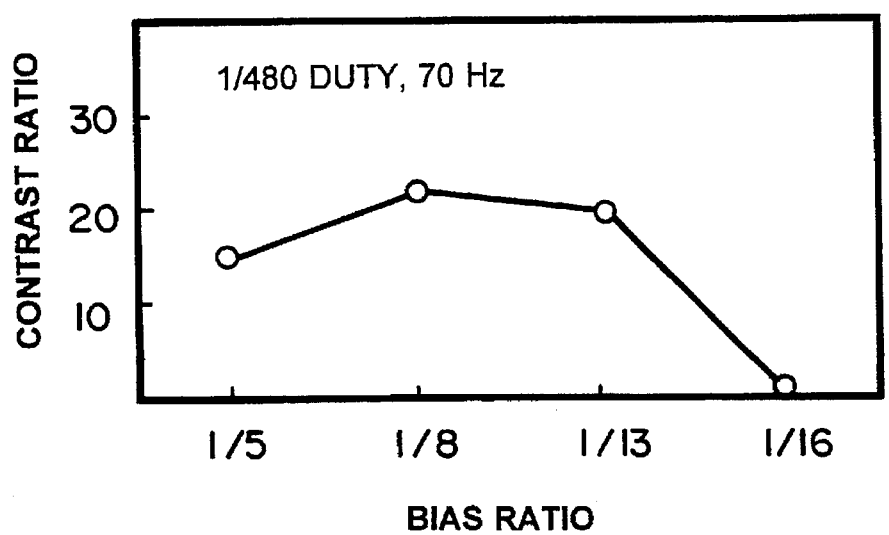
FIG. 9 is a diagram showing an electroptic characteristic (1/480 Duty, 70 Hz) of a liquid crystal display apparatus using an MIM device (flow rate ratio of N$_2$ gas to (Ar+N$_2$) gas: 4.3%) of Example 1 of the present invention.

FIG. 9 shows an electro-optic characteristic (the contrast ratio dependence of the bias ratio) in the liquid crystal display apparatus using the MIM devices as switching elements. As is understood from FIG. 9, the liquid crystal display apparatus has the contrast ratio of 20 in the case of the bias ratio of 1/8 and 1/13. Further, the liquid crystal display apparatus has excellent characteristics such as the response rate ($=\tau r+\tau d$) of 70 msec and the viewing angle of 40° in the up-and-down direction and of 100° or more in the right-and-left direction (Co$\geq$2). Moreover, an excellent display can be obtained in the case of displaying a binary image, since a residual image does not occur, as this is the greatest problem in a liquid crystal display apparatus using two-terminal nonlinear devices as switching devices. This is because the above-mentioned nonlinearity of the voltage-current characteristic is excellent.

In this example, sputtering is conducted in an atmosphere of (Ar+$N_2$) gas using three pieces of Ta target, so that the deposited thin Ta film has a structure in which the poor portions and rich portions are alternately deposited in the thickness direction of the thin Ta film; however, another method can be used to obtain the thin Ta film having such a structure. For example, several pieces of sintered TaN target containing a small amount of nitrogen and sintered TaN target containing a large amount of nitrogen are alternately arranged in series and then sputtered, whereby a thin Ta film having the same alternate structure as that of this example can be obtained.

As mentioned above, since the lower electrode of the two-terminal nonlinear device has the structure in which the poor portions (containing a small amount of nitrogen) and the rich portions (containing a large amount of nitrogen) are alternately deposited, the two-terminal nonlinear device of this example has an initial nonlinearity as good as or better than that of the two-terminal nonlinear device using a thin $\beta$-Ta film as the lower electrode, and an excellent thermal stability close to that of the two-terminal nonlinear device using the TaN film. Further, the nonlinearity is uniform among the two-terminal nonlinear devices. Moreover, the two-terminal nonlinear device of this example is excellent in the current-voltage characteristic. Accordingly, when the two-terminal nonlinear devices are used as switching elements in a liquid crystal display apparatus, an occurrence of the residual image is greatly reduced, thereby obtaining a display with high contrast and high quality.

EXAMPLE 2

A second example of the present invention will be described.

In this example, a thin Ta film is deposited by sputtering using sintered TaN target, different from a reactive sputtering in an atmosphere of (Ar+$N_2$) gas using three pieces of pure Ta target as in Example 1.

Figure 10:
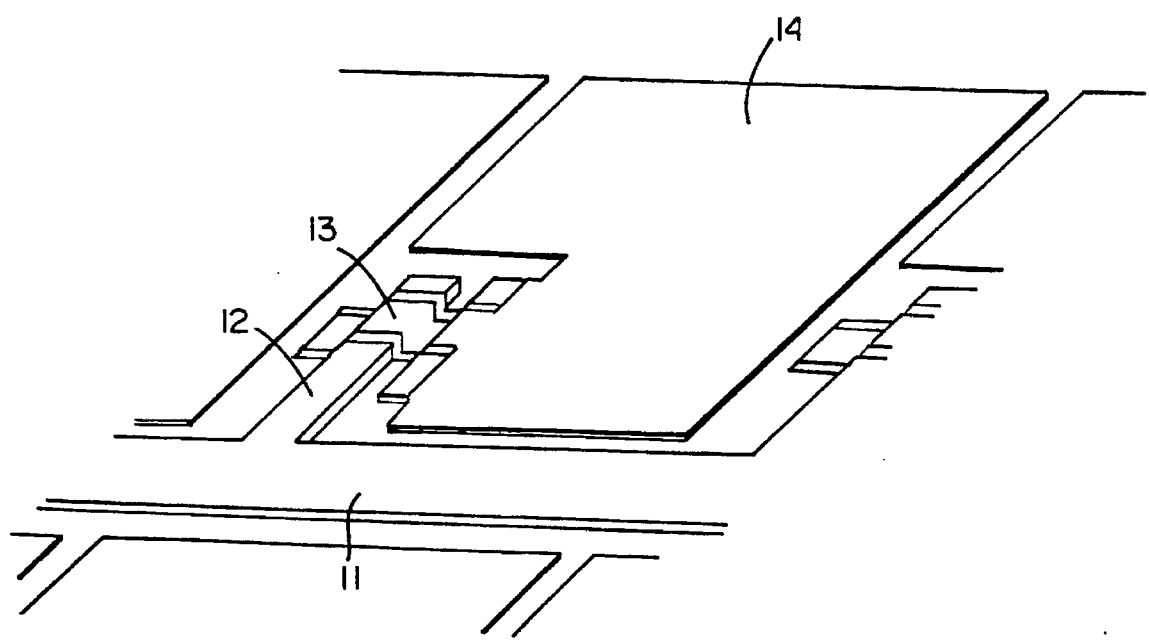
FIG. 10 is a perspective view of an active matrix substrate on which two-terminal nonlinear devices of Example 2 of the present invention.
Figure 11:
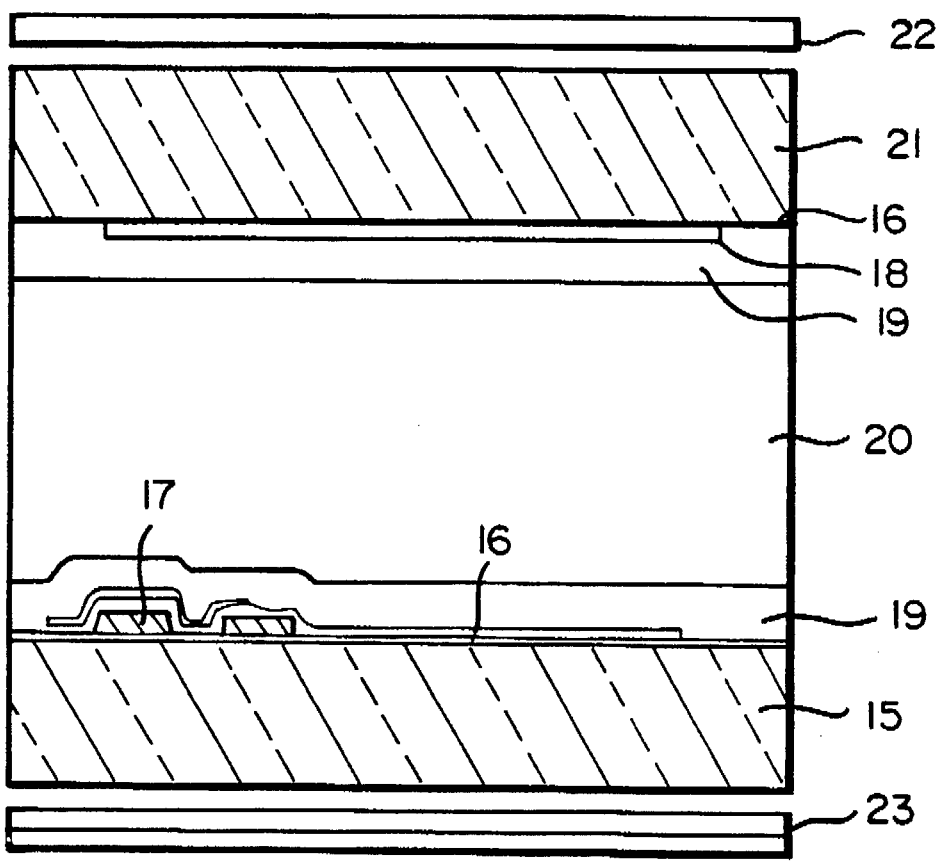
FIG. 11 is a cross-sectional view of a liquid crystal display apparatus comprising an active matrix substrate of FIG. 10.

FIG. 10 shows a perspective view of an active matrix substrate bearing two-terminal nonlinear devices of an MIM type (hereinafter, referred to as "an MIM device"), in the case where the MIM devices are used as switching devices of a liquid crystal display apparatus. FIG. 11 shows a cross-sectional view of the liquid crystal display apparatus comprising the active matrix substrate of FIG. 10.

The structure of the active matrix substrate will be described with reference to FIGS. 10 and 11. The active matrix substrate comprises a substrate 15 formed glass or the like. A base coating insulator 16 is formed on the glass substrate 15 and a plurality of signal lines 11 formed of Ta are provided thereon in parallel. Further, lower electrodes 12 branched from the signal lines 11 are formed on the base coating insulator 16. On the signal lines 11 and the lower electrodes 12, insulators are formed. The insulators are obtained by anodizing the exposed portions of the signal lines 11 and the lower electrodes 12. Upper electrodes 13 of Ta, Cr, Ti, Al, or the like are formed on the insulators. The MIM device comprises one lower electrode 12, one upper electrode 13, and one insulator sandwiched therebetween. The upper electrode 13 is electrically connected to the corresponding one of the pixel electrodes 14 formed of an ITO transparent conductive film or the like.

The active matrix substrate shown in FIG. 10 is fabricated under the conditions that a liquid crystal cell has a reflective monochrome TN liquid crystal mode having 640×480 dots and 0.3 mm pitch; the width of each signal line 11 is 40 μm; the size of the MIM device is 6 μm×5 μm; and the ratio of the MIM capacity to the liquid crystal capacity is approximately 1:10.

First, the base coating insulator 16 formed of $Ta_2O_5$ or the like is deposited on the glass substrate 15 by sputtering or the like so as to have a thickness of 5000 angstroms. Examples of materials for the glass substrate 15 include no-alkali glass, borosilicate glass and soda-lime glass. In this example, #7059 Fusion Pilex Glass (manufactured by Corning Japan Co., Ltd.) is used for the glass substrate 15. The base coating insulator 16 can be omitted. However, thin films formed on the base coating insulator 16 can be prevented from being contaminated by the glass substrate 15, thereby obtaining further excellent device characteristics.

Successively, the thin Ta film is deposited on the glass substrate 15 so as to have a thickness of 3000 angstroms by DC (Direct Current) sputtering. In this example, sintered TaN containing 5 mol % of nitrogen is used as a target. Further, the DC sputtering is conducted in an atmosphere of argon (Ar) gas under the condition that the gas pressure is $4\times10^{-1}$ Pa; the DC power is 2.6 kW; the temperature and the time for heating the substrate are 100° C. and 180 seconds, respectively; the conveyance rate of the substrate is 100 mm/min; and the interval between the substrate and the target is 77 mm.

The thin Ta film thus obtained is patterned into a desired shape by photolithography, thereby forming the signal line 11 and lower electrode 12. Then, surfaces of the signal line 11 and lower electrode 12 excluding terminal portions to be connected to the external driving circuit are anodized in 1 wt % of ammonium tartrate as an electrolyte, thereby forming the anodized oxide film. In this example, the anodization is conducted under the conditions that the temperature of the electrolyte is approximately 25° C.; the voltage is approximately 27 V; and the current is 0.7 mA, thereby obtaining the anodized oxide film of $Ta_2O_5$ having a thickness of 600 angstroms.

After the anodization, a metal thin film is deposited over the glass substrate 15 by sputtering or the like. The resulting substrate 15 is patterned into a desired shape by the photolithography, thereby forming the upper electrode 13. In this way, the MIM device is fabricated. In general, examples of materials for the upper electrode 13 include Ta, Cr, Ti, Al and the like. In this example, the Ti film is deposited so as to have a thickness of 4000 angstroms and patterned to form the upper electrodes 13. Each upper electrode 13 has a rectangular shape having a length of 20 μm and a width of 6 μm.

Further, a transparent conductive film of ITO or the like is formed over the resulting substrate 15 and patterned by a well-known method to form the pixel electrodes 14. In this way, the active matrix substrate is fabricated.

The active matrix substrate and a counter substrate are attached to each other, thereby constituting a liquid crystal cell. A plurality of strips of a transparent conductive film are formed on the counter substrate 21 so that respective strips cross the single lines 11 on the active matrix substrate 15 at right angles. The strips work as counter electrodes 18. In this example, the strips of the transparent conductive film having a thickness of 1000 angstroms are formed at 0.3 mm pitch. In this fabrication of the counter electrode, if a color filter layer is formed on the counter substrate, a liquid crystal display apparatus capable of displaying color can be obtained.

The liquid crystal cell including the counter substrate and the counter substrate is fabricated as follows:

First, an orientation film 19 is formed on a surface of each of the active matrix substrate and the counter substrate at a temperature of approximately 200° C. Then, both of the orientation films 19 are rubbed in a prearranged direction. In this example, the orientation treatment is conducted under the condition that the twist angle of liquid crystal molecules is 90°.

Then, a thermosetting sealing agent is coated onto one substrate and a spacer is uniformly dispersed on the other substrate; and the resulting substrates are attached to each other so that faces thereof bearing the wiring face each other. The active matrix substrate and the counter substrate are arranged so that the rubbing directions of the orientation films 19 are 90° relative to each other and the liquid crystal molecules will make a 90° twist going from one substrate to the other substrate. In this case, the wirings on the active matrix substrate and the counter electrodes 18 on the counter substrate should cross each other. The attached substrates are heated at a temperature of approximately 150° C. to 200° C. to cure the sealing agent while the substrates are pressed. After that, liquid crystal is injected between the substrates and then the resulting substrates are sealed. In this way, the liquid crystal cell is fabricated.

In addition, a transmitting polarizer 22 having a transmittance of 44.5%, the degree of polarization of 96.5% is provided on the front face of the liquid crystal cell; and a reflective polarizer 23 obtained by forming an Al reflective plate on the same polarized as the polarizer 22 is provided on the back face thereof. In this way, an electro-optic characteristic is added to the liquid crystal cell, thereby completing a liquid crystal display apparatus.

Figure 12:
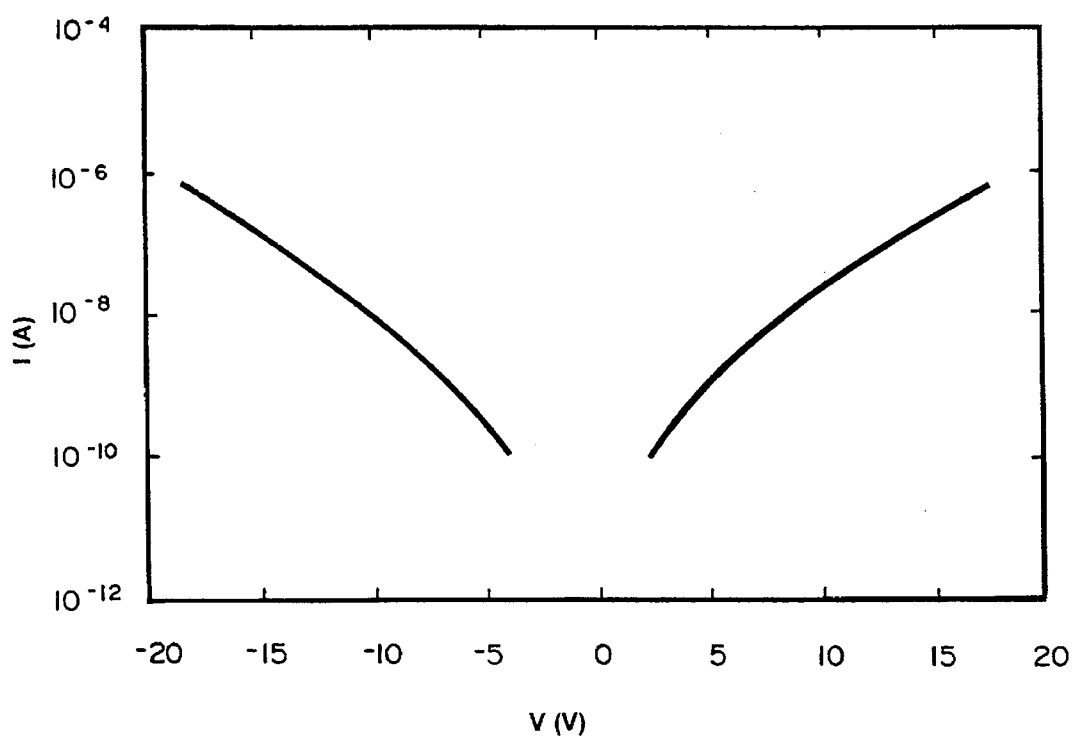
FIG. 12 is a diagram showing a current-voltage characteristic of an MIM device of Example 2 of the present invention.
Figure 13:
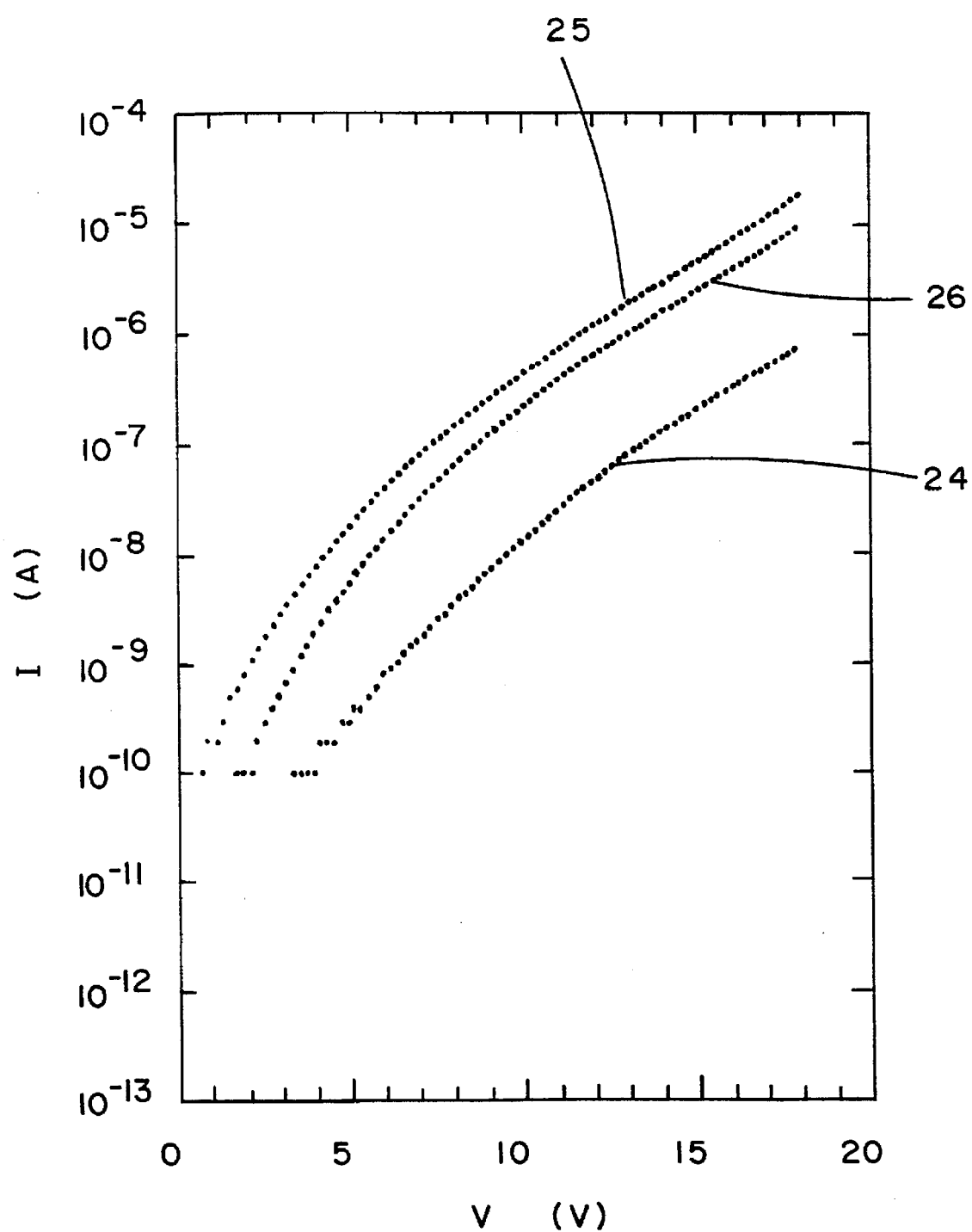
FIG. 13 is a diagram showing a current-voltage characteristic of an MIM device of Example 2 of the present invention and an MIM device of Comparative Example.

FIG. 12 shows a current-voltage characteristic of the MIM device of this example. In FIG. 12, a positive voltage is obtained in the case where a current flows from the lower electrode 12 to the upper electrode 13. Further, FIG. 13 shows the current-voltage characteristic as a curve 24. FIG. 13 also shows, as Comparative Examples 1 and 2, two types of current-voltage characteristics of the MIM device obtained in the same way as in this example except that a thin Ta film is deposited by a reactive sputtering in an atmosphere of (Ar+N₂) gas. The flow rate ratio of N₂ gas to (Ar+N₂) gas is set at 2.9 vol % and 4.3 vol %, respectively in Comparative Examples 1 and 2. The current-voltage characteristics of Comparative Examples 1 and 2 are respectively represented as curves 25 and 26 in FIG. 13.

A current flowing in the insulator sandwiching between the lower electrode and the upper electrode, or a current flowing through interfaces between the electrodes and the insulator in the MIM device, will now be described. The current is represented by a Poole-Frenkel current shown as the following formula (1):

$$\ln(I/V) = \ln A + B\sqrt{V} \tag{1}$$

wherein, I and V represent a current and a voltage, respectively; coefficients A and B represent the conductivity and the nonlinearity of the MIM device. In this case, as A is increased, the resistance of the MIM device is reduced; and as B is increased, the ratio of ON voltage to OFF voltage ($V_{ON}/V_{OFF}$) in the vicinity of the threshold voltage is increased, making it possible to obtain a liquid crystal display apparatus with high contrast.

Figure 14:
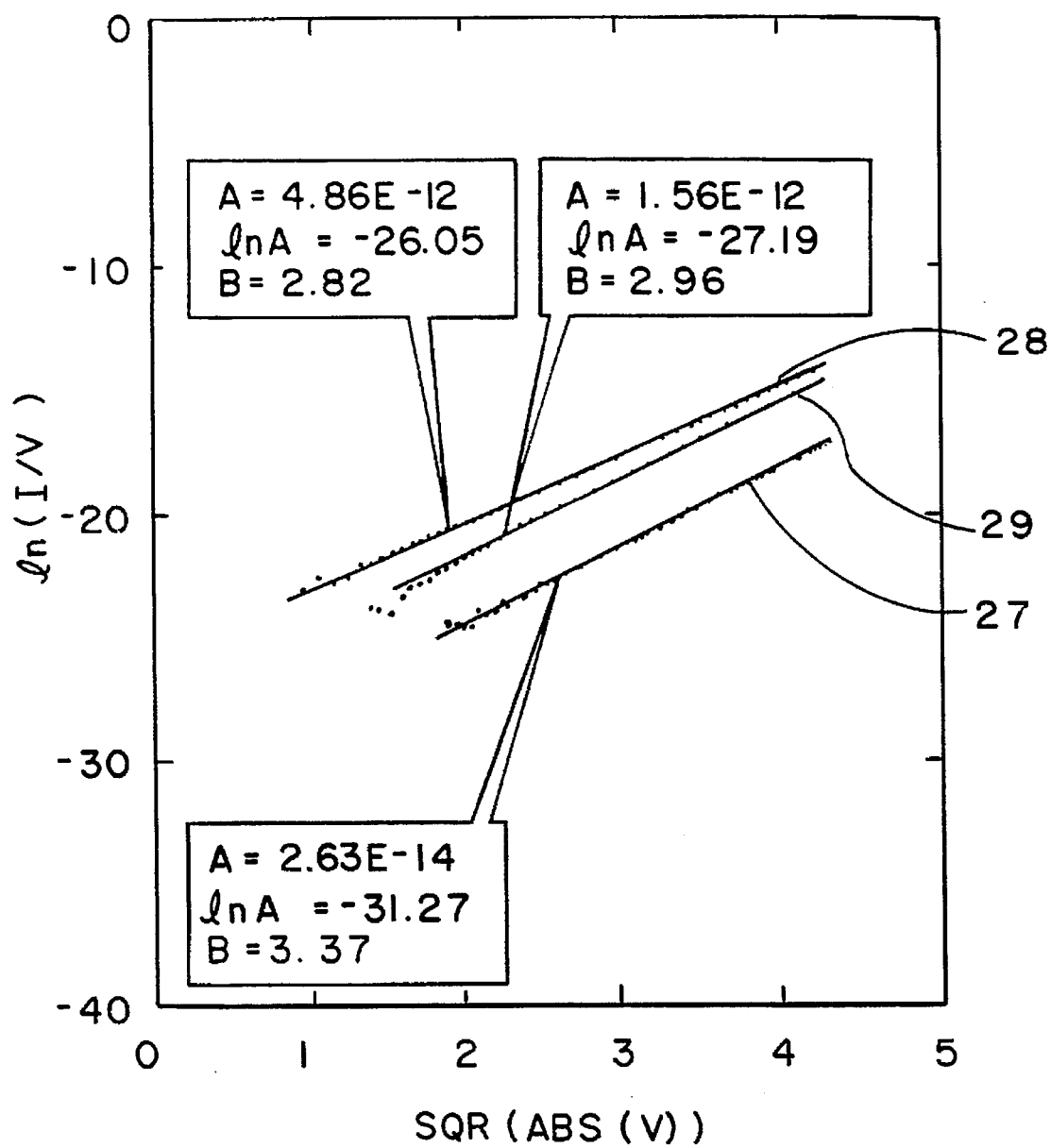
FIG. 14 shows a Poole-Frenkel plot of each of an MIM device of Example 2 and an MIM device of Comparative Example.

FIG. 14 shows a Poole-Frenkel Plot of the MIM device, regarding the curves 24, 25 and 26. Lines 27, 28 and 29 are the Poole-Frenkel Plots of the MIM device of this example (curve 24), Comparative Example 1 (curve 25), and Comparative Example 2 (curve 26), respectively. A Y intercept represents the conductivity of the MIM device (lnA) and a gradient of the line represents the nonlinearity of the MIM device. FIG. 14 also shows values of the coefficients A and B of the MIM device of this example and Comparative Examples 1 and 2.

As is understood from FIG. 14, the MIM device of this example using a thin Ta film deposited by sputtering using sintered TaN as a target has a smaller coefficient A and larger coefficient B, compared with the MIM devices of Comparative Examples 1 and 2 using a thin Ta film deposited by reactive sputtering in an atmosphere of (Ar+N₂) gas. That is to say, the MIM device of this example has a small conductivity and therefore a larger resistance, leading to a smaller leak current. Moreover, an excellent nonlinearity can be obtained.

Further, in this example, since the thin Ta film is deposited by DC sputtering using sintered TaN as a target, nitrogen is doped into the thin Ta film. As a result, the deterioration in characteristics of the MIM device caused by the heat treatment during the fabrication of the liquid crystal cell can be prevented.

Figure 15:
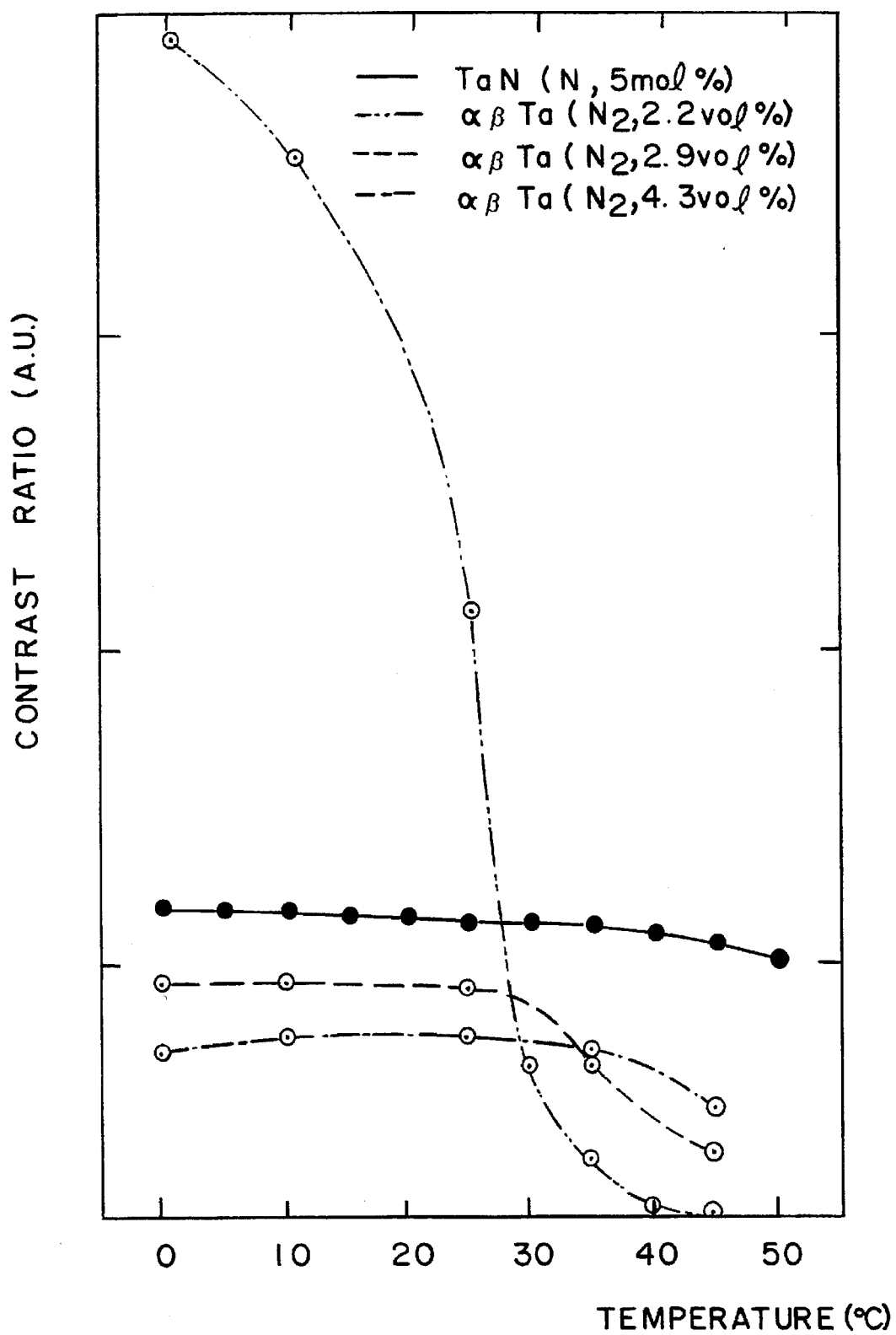
FIG. 15 is a diagram showing the temperature dependence of the contrast ratio of a liquid crystal display apparatus comprising MIM devices of Example 2 and a liquid crystal display apparatus comprising MIM devices of Comparative Example.

FIG. 15 shows an electro-optic characteristic (temperature dependence of the contrast ratio) of a liquid crystal display apparatus having the MIM devices of this example, together with those of liquid crystal display apparatuses of Comparative Examples 1, 2 and 3. In Comparative Examples 1, 2 and 3, respective thin Ta films deposited by the reactive sputtering in an atmosphere of (Ar+N₂) gas are used as lower electrodes, the flow rate ratio of N₂ gas to (Ar+N₂) gas being 2.9 vol %, 4.3 vol % and 2.2 vol %, respectively. (Here, a broken-line, a dash-dot line, and a two-dot dash line represent the contrast ratios of Comparative Examples 1, 2 and 3, respectively.)

As is understood from FIG. 15, in Comparative Examples 1, 2 and 3, the contrast ratio is decreased when the temperature exceeds room temperature. That is to say, the liquid crystal display apparatus using the MIM device of this example has a stable display characteristic against temperature changes.

However, when the flow rate ratio of N₂ gas to (Ar+N₂) gas is as large as 6 vol % in Comparative Examples 1, 2 and 3, the nonlinearity of the MIM device can be excellent. Moreover, even at a high temperature, the contrast ratio is not reduced due to the deterioration of the nonlinearity of the MIM device. However, as the flow rate ratio of N₂ gas is increased, the amount of nitrogen taken into the Ta film is not uniform, leading to a great different in the nonlinearity of the MIM devices. As a result, a uniform display cannot be obtained.

In this example, sintered TaN containing 5 mol % of nitrogen is used as a target; however, the amount of nitrogen is not limited thereto. Any sintered TaN can be used as a target for forming the thin Ta film, as long as sintered TaN can contain the amount of nitrogen needed to obtain the nonlinearity as good as or better than that of the MIM device using the β-Ta film doped with no nitrogen.

Figure 16:
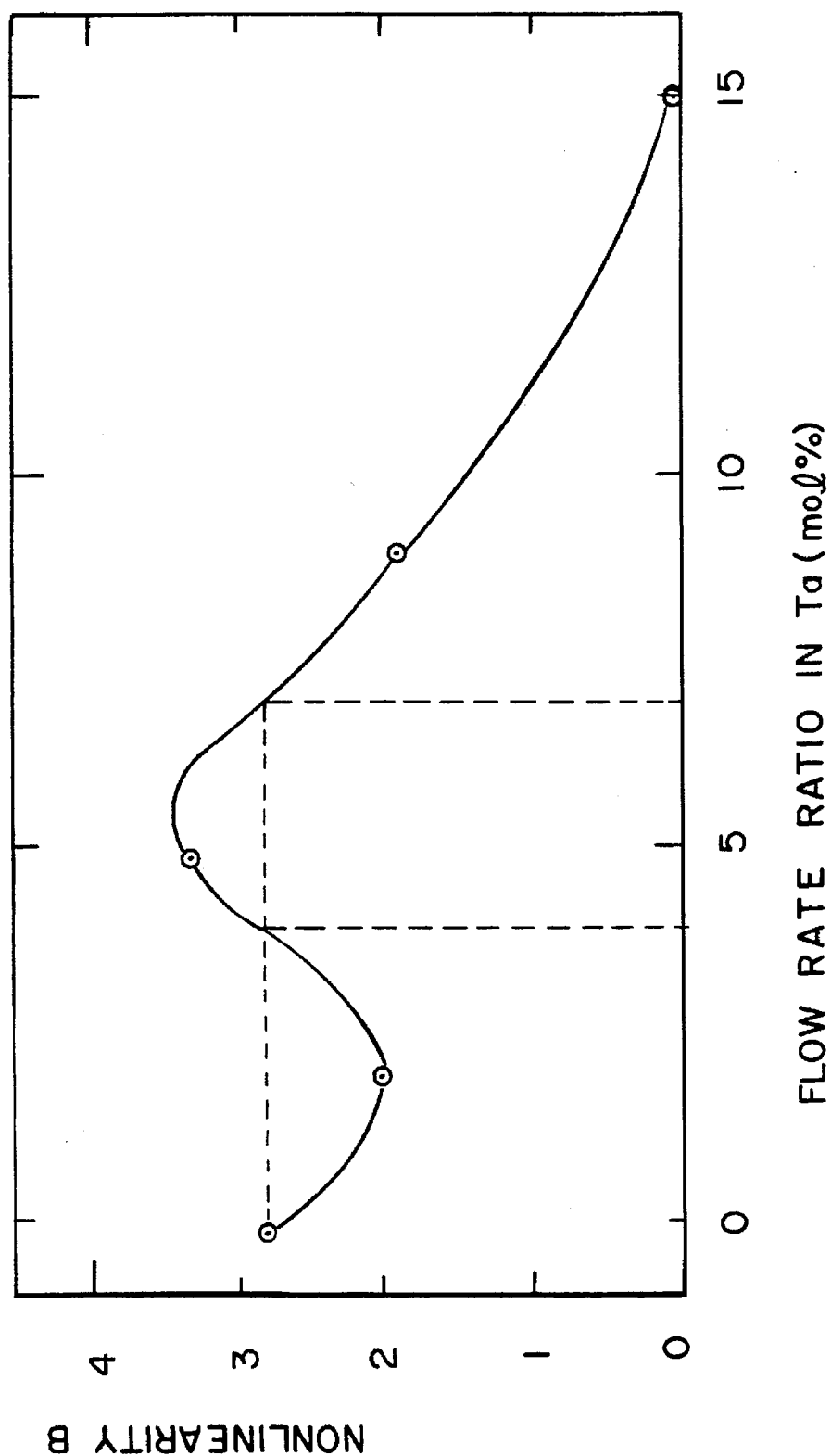
FIG. 16 is a diagram showing the relationship between the amount of nitrogen in sintered TaN and the nonlinearity B of an MIM device formed by using sintered TaN as a target.

FIG. 16 shows the relationship between the amount of nitrogen in sintered TaN used as a target and the nonlinearity of the MIM device having the thin Ta film obtained by using sintered TaN as a target. As is understood from FIG. 16, the nonlinearity of the MIM device obtained by use of a single piece of sintered TaN target containing nitrogen in the range of 4 to 7 mol % is as good as or better than that of the MIM device using the β-Ta film doped with no nitrogen; however, the nonlinearity of the MIM device obtained by the use of a single piece of sintered TaN target containing nitrogen out of the range is not as good as that of the MIM device using the β-Ta film.

Figure 17:
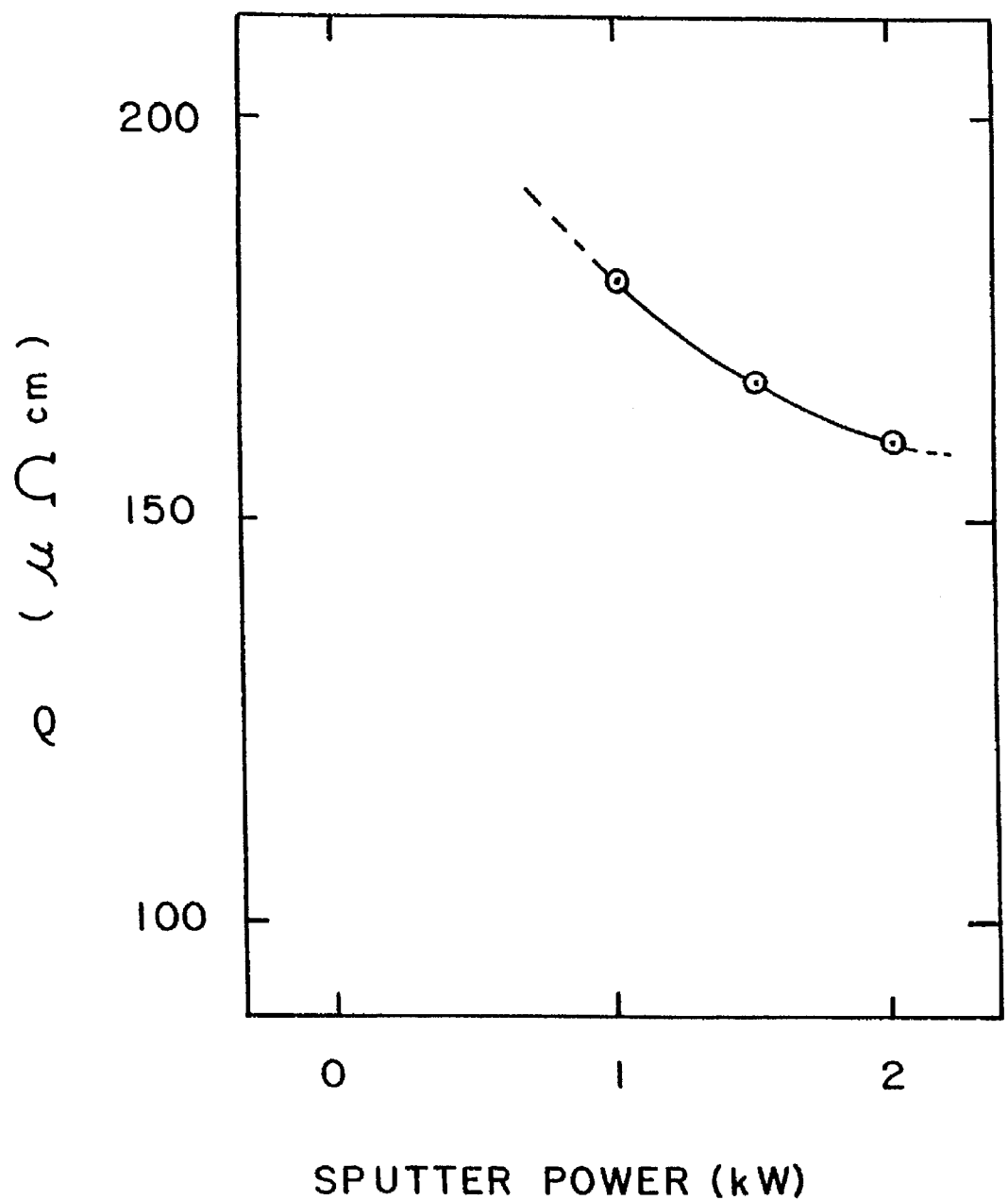
FIG. 17 is a diagram showing the sputtering power and the specific resistance of a Ta film in a β phase structure formed without being doped with nitrogen.
Figure 18:
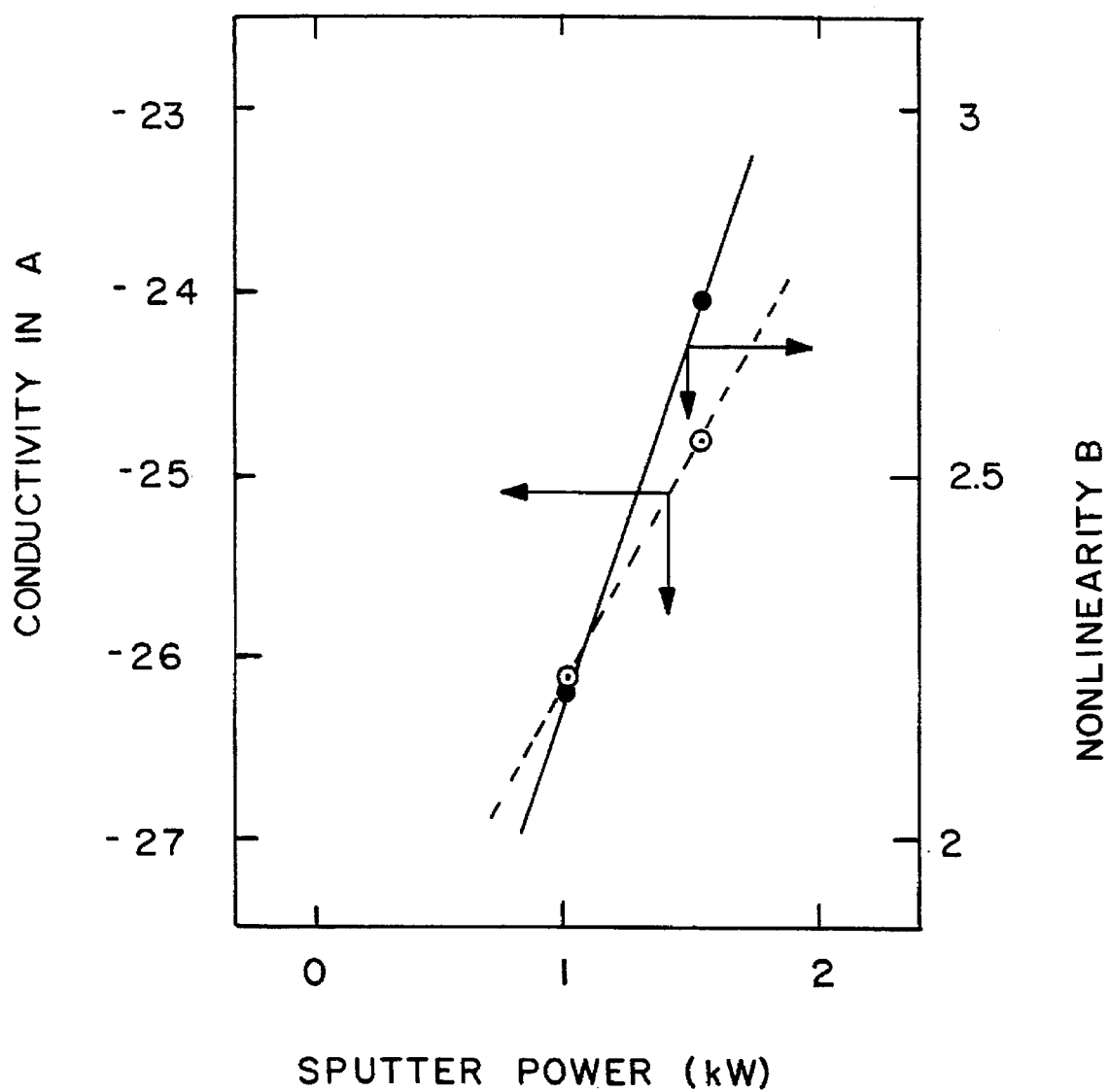
FIG. 18 is a diagram showing the relationship between the sputtering power, the conductivity, and the nonlinearity of an MIM device formed by using a β-Ta film formed without being doped with nitrogen.

FIG. 17 shows a change of a specific resistance ρ of the β-Ta film doped with no nitrogen. FIG. 18 shows Poole-Frenkel characteristics, i.e., the conductivity lnA and nonlinearity B of the MIM device using the β-Ta film doped with no nitrogen, with respect to a sputtering power.

As is understood from FIGS. 17 and 18, the specific resistance ρ of the Ta film obtained by sputtering, the conductivity lnA and the nonlinearity of the MIM device are varied by a change of the sputtering power. Such variations are caused as follows: When the sputtering rate becomes higher by an increased sputtering power, intervals in a Ta lattice in the deposited Ta film are enlarged during the formation of the Ta film, and free electrons are likely to move, making it easy for the current to flow.

In this example, the sputtering power is set at 2.6 kW. However, when the sputtering power is reduced to 1.7 kW as shown in Table 3, the resistance of the MIM device is increased and the nonlinearity B thereof is decreased. Thus, no contrast is realized by the liquid crystal display apparatus. As mentioned above, a higher sputtering power is preferred.

TABLE 3

|  | Sputtering Method | Flow Rate of N₂ gas | DC Power | Characteristics of MIM Device | | | Display Characteristics |
|---|---|---|---|---|---|---|---|
|  |  |  |  | ln A | B | Vop | Contrast ratio |
| Example | Sputtering using TaN as target | 5% | 2.6 kW | −30.7 | 3.34 | 20.9 | 18.0 |
|  |  |  | 1.7 kW | −34.2 | 3.04 | — | — |
| Comparative Example | Reactive Sputtering | 15% | 2.6 kW | — | ~0 | 50~ | ~1 |
|  |  | 0% | 4.5 kW | −24.5 | 2.82 | — | — |
|  |  | 2.9% |  | −26.0 | 2.80 | 17.6 | 10.6 |
|  |  | 4.3% |  | −26.8 | 2.87 | 28.0 | 15.4 |

Figure 19:
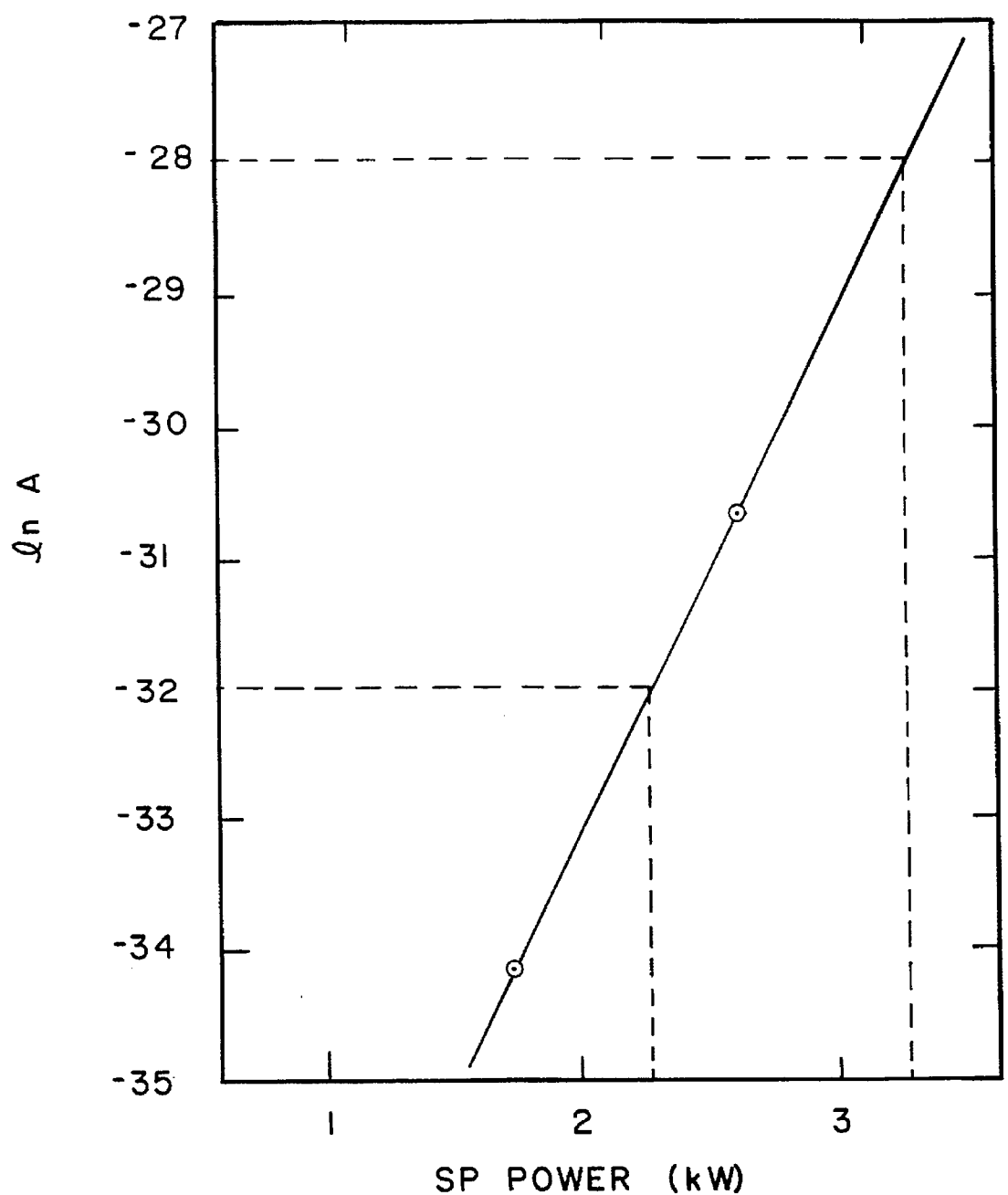
FIG. 19 is a diagram showing the relationship between the sputtering power and the conductivity of an MIM device formed with a Ta film by sputtering using sintered TaN as a target.

FIG. 19 shows the relationship between the sputtering power in a DC sputtering using a single piece of TaN sintered target and the coefficient 1nA representing the conductivity of the MIM device. In general, when the coefficient 1nA is a value in the range of −32 to −28, the MIM device has an excellent characteristic. FIG. 19 shows that the sputtering power should be set in the range of 2.2 kW to 3.2 kW in order that the MIM device of this example has the conductivity in the above-mentioned range. Accordingly, it is preferred that in this example, the thin Ta film is deposited with a high sputtering rate by setting the sputtering power in the range of 2.2 kW to 3.2 kW, so that the difficulty in the current flow can be prevented due to the uniform and fine structure of Ta. Further, the thin Ta film thus obtained can uniformly contain nitrogen because no $N_2$ gas is used, different from Example 1 employing the reactive sputtering.

As mentioned above, according to the present invention, an appropriate amount of nitrogen is uniformly doped in the thin Ta film used for the lower electrodes of the two-terminal nonlinear device. Accordingly, two-terminal nonlinear devices having nonlinearity as good as or better than that of the MIM device using the thin β-Ta film immediately after the fabrication thereof can be obtained. Further, an MIM device having an excellent thermal stability can be obtained. Moreover, two-terminal nonlinear devices having a uniform nonlinearity is obtained, compared with two-terminal nonlinear devices having the thin Ta film obtained by the reactive sputtering using a single piece of Ta target. Moreover, in a liquid crystal display apparatus using the two-terminal nonlinear display devices of this example as switching devices, the contrast ratio is independent of the temperature, and a high contrast and high quality display can be obtained.

EXAMPLE 3

A third example of the present invention will be described.

In this example, a thin Ta film is formed by a reactive sputtering using sintered TaN target containing 5 mol % of nitrogen or less, in an atmosphere of (Ar+$N_2$) gas in which the flow rate ratio of $N_2$ gas is 4% or less, thereby forming a lower electrode of a two-terminal nonlinear device.

Figure 20:
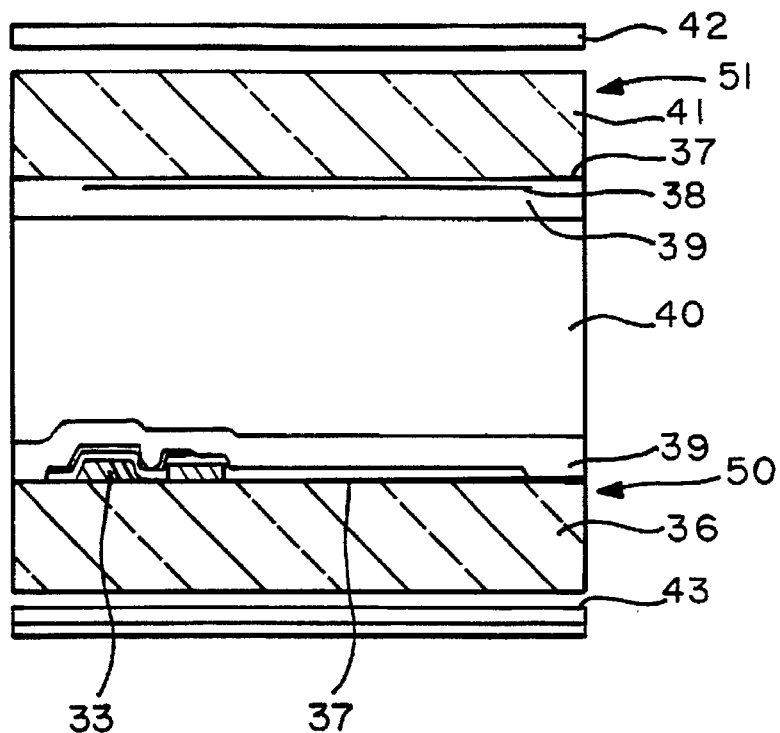
FIG. 20 is a cross-sectional view of a liquid crystal display apparatus comprising two-terminal nonlinear devices of Example 3 of the present invention.
Figure 21:
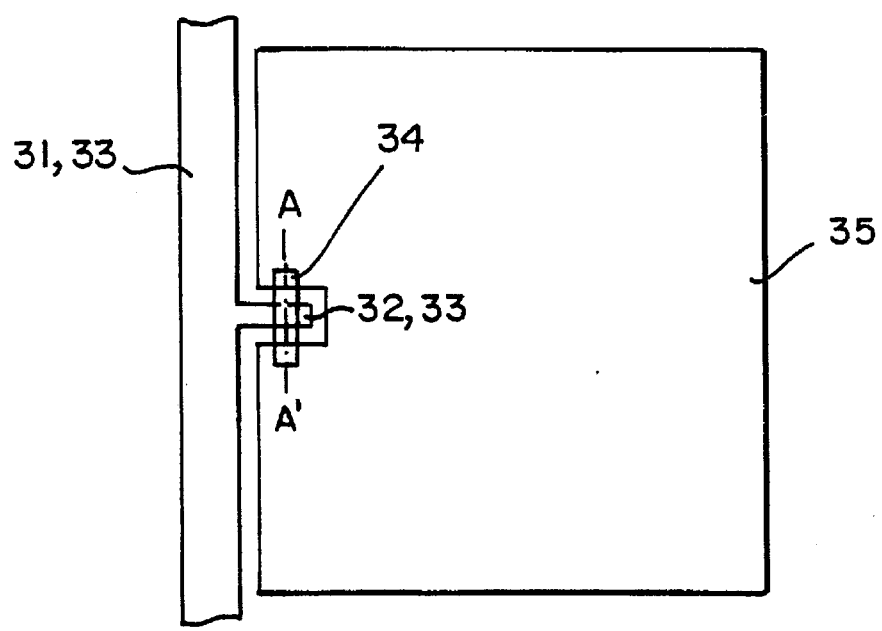
FIG. 21 is a plan view of a liquid crystal display apparatus of FIG. 20.
Figure 22:
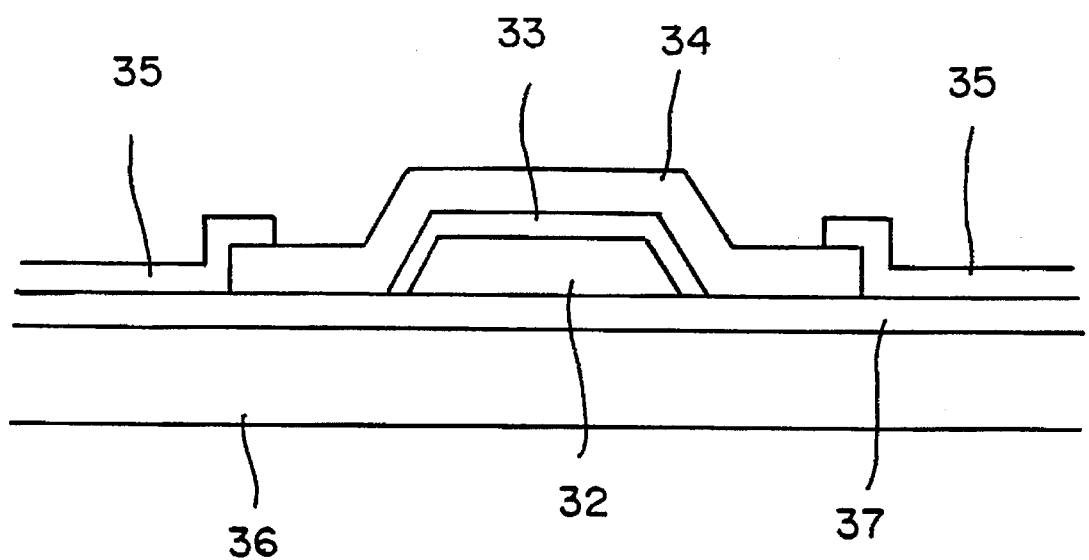
FIG. 22 is a cross-sectional view of an active matrix substrate of a liquid crystal display apparatus of FIG. 21 taken along a line A—A'.

FIG. 20 is a cross-sectional view of a liquid crystal display apparatus using the two-terminal nonlinear devices of an MIM type (hereinafter, referred to as "MIM devices") of this example as switching elements. FIG. 21 is a plan view of an active matrix substrate constituting the liquid crystal display apparatus. FIG. 22 is a cross-sectional view of FIG. 21 taken along a line A—A'. The liquid crystal display apparatus comprises the active matrix substrate 50, a counter substrate 51 and a liquid crystal layer 40 interposed therebetween.

The structure of the active matrix substrate 50 will be described with reference to FIG. 22. The active matrix substrate 50 comprises a glass substrate 36. A base coating insulator 37 is deposited almost over the glass substrate 36. On the base coating film 37, a plurality of signal lines 31 of Ta and a plurality of lower electrodes 32 branched from the signal lines 31 are formed. Insulators 33 are deposited over the signal lines 31 and lower electrodes 32, and upper electrodes 34 of Ta, Ti, Cr, Al or the like are formed thereon. The MIM device comprises one lower electrode 32, one upper electrode 34 and one insulator 33 interposed therebetween. The upper electrode 34 is electrically connected to the corresponding one of the pixel electrodes 35 of an ITO transparent conductive film or the like.

The active matrix substrate is formed as follows under the conditions that a liquid crystal cell has a reflective mono- chrome TN liquid crystal mode having 640×480 dots and 0.3 mm pitch; the width of each signal line 31 is 40 μm; the size of the MIM element is 6 μm×5 μm; and the ratio of the MIM element capacity to the liquid crystal capacity is approximately 1:10.

First, the base coating insulator 37 of $Ta_2O_5$ is deposited on the glass substrate 36 by sputtering so as to have a thickness of 5000 angstroms. No-alkali glass, borosilicate glass, and soda-lime glass may be used as the glass substrate 36. In this example, #7059 Fusion Pilex Glass (manufactured by Corning Japan Co., Ltd.) is used. Further, the base coating insulator 37 can be omitted; however, thin films formed on the base coating insulator 37 can be prevented from being contaminated by the glass substrate 36, thereby obtaining further excellent characteristics of the MIM device.

Figure 23A:
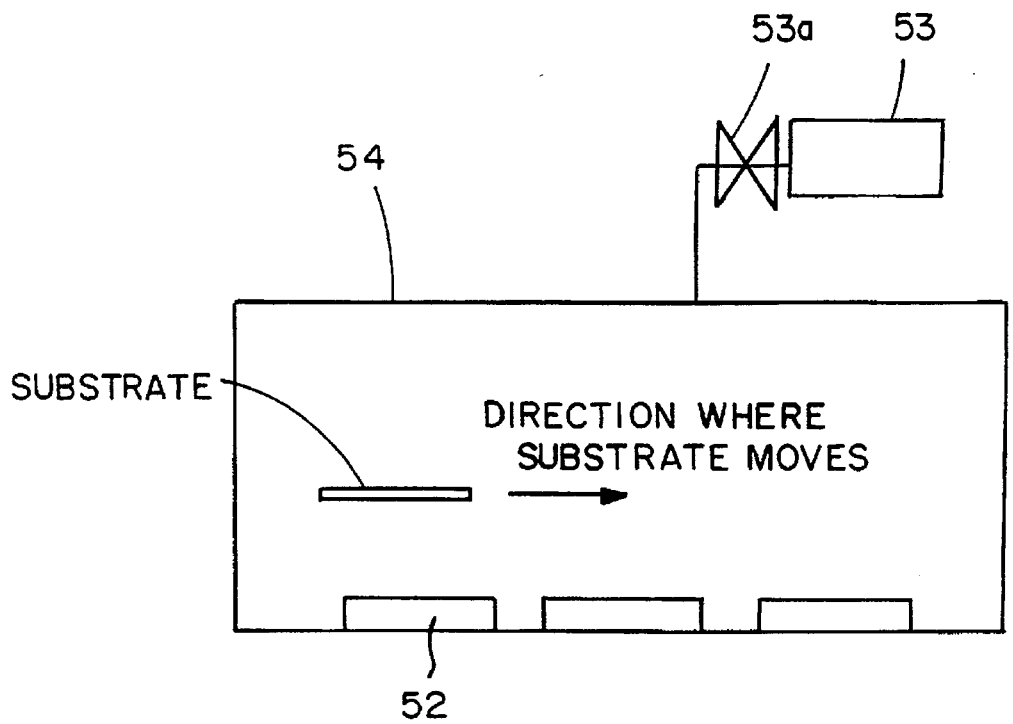
FIG. 23A is a schematic front view of an in-line sputtering apparatus.

Successively, a thin Ta film is deposited on the base coating insulator 37 by sputtering so as to have a thickness of 3000 angstroms. In this example, sputtering is conducted in an in-line sputtering apparatus (as shown in FIG. 23A) using three pieces of sintered TaN target containing 3 mol % of nitrogen in an atmosphere of (Ar and $N_2$) gas. Ar gas and $N_2$ gas are introduced into a chamber 54 of the sputtering apparatus, respectively. $N_2$ gas is reserved in a tank 53 and the flow rate thereof is adjusted by a valve 53a so that the flow rate ratio of $N_2$ gas to (Ar+$N_2$) gas is 2%, when $N_2$ gas is introduced into the chamber 54 from the tank 53. In addition, in this example, sputtering is conducted under the condition of a gas pressure in chamber 54 of 0.4 Pa; a DC power of 5.3 W/cm$^2$; a temperature and the time for heating the substrate of 100° C. and 180 seconds; a conveyance rate of the substrate of 100 mm/min; and an interval between the substrate and target 52 of 77 mm. In this case, the sputtering rate is approximately in the range of 300 to 600 angstroms/min.

The thin Ta film thus deposited is patterned into a desired shape by photolithography, to form the signal line 1 and the lower electrode 2 of the MIM device.

Figure 23B:
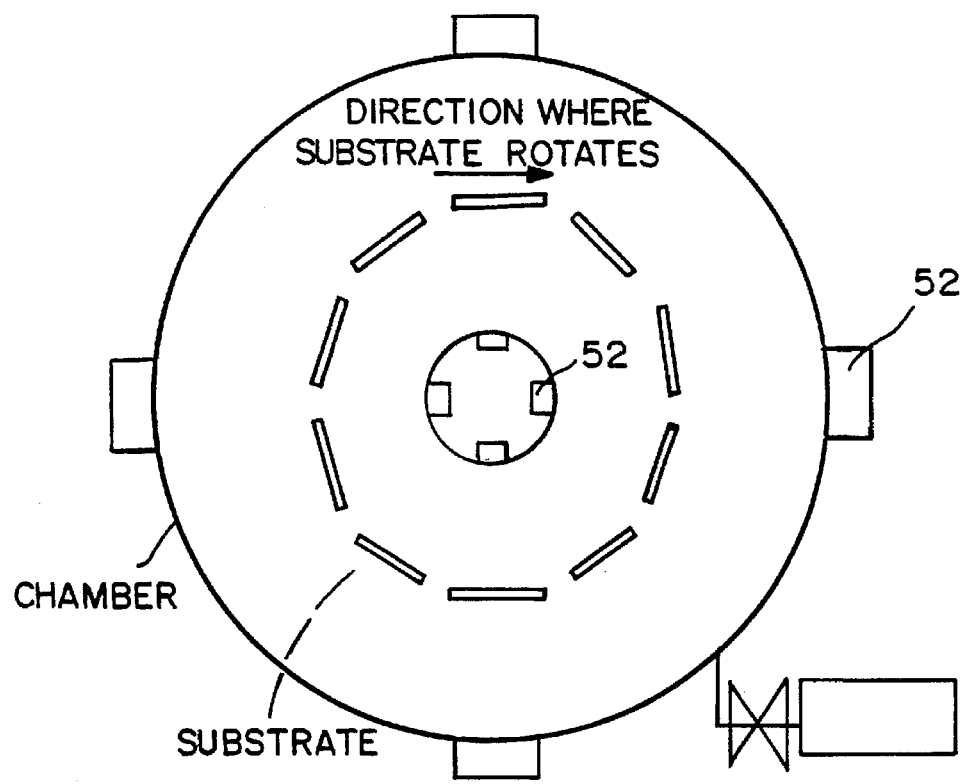
FIG. 23B is a schematic plan view of a rotary sputtering apparatus.

In addition, a thin Ta film can be formed by a rotary sputtering apparatus shown in FIG. 23B in place of the in-line sputtering apparatus. In the case of using the rotary sputtering apparatus, sputtering is conducted under the condition of the sputtering pressure in the range of 9.3×10$^{-2}$ to 1.3 Pa; the DC power of 5.0 W/cm$^2$; the temperature for heating the substrate of 240° C.; the rotation rate of 160 sec/time; an interval between the target 52 and the substrate of 200 mm. In the rotary sputtering apparatus, four pieces of target 52 are provided inside and outside the rotation area of the substrate, as shown in FIG. 23B; however, one or more pieces of target 52 can be provided only inside or outside the rotation area.

After that, an exposed portion of each of the signal line 31 and the lower electrode 32 excluding a terminal portion thereof to be connected to the external driving circuit is anodized in 1 wt % of an ammonium tartrate solution as an electrolyte, thereby forming an anodized oxide film. In this example, the anodization is conducted under the conditions that the temperature is the electrolyte of approximately 25° C.; the voltage is approximately 27 V; and the current is approximately 0.7 mA, thereby forming an anodized oxide film of $Ta_2O_5$ having a thickness of 600 angstroms.

Next, a metal thin film is deposited over the glass substrate 36 by sputtering and then patterned into a desired shape by the photolithography or the like to form the upper electrode 34. Examples of materials for the upper electrode 34 include Ta, Ti, Cr and Al. In this example, a thin film of Ti having a thickness of 4000 angstroms is patterned into a desired shape to form the upper electrodes 34. Each electrode has a rectangular shape having a length of 20 µm and a width of 6 µm.

After the fabrication process of the upper electrodes 34, a transparent conductive film of ITO or the like is deposited on the glass substrate 36 and then patterned to form the pixel electrodes 35. In this way, the active matrix substrate 50 is completed.

The counter substrate 51 is fabricated as follows:

The counter substrate also comprises a glass substrate 41. A plurality of strips of a transparent conductive film of ITO are formed at 0.3 mm pitch on the glass substrate 41 so that respective strips cross the signal lines 31 on the active matrix substrate 50 at right angles. The strips work as counter electrodes 38. The thickness of each strip is 1000 angstroms. If a color filter layer is formed on the counter substrate 51, a liquid crystal display apparatus capable of displaying color can be obtained. In addition, the active matrix substrate 50 and the counter substrate 51 can be produced in the reverse order, compared with the above-mentioned fabrication process.

An orientation film 39 is deposited over a surface of each of the active matrix substrate 50 and the counter substrate 51 bearing wirings at a temperature of approximately 200° C. After that, both of the substrates with the orientation films 39 are rubbed in a prearranged direction so as to obtain liquid crystal molecule alignments.

Next, a thermosetting sealing agent is coated onto either one of the substrates 50 and 51, and a spacer is uniformly dispersed on the other substrate. The resulting substrates are attached to each other so that the orientation films face each other and then heated at a temperature of approximately 150° to 200° C. so as to cure the sealing agent, while the substrates are pressed. The substrates are arranged so that the liquid crystal molecules will make a 90° twist going from one substrate to the other substrate.

Liquid crystal is injected between the attached substrates and the resulting substrates are sealed. In this way, the liquid crystal cell is completed.

A transmitting polarizer 42 having a transmittance of 44.5% and the degree of polarization of 96.5% is provided on a front face of the liquid crystal cell; and a reflective polarizer 43 obtained by providing an Al reflective plate on the same transmitting polarizer as the transmitting polarizer 42 is provided on a back face, thereby completing a liquid crystal display apparatus.

In this example, sintered TaN target containing nitrogen is used for deposition of a thin Ta film by sputtering. Thus, the flow rate ratio of $N_2$ gas to $(Ar+N_2)$ gas can be maintained below approximately 4%, with which the flow rate of $N_2$ gas cannot be easily regulated. Accordingly, it is possible that $N_2$ gas is uniformly introduced into the sputtering chamber, whereby the amount of nitrogen in the sputtering apparatus can be uniformly regulated. Due to this, the amount of nitrogen taken into the thin Ta film can be made uniform. As a result, unevenness in the thickness of the insulator obtained by the anodization of the thin Ta film can be prevented, whereby unevenness in the nonlinearity among the MIM devices can be greatly decreased.

Figure 24:
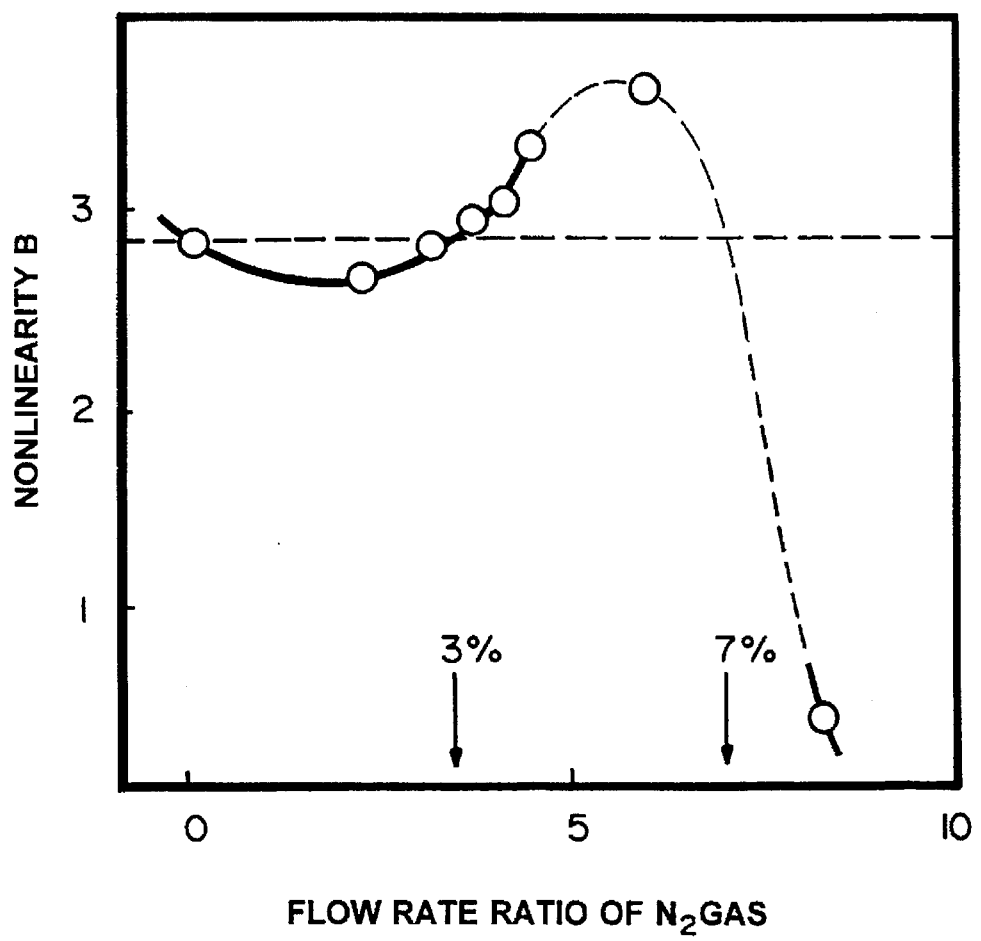
FIG. 24 is a diagram showing the relationship between the flow rate ratio of N$_2$ gas to (Ar+N$_2$) gas and the nonlinearity B of a two-terminal nonlinear device of Example 3.

Further, as is understood from FIG. 24, in the case where a thin Ta film is formed by the reactive sputtering, in order to obtain the same degree of the nonlinearity of the MIM device as that of the MIM device using the β-Ta film as the lower electrode, the flow rate ratio of $N_2$ gas to $(Ar+N_2)$ gas should be set in the range of 3 to 7%. In this example, nitrogen can be obtained from both sintered TaN target and $N_2$ gas in an atmosphere of $(Ar+N_2)$ gas. Thus, a sufficient amount of nitrogen can be taken into the thin Ta film so as to prevent the deterioration of the nonlinearity of the MIM device caused by the heat treatment while fabricating the liquid crystal cell. Further, sintered TaN target containing a smaller amount of nitrogen can be used in this example, so that intervals in a Ta lattice of the deposited thin Ta film are enlarged. Therefore, the nonlinearity of the two-terminal nonlinear device as excellent as or more excellent than that of the MIM device using the β-Ta film for the lower electrodes can be obtained.

In this example, sputtering is conducted using several pieces of TaN target in the sputtering apparatus shown in FIGS. 23A and 23B. By using several pieces of TaN target, a substrate on which the thin Ta film is deposited passes regions where the substrate faces pieces of TaN target 52 and regions where the substrate does not face pieces of TaN target 52, alternately. Accordingly, the thin Ta film has the same structure as that of Example 1 (see FIG. 3) in which the poor portions (containing a small amount of nitrogen) and the rich portions (containing a large amount of nitrogen) are alternately deposited from the side of glass substrate 36. An insulator formed by the anodization of the thin Ta film may have such a structure to some extent. That is, the insulator also has the poor portions and rich portions alternately deposited therein. Due to the rich portions existing in the insulator, the nonlinearity of the MIM device can easily be thermally stabilized; and due to the poor portions existing in the insulator, the current can easily flow. Further, the MIM device has a satisfactory symmetrical curve of a current-voltage characteristic as shown in FIG. 8 (in which the reactive sputtering is conducted using three pieces of target).

FIG. 25A shows the unevenness in the sheet resistivity of the thin Ta film of this example. The thin Ta film is formed under the conditions that the amount of nitrogen contained in sintered TaN target is 3 mol % and the flow rate ratio of $N_2$ gas to $(Ar+N_2)$ gas is 2%. FIG. 25B shows Comparative Example 3 in which a thin Ta film is formed by sputtering using sintered TaN target containing 5 mol % of nitrogen in an atmosphere of Ar gas. FIGS. 25C and 25D show Comparative Examples 4 and 5, respectively. In Comparative Example 4, a thin Ta film is formed by the reactive sputtering using Ta target having the purity of 99.99% in an atmosphere of $(Ar+N_2)$ gas in which the flow rate ratio of $N_2$ gas is 2.9%. In Comparative Example 5, a thin Ta film is deposited in the same manner as in Comparative Example 4 except that the flow rate ratio of $N_2$ gas to $(Ar+N_2)$ gas is 4.3%.

As is understood from FIGS. 25A to 25D, the thin Ta films obtained in this example have a more uniform sheet resistivity, compared with the thin Ta films in Comparative Examples 3, 4 and 5. The thin Ta films such as those of this example are anodized, whereby insulators having a uniform thickness are formed. Accordingly, the unevenness in the nonlinearity of the MIM device is greatly decreased in this example.

Figure 26:
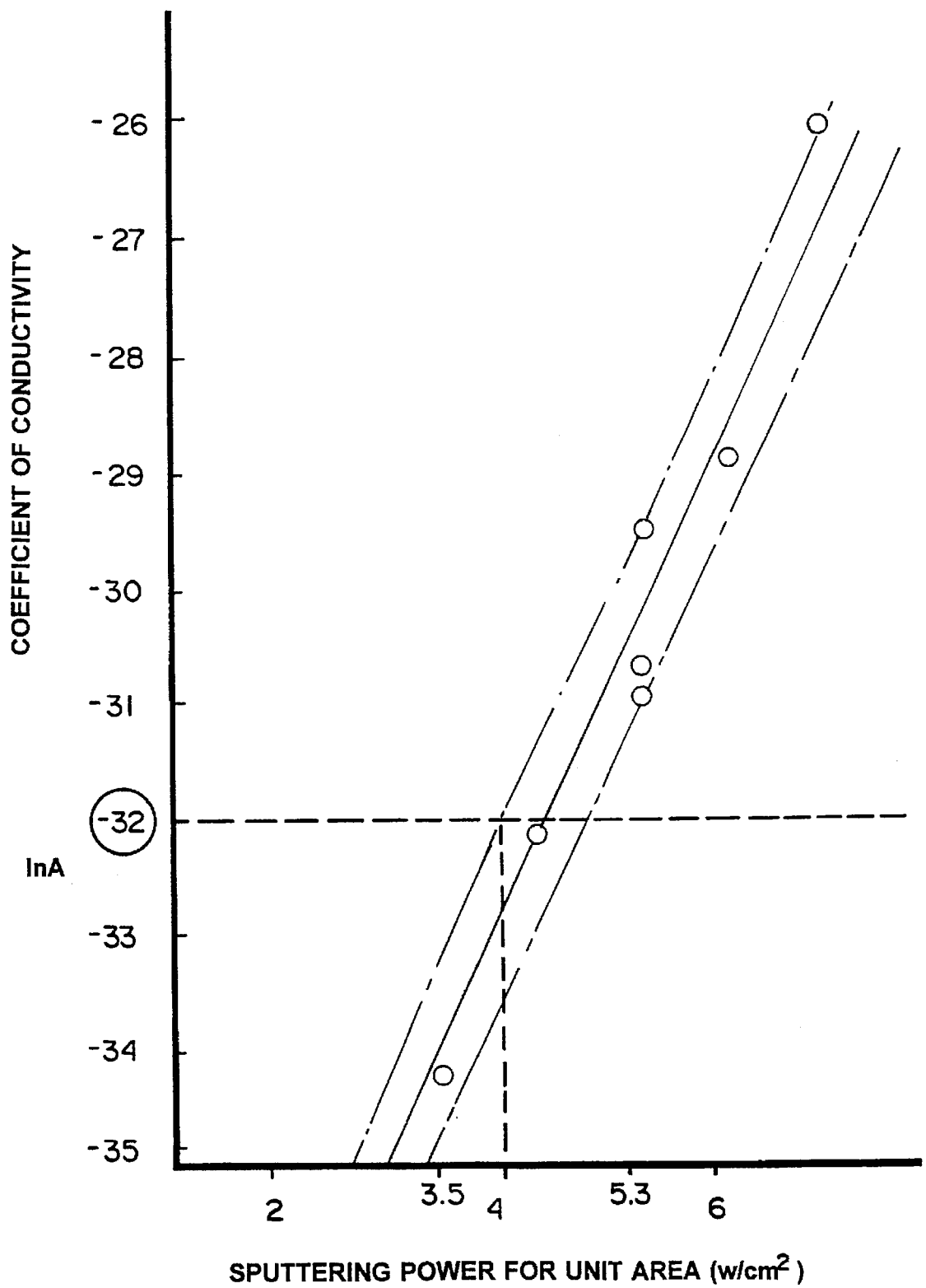
FIG. 26 is a diagram showing the relationship between the sputtering power for a unit area and the conductivity 1nA of a two-terminal nonlinear device of Example 3.

FIG. 26 shows the relationship between the sputtering power for a unit area and the coefficient of the conductivity (1nA). As is understood from FIG. 26, when 1nA is smaller −32, the symmetrical curve of a current-voltage characteristic is not obtained, which is not preferred in view of the characteristic of the MIM device. Thus, it is preferred that the sputtering power is set at 4 W/cm$^2$ or more. However, when 1nA is made too large, the sputtering power becomes too large, so that the sputtering apparatus will be damaged. On the contrary, since the coefficient B represents the nonlinearity of the MIM device of this example, a larger voltage ratio ($V_{ON}/V_{OFF}$) in the vicinity of the threshold voltage can be obtained by setting B larger, whereby high contrast of a liquid crystal display apparatus can be realized.

Table 4 shows the nonlinearity of the MIM device of this example and the contrast ratio of a liquid crystal display apparatus using the MIM devices of this example. In this example, sputtering is conducted using sintered TaN target in an atmosphere of (Ar+$N_2$) gas to form a Ta thin film. Further, in Example 3-1, an in-line sputtering apparatus is used as a sputtering apparatus; and in Example 3-2, a rotary sputtering apparatus is used. In Comparative Example 6, sputtering is conducted using sintered TaN target in an atmosphere of Ar gas; in Comparative Examples 7 and 8, sputtering is conducted using Ta target in an atmosphere of (Ar+$N_2$) gas; and in Comparative Example 9, sputtering is conducted using pure Ta target in an atmosphere of Ar gas for forming a β-Ta film.

According to this example, a thin Ta film can be formed by using nitrogen contained in sintered TaN target and in an (Ar+$N_2$) gas. Thus, even though the flow rate ratio of $N_2$ gas is set below the range with which the flow rate of $N_2$ gas cannot be regulated, a sufficient amount of nitrogen can be taken into the deposited thin Ta film so as to decrease the unevenness in the nonlinearity of the MIM device. Further, it is possible to obtain a sufficient amount of nitrogen so as to prevent the deterioration of the nonlinearity of the MIM device due to the heat treatment. Accordingly, MIM devices whose nonlinearity is less uneven and more thermally stable can be more reliably obtained. Further, in this example, since sputtering is conducted by using sintered TaN target in an atmosphere of (Ar+$N_2$) gas, intervals in the Ta lattice of the deposited thin Ta film can be enlarged, compared with Example 2 in which sputtering is conducted using sintered TaN as a target in an atmosphere of Ar gas. Due to this, the current can easily flow in the insulator formed by the anodization of the Ta thin film. Moreover, in a liquid crystal

TABLE 4

| | Sputtering Method | Amount of Nitrogen in target (mol %) | Amount of $N_2$ gas In (Ar + $N_2$) gas (%) | Sputtering Power (W/cm$^2$) | Characteristics of MIM Device | | Contrast ratio |
|---|---|---|---|---|---|---|---|
| | | | | | In A | B | |
| Example 1 | Mixing Technique (conveyance in a series) | 3 | 2 | 5.3 | −31.0 | 3.2 | 20 |
| Example 2 | Mixing Technique (conveyance in a rotation) | 5 | 2 | 5.0 | −32.5 | 2.9 | 15 |
| Comparative Example 6 | sputtering TaN as target | 5 | 0 | 5.3 | −30.7 | 3.4 | 18 |
| Comparative Example 7 | Reactive Sputtering | 0 | 2.9 | 6.8 | −26.0 | 2.8 | 11 |
| Comparative Example 8 | Reactive Sputtering | 0 | 4.3 | 6.8 | −26.8 | 2.9 | 15 |
| Comparative Example 9 | | 0 | 0 | 6.8 | −24.5 | 2.8 | — |

As is understood from Table 4, the MIM device of this example has the conductivity (1nA) smaller than that of any other Comparative Examples 6 to 9. Namely, the MIM device of this example has a small leak current. Further, the value of the coefficient B representing the nonlinearity of the MIM device of this example is close to that of the MIM device of Comparative Example 9. Therefore, the MIM device of this example has the nonlinearity as good as that of the MIM device comprising an insulator obtained by the anodization of the β-Ta film.

Figure 27:
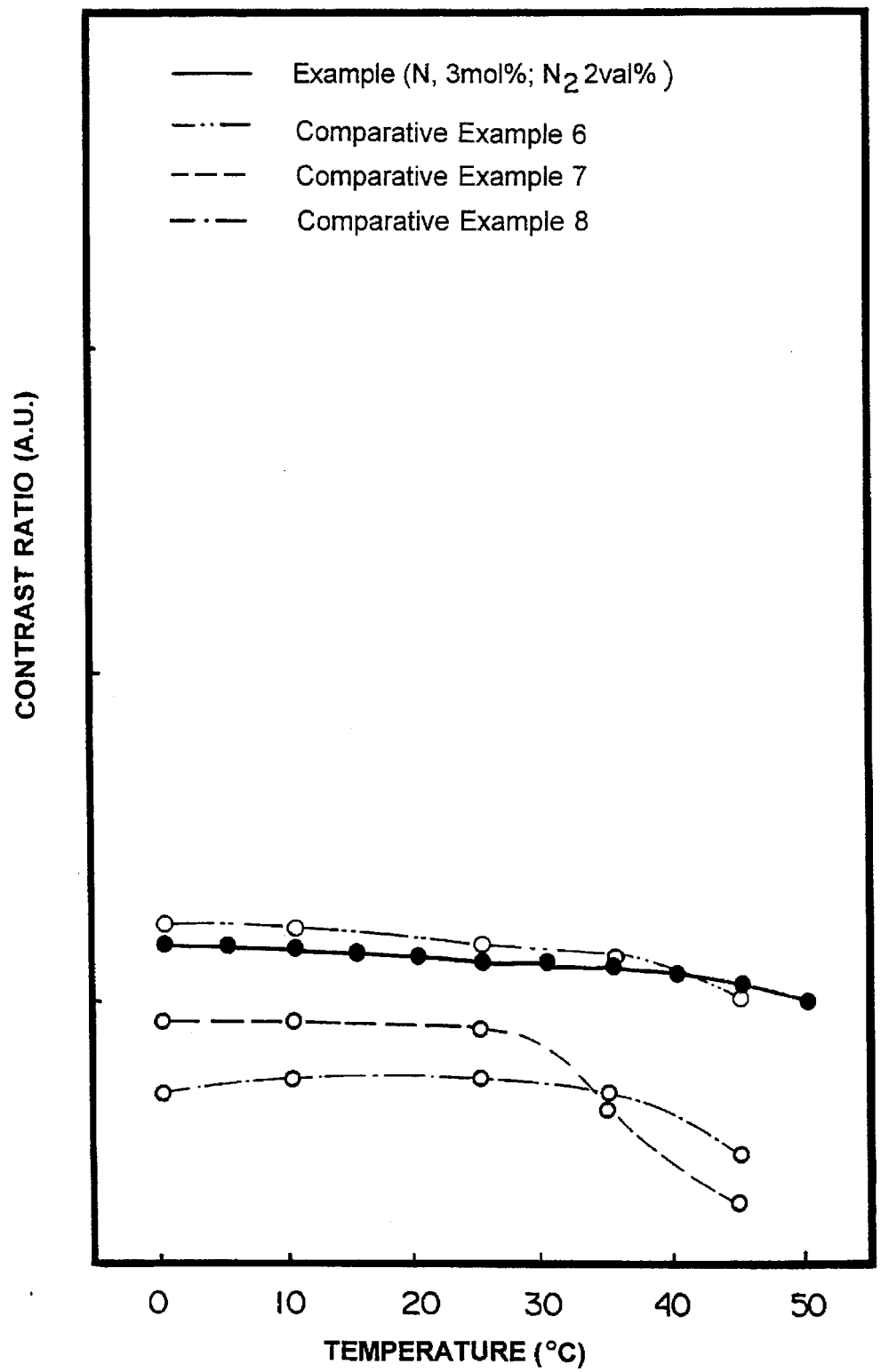
FIG. 27 is a diagram showing the temperature dependence of the contrast ratio of a liquid crystal display apparatus having two-terminal nonlinear devices of Example 3.

FIG. 27 shows the temperature dependence of the contrast ratio in a liquid crystal display apparatus using the MIM devices of this example in a solid line. Further, a two-dot dash line, a broken line and a dash-dot line represent the contact ratio of the MIM device of Comparative Examples 6, 7 and 8, respectively. As is understood from FIG. 27, the contrast ratio of this example is independent of bad influence by temperature and is therefrom excellent.

In this example, pieces of sintered TaN target containing 3 mol % of nitrogen are used. However, the amount of nitrogen in the sintered TaN target is not limited to 3 mol %. It is preferred that the amount of nitrogen in the sintered TaN target is 5 mol % or less, and 3 mol % or less is more preferred. Further, $N_2$ gas is introduced into the chamber 54 so that the flow rate ratio of $N_2$ gas to (Ar+$N_2$) gas is 2%. However, the flow rate ratio of $N_2$ gas to (Ar+$N_2$) gas is not limited to 2%. It is preferred that the flow rate ratio of $N_2$ gas is 4% or less, and 2% or less is more preferred.

apparatus using the MIM devices of this example as switching elements, a display having high contrast and high quality, being independent of the temperature can be obtained.

EXAMPLE 4

A fourth example of the present invention will be described.

In this example, MIM devices having an uniform and thermally stable nonlinearity will be formed. When such MIM devices are used as switching elements in a liquid crystal display apparatus, an occurrence of a residual image on a display can be prevented.

Figure 28:
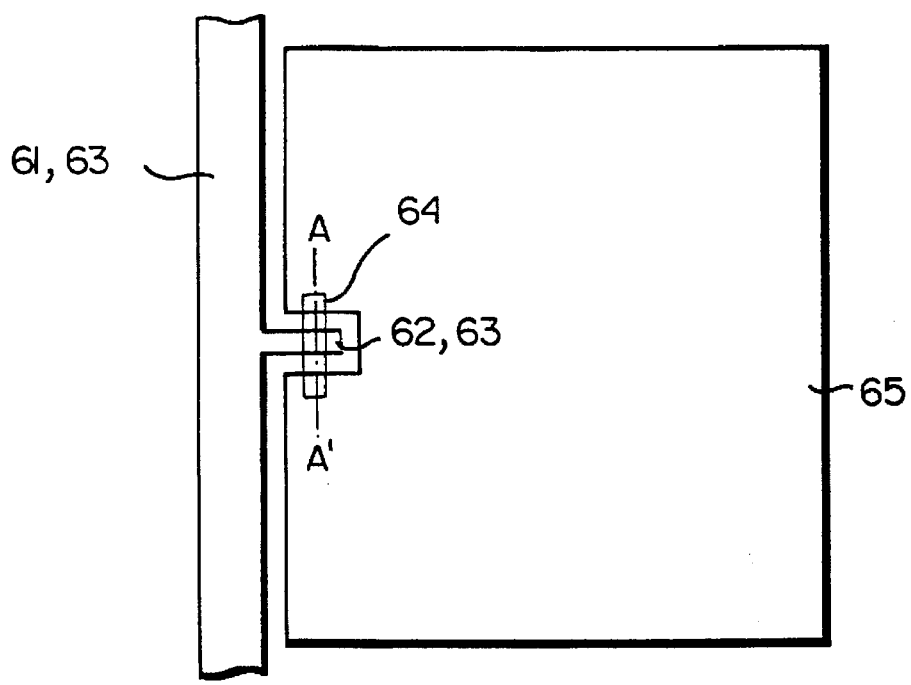
FIG. 28 is a plan view of an active matrix substrate of a liquid crystal display apparatus comprising two-terminal nonlinear devices of Example 4 of the present invention.
Figure 29:
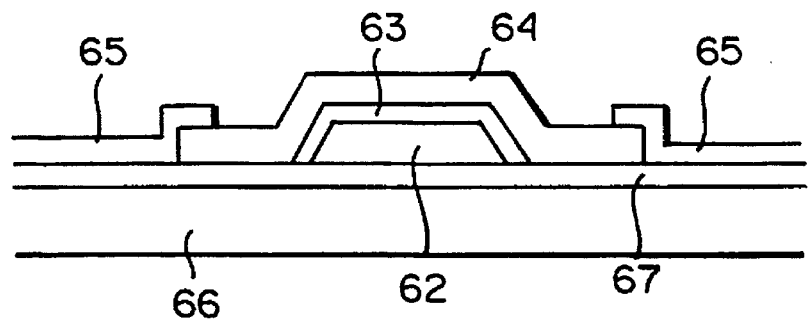
FIG. 29 is a cross-sectional view of a liquid crystal display apparatus of FIG. 28.

FIG. 28 is a plan view showing an active matrix substrate on which the MIM devices are formed. FIG. 29 is a cross-sectional view taken along a line A—A'. FIG. 28 shows the active matrix substrate for one pixel.

The structure of the active matrix substrate will be described with reference to FIGS. 28 and 29. The active matrix substrate comprises a glass substrate 66. A base coating insulator 67 is deposited almost over the glass substrate 66. On the base coating insulator 67, a plurality of signal lines 61 of Ta and a plurality of lower electrodes 62 branched from the signal lines 61 are formed. Insulators 63 are formed over the signal lines 61 and the lower electrodes 62, and upper electrodes 64 of Ta, Ti, Cr, Al or the like are formed thereon. The MIM device comprises one lower electrode 62, one upper electrode 64 and one insulator 63 interposed therebetween. The upper electrode 64 is electrically connected to the corresponding one of the pixel electrodes 65 of an ITO transparent conductive film or the like.

The active matrix substrate is fabricated as follows under the conditions that a liquid crystal cell has a reflective monochrome TN liquid crystal mode having 640×480 dots and 0.3 mm pitch; the width of each signal line 61 is 40 μm; the size of the MIM device is 6 μm×5 μm; and the ratio of the MIM device capacity to the liquid crystal capacity is approximately 1:10.

First, the base coating insulator 67 of $Ta_2O_5$ is deposited on the glass substrate 66 by sputtering so as to have a thickness of 5000 angstroms. No-alkali glass, borosilicate glass and soda-lime glass may be used as the glass substrate 66. In this example, #7059 Fusion Pilex Glass (manufactured by Corning Japan Co., Ltd.) is used. Further, the base coating insulator 67 can be omitted; however, thin films formed on the base coating film 67 can be prevented from being contaminated from the glass substrate 66, thereby obtaining further excellent characteristics of a two-terminal nonlinear device of an MIM type (hereinafter, referred to as "an MIM device").

Successively, the thin Ta film is deposited on the glass substrate 66 by a reactive sputtering so as to have a thickness of 3000 to 3500 angstroms. In this case, three pieces of target of Ta with a purity of 99.99% are aligned in series in the direction where the substrate 66 is conveyed. Moreover, argon (Ar) gas and nitrogen ($N_2$) gas are used as reactive gas. The flow rate ratio of $N_2$ gas to (Ar+$N_2$) gas is set at 2.2%, 2.9%, 3.6%, 4.3% and 8.3% for sputtering. Further, the thicknesses of poor portions (containing a small amount of nitrogen) and rich portions (containing a large amount of nitrogen) of the thin Ta film can be changed by appropriately adjusting intervals between the three pieces of Ta target and conditions for sputtering such as the sputtering power and the conveyance rate of the glass substrate 66. In this example, sputtering is conducted under the conditions that each target has a size of 5 inches×16 inches; each interval between the pieces of target is 10 cm; the sputtering power is 3.5 to 4.5 kW (current: 8.5 A, voltage: 410 to 530 V), the conveyance rate of the substrate is 460 mm/min; and the temperature for heating the substrate is 100° C.

Next, the deposited thin Ta film is patterned into a desired shape by photolithography so as to form the signal line 61 and the lower electrode 62. After that, an exposed portion of each of the signal line 61 and the lower electrode 62, excluding a terminal portion thereof to be connected to the external driving circuit, is anodized in 1 wt % of ammonium tartrate, thereby forming an anodized oxide film. In this example, the anodization is conducted under the conditions that the temperature of an electrolyte, i.e., 1 wt % of ammonium tartrate, a voltage and a current are approximately 25° C., 27 V and 0.7 mA, respectively, thereby obtaining the anodized oxide film of $Ta_2O_5$ with a thickness of 600 angstroms.

Examples of the electrolyte include citric acid, phosphoric acid and ammonium borate, as well as ammonium tartrate. Table 5 shows the symmetrical curve of a current-voltage characteristic of the MIM device having the insulator formed by the anodization using such electrolytes. As is understood from Table 5, the MIM device having the anodized oxide film formed in a solution containing an ammonium group, i.e., ammonium borate or ammonium tartrate, has an excellent current-voltage characteristic curve. The best current-voltage characteristic curve can be obtained by using 1 wt % of ammonium tartrate, which can be applied to Examples 1 to 3. Namely, an excellent current-voltage characteristic curve can be obtained by using 1 wt % of ammonium tartrate in Examples 1 to 3 mentioned above.

TABLE 5

| Material of Electrolyte | Used Electrolyte | Symmetric Curve of I-V characteristic |
| --- | --- | --- |
| Citrate | 0.1 to 3.0 wt % of Citric Acid | X |
| Phosphate | 0.1 to 3.0 wt % of Phosphoric Acid | X |
| Borate | 0.5 to 3.0 wt % of Ammonium Borate | Δ |
| Tartrate | 0.5 to 3.0 wt % of Ammonium Tartrate | ○ |

Next, a metal thin film is deposited over the glass substrate 66 bearing the anodized oxide film and then patterned to form the upper electrode 64. Examples of materials for the upper electrode 64 include Ta, Ti, Cr and Al. In this example, a thin film of Ti is sputtered so as to have a thickness of 4000 angstroms and then patterned by the photolithography into a desired shape to form the upper electrodes 64. Each upper electrode 64 has a rectangular shape having a length of 20 μm and a width of 6 μm. In this way, the MIM device comprising one lower electrode 62, one upper electrode 64 and one anodized oxide film 63 as the insulator interposed therebetween is completed.

Further, a transparent conductive film of ITO is deposited over the glass substrate 66 and then patterned to form the pixel electrode 65. In this way, the active matrix substrate is completed.

The active matrix substrate is attached to a counter substrate, constituting a liquid crystal cell. The counter substrate also comprises a substrate, on which a plurality of strips of a transparent conductive film are formed so that respective strips cross the signal lines 61 formed on the active matrix substrate at right angles. The strips of the transparent conductive film work as counter electrodes. In this example, the strips with a thickness of 1000 angstroms are formed at 0.3 mm pitch. In addition, if a color filter layer is formed on the counter substrate, a liquid crystal display apparatus capable of displaying color can be obtained.

The above-mentioned cell is fabricated as follows:

First, an orientation film is deposited on a surface of each of the active matrix substrate and the counter substrate at a temperature of approximately 200° C. Then, both of the substrates with the orientation films are rubbed in a prearranged direction so as to obtain liquid crystal alignments.

Next, a sealing agent is coated onto one substrate and a spacer is uniformly dispersed on the other substrate. In this example, a thermosetting agent is used as the sealing agent. The resulting substrates are attached to each other so that respective surfaces thereof with wirings face each other and then heated at a temperature of approximately 150° to 200° C. to cure the sealing agent while the substrates are pressed. Liquid crystal is injected between the substrates and the resulting substrates are sealed. The substrates are arranged so that the liquid crystal molecules will make a 90° twist going from one substrate to the other substrate. In this way, the liquid crystal cell is fabricated.

A transmitting polarizer having a transmittance of 44.5% and a degree of polarization of 96.5% is provided on a front face of the liquid crystal cell; and a reflective polarizer obtained by providing an Al reflective plate on the same polarizer as the transmitting polarizer is provided on a back face thereof, thereby fabricating a liquid crystal display device.

Figure 30:
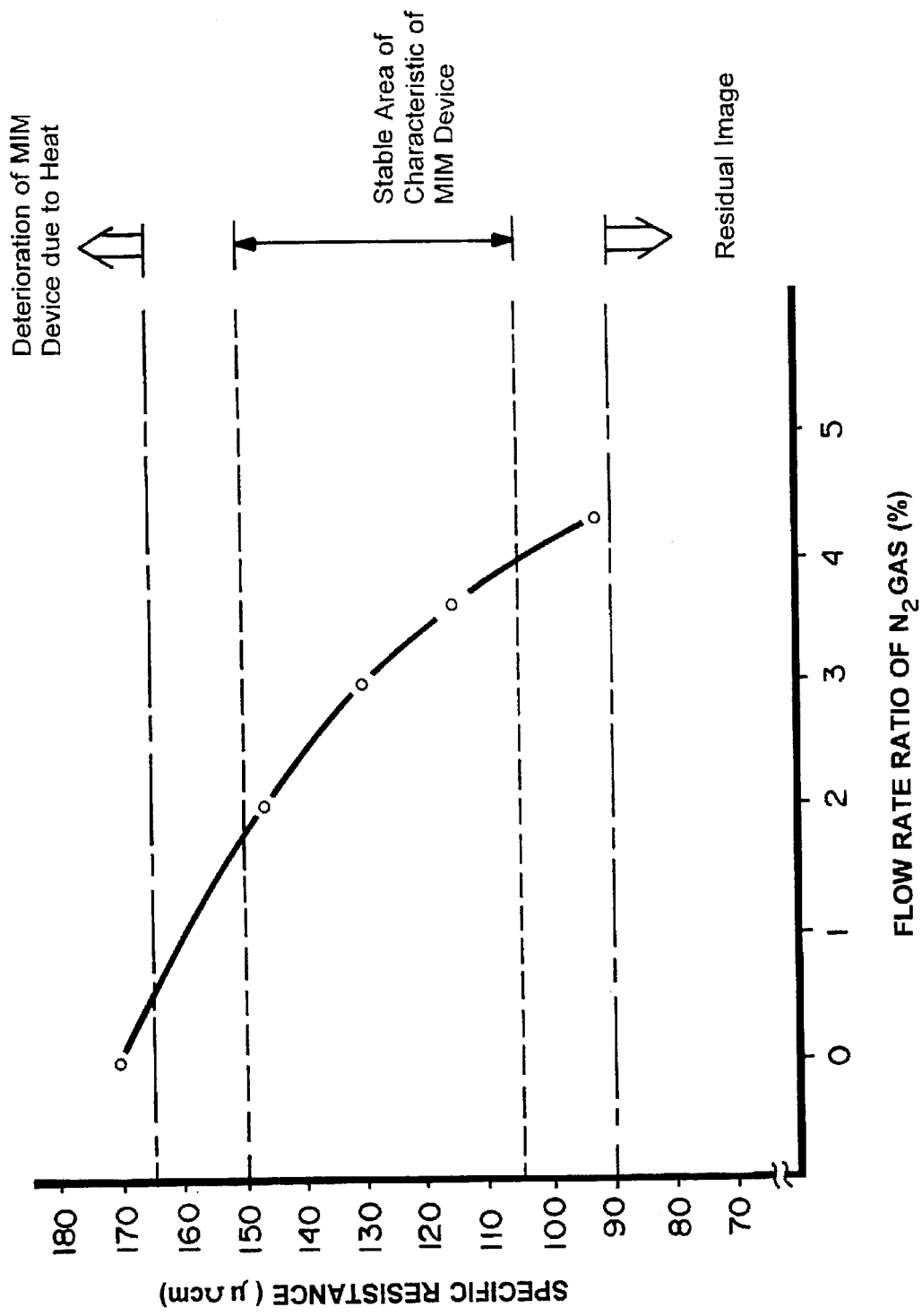
FIG. 30 is a diagram showing the relationship between the flow rate ratio of $N_2$ gas to $(Ar+N_2)$ gas and the specific resistance of a thin Ta film formed by a reactive sputtering using three pieces of Ta target.

FIG. 30 is a diagram showing the relationship between the flow rate ratio of $N_2$ gas and a specific resistance of the thin Ta film formed by the reactive sputtering in an atmosphere of (Ar+$N_2$) gas in the same way as the above. FIG. 30 also shows the relationship between a specific resistance of a thin Ta film and the lighting evaluation of a liquid crystal cell using the MIM devices obtained by using the thin Ta film. As is understood from FIG. 30, a residual image occurs on a display of the liquid crystal display apparatus using the MIM devices when the specific resistance of the thin Ta film is set at 90 μΩcm or less (in this case, a sheet resistivity is 2.73 Ω/□ or less). Further, the nonlinearity of the MIM device is deteriorated by heat when the specific resistance is set at 165 μΩcm or more (sheet resistivity: 5.00 Ω/□ or more). As shown by a broken line in FIG. 30, a stable nonlinearity of the MIM device can be obtained, when the specific resistance is set in the range of 105 μΩcm to 150 μΩcm (sheet resistivity: in the range of 3.18 Ω/□ to 4.55 Ω/□). Accordingly, the deterioration of the nonlinearity caused by heat and the occurrence of the residual image can be prevented by setting the specific resistance in the range of 90 μΩcm to 165 μΩcm (sheet resistivity: in the range of 2.73 Ω/□ to 5.00 Ω/□) and more preferably in the range of 105 μΩcm to 150 μΩcm (sheet resistivity: in the range 3.18 Ω/□ to 4.55 Ω/□). In addition, in the case where the flow rate ratio of $N_2$ gas to (Ar+$N_2$) is 8.3%, the specific resistance of the thin Ta film becomes approximately 82.5 μΩcm (sheet resistivity: 2.48 Ω/□). In this case, the occurrence of the residual image on the display is frequently observed.

In this example, the thin Ta film is deposited by the reactive sputtering using three pieces of target with the purity of 99.99% to form the signal line 61 and lower electrode 62; however, the thin Ta film is deposited by sputtering using sintered TaN as a target. Hereinafter, Modified Example of this example in which the thin Ta film is deposited by using sintered TaN as a target will be described.

The active matrix substrate of Modified Example is fabricated as follows:

First, the base coating insulator 67 is deposited on the glass substrate 66, and a thin Ta film is deposited thereon so as to have a thickness in the range of 3000 to 3500 angstroms. In this case, sintered TaN containing 3 mol %, 5 mol %, 7 mol % and 15 mol % of nitrogen is used as a sputtering target. Only Ar gas is used as sputter gas. Sputtering is conducted in an in-line support apparatus under the conditions that the gas pressure, DC power (the sputtering power for unit area of each target), temperature and the time for heating the substrate, the conveyance rate of the substrate, and each interval between the substrate and the target are 0.4 Pa, 5.3 W/cm$_2$, 100° C., 180 seconds, 100 mm/min and 77 mm, respectively. In this case, the sputtering rate is approximately 300 to 600 angstroms/min.

Figure 31:
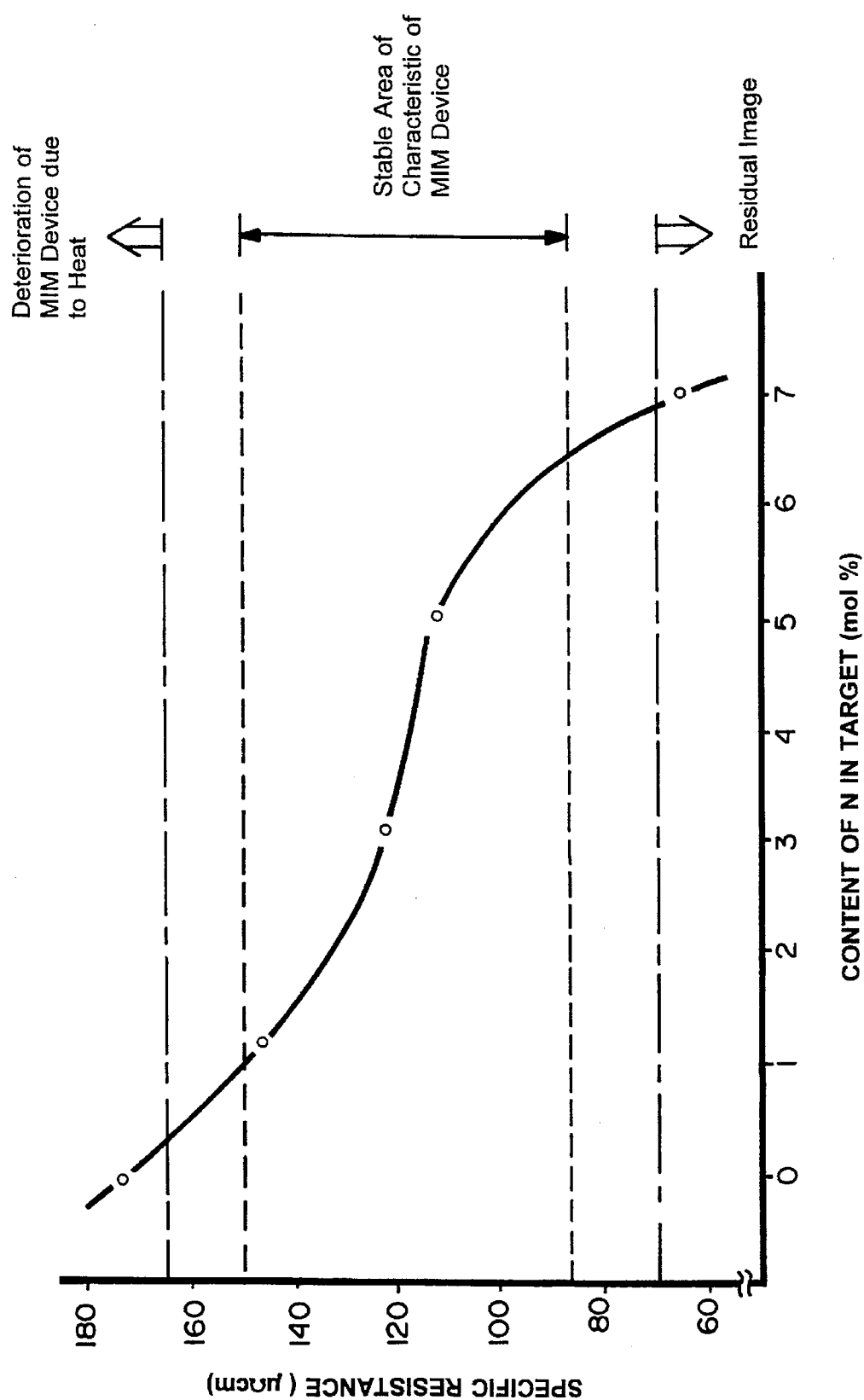
FIG. 31 is a diagram showing the relationship between the amount of nitrogen contained in sintered TaN and the specific resistance of a thin Ta film formed using sintered TaN as a target.

FIG. 31 shows the relationship between a specific resistance of the thin Ta film and the amount of nitrogen contained in sintered TaN as a target, together with the lighting evaluation of the liquid crystal display apparatus using the MIM devices obtained by using the Ta thin film. The amount of nitrogen in sintered TaN is varied at 0 mol %, 3 mol %, 7 mol % and 15 mol %.

As is understood from FIG. 31, a residual image occurs on a display of the liquid crystal display apparatus when the specific resistance of the thin Ta film is set at 70 μΩcm or less (sheet resistivity: 2.12 Ω/□ or less). Further, the deterioration of the nonlinearity of the MIM device caused by heat occurs when the specific resistance is set at 165 μΩcm or more (sheet resistivity: 5.00 Ω/□ or more). As shown by a broken line in FIG. 30, a stable nonlinearity of the MIM device can be obtained when the specific resistance is set in the range of 85 μΩcm to 150 μΩcm (sheet resistivity: in the range of 2.58 Ω/□ to 4.55 Ω/□). Accordingly, the deterioration of the nonlinearity caused by heat and the occurrence of the residual image can be prevented by setting the specific resistance in the range of 70 μΩcm to 165 μΩcm (sheet resistivity: in the range of 2.12 Ω/□ to 5.00 Ω/□) and more preferably in the range of 85 μΩcm to 150 μΩcm (sheet resistivity: 2.58 Ω/□ to 4.55 Ω/□).

As is understood from FIGS. 30 and 31, the specific resistance of the thin Ta film causing the occurrence of the residual image and the deterioration of the nonlinearity of the MIM device due to heat is slightly different between in the case where the reactive sputtering is conducted using $N_2$ gas and in the case where the sputtering is conducted using sintered TaN as a target. This is because the sputtering conditions and the intervals in the Ta lattice of the deposited thin Ta film are slightly different between the two types of sputterings.

In this example and Modified Example thereof, the lower electrodes are formed by the reactive sputtering using $N_2$ gas or by sputtering using sintered TaN as a target; however, the thin Ta film can be formed by the reactive sputtering using sintered TaN as a target in an atmosphere of (Ar+$N_2$) gas.

Figure 32:
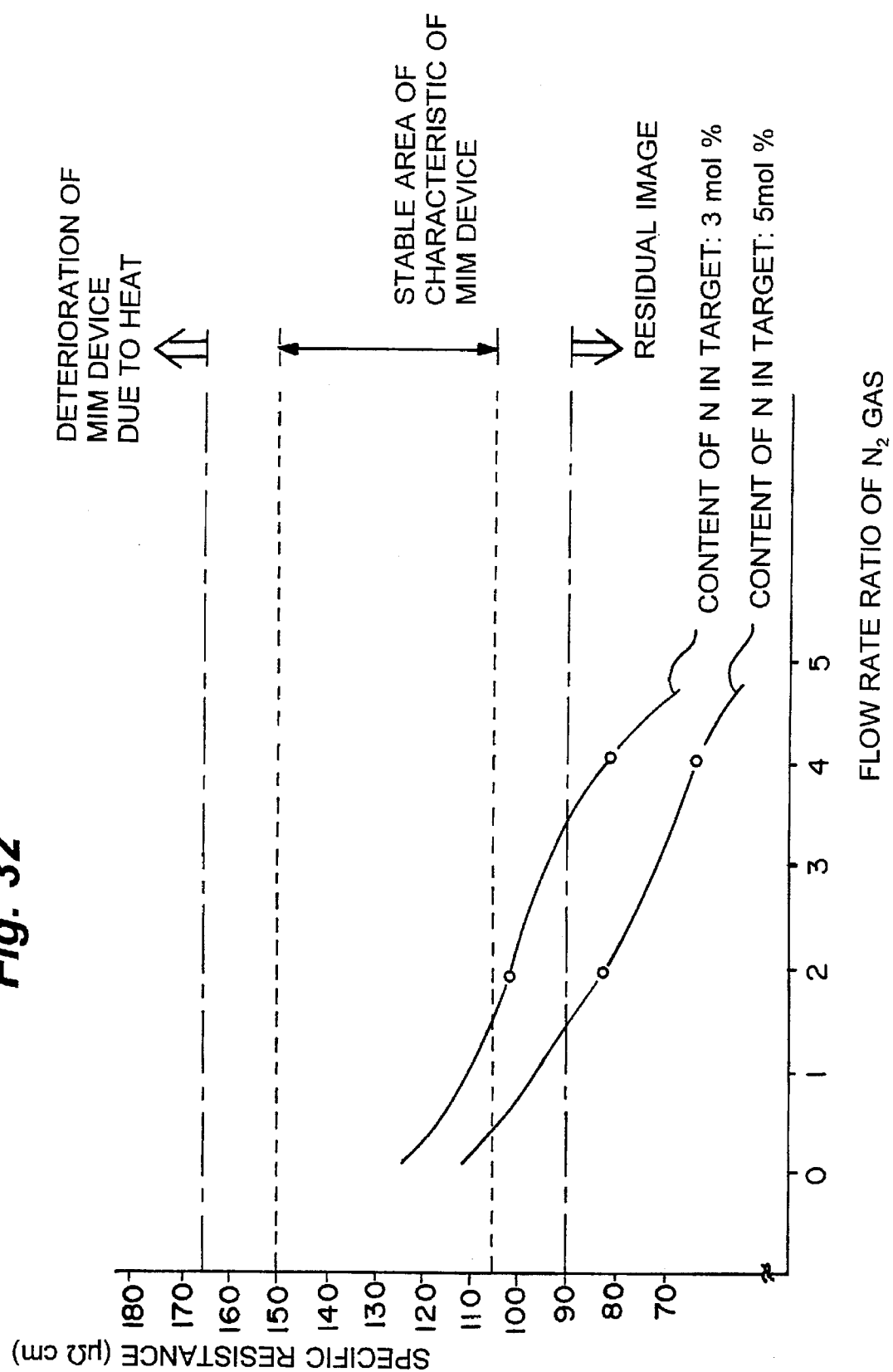
FIG. 32 is a diagram showing the relationship between the flow rate ratio of $N_2$ gas to $(Ar+N_2)$ gas and the specific resistance of a thin Ta film formed by a reactive sputtering using three pieces of Ta target.
Figure 33:
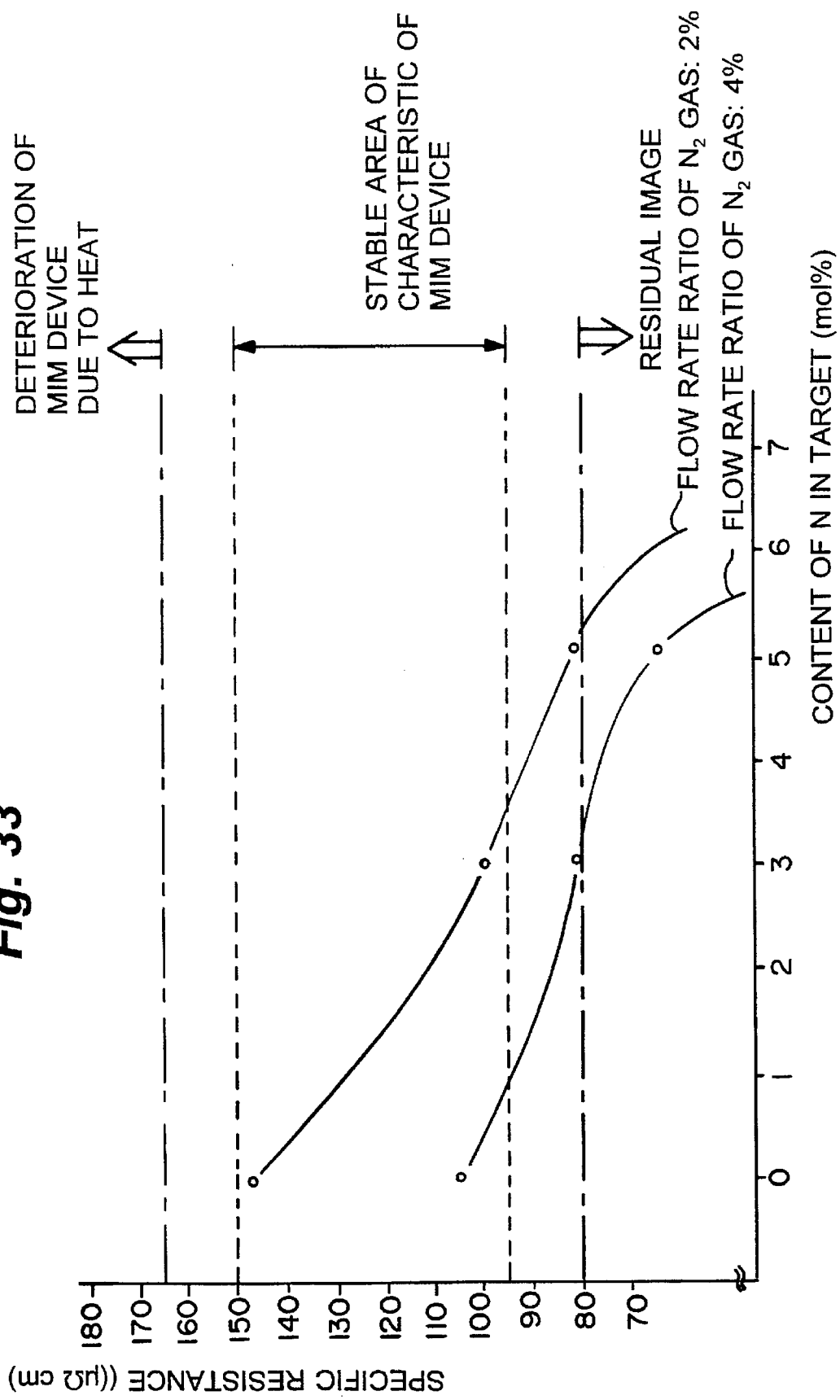
FIG. 33 is a diagram showing the relationship between the amount of nitrogen contained in sintered TaN and the specific resistance of a Ta film formed by a reactive sputtering using sintered TaN as a target.

FIG. 32 shows the relationship between the flow rate ratio of $N_2$ gas to (Ar+$N_2$) gas and the specific resistance of a thin Ta film obtained by the reactive sputtering using sintered TaN as a target in an atmosphere of (Ar+$N_2$) gas. The amount of nitrogen contained in sintered TaN is varied at 3 mol % and 5 mol %. FIG. 33 shows the relationship between the amount of nitrogen contained in sintered TaN and the specific resistance of the thin Ta film formed in the same way as in FIG. 32. In the case of FIG. 33, the flow rate ratio of $N_2$ gas to (Ar+$N_2$) gas is set at 2% and 4%. Further, FIGS. 32 and 33 also show the lighting evaluation of the liquid crystal display apparatus using the MIM devices obtained by using the Ta thin film.

As is understood from FIGS. 32 and 33, in the case of forming the thin Ta film by the reactive sputtering using sintered TaN in an atmosphere of (Ar+$N_2$) gas, it is preferred that the specific resistance of the thin Ta film is set in the range of 80 μΩcm to 165 μΩcm (sheet resistivity: 2.42 Ω/□ to 5.00 Ω/□) in order to prevent the deterioration of the nonlinearity of the MIM device and the occurrence of the residual image. Further, a more stable nonlinearity of the MIM device can be obtained by setting the specific resistance in the range of 95 μΩcm to 150 μΩcm (sheet resistivity: 2.88 Ω/□ to 4.55 Ω/□).

According to this example, when the specific resistance of the lower electrode constituting a two-terminal nonlinear device is set in the above-mentioned range, the occurrence of the residual image can be prevented in a liquid crystal display apparatus using the two-terminal nonlinear device. Further, the thermally deterioration of the nonlinearity of the two-terminal nonlinear device can be prevented.

Further, since a thin Ta film of this example is formed by any one of the reactive sputterings using three pieces of TaN target with a purity of 99.99% as in Example 1, the sputtering using sintered TaN target in Example 2 and the reactive sputtering using TaN target in an atmosphere of (Ar+$N_2$) gas in Example 3, a uniform thin Ta film can be obtained as mentioned in Examples 1 to 3. Accordingly, the thickness of an insulator formed by the anodization of the thin Ta film is also uniform, whereby the unevenness in the nonlinearity among the two-terminal nonlinear devices is greatly decreased. Moreover, an excellent symmetrical curve of a current-voltage characteristic can be obtained by the anodization in 1 wt % of ammonium tartrate. In a liquid crystal display apparatus comprising the MIM devices, a display with high contrast and hihg quality can be obtained without any temperature dependency of the contrast ratio.

In addition, in the above-mentioned examples, Kr (krypton) gas may be used during sputtering, in place of Ar gas.

Figure 44:
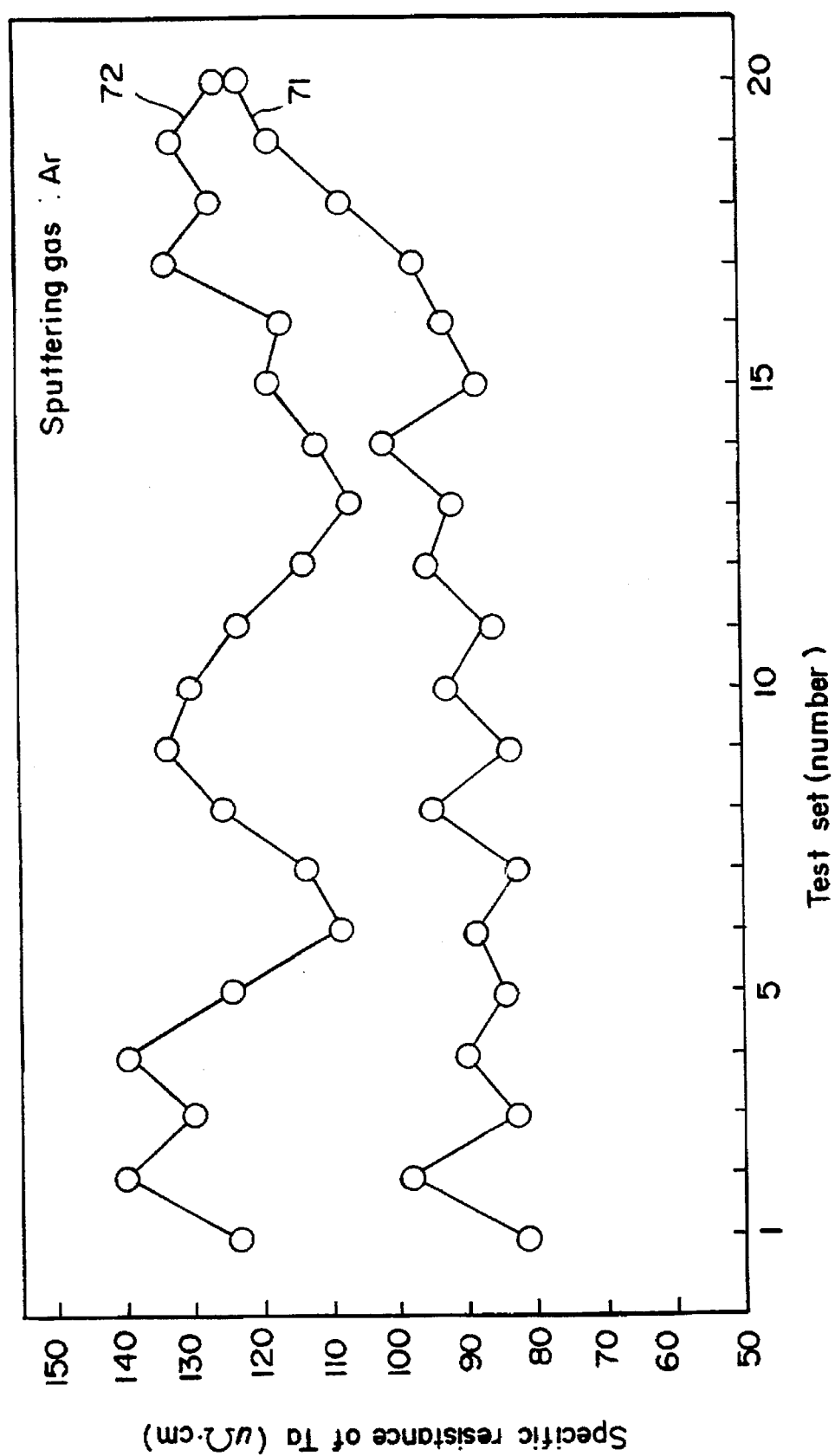
FIG. 44 is a graph illustrating the specific resistance of Ta thin films with respect to the test number when the Ta thin films are deposited in an atmosphere of Ar gas.
Figure 45:
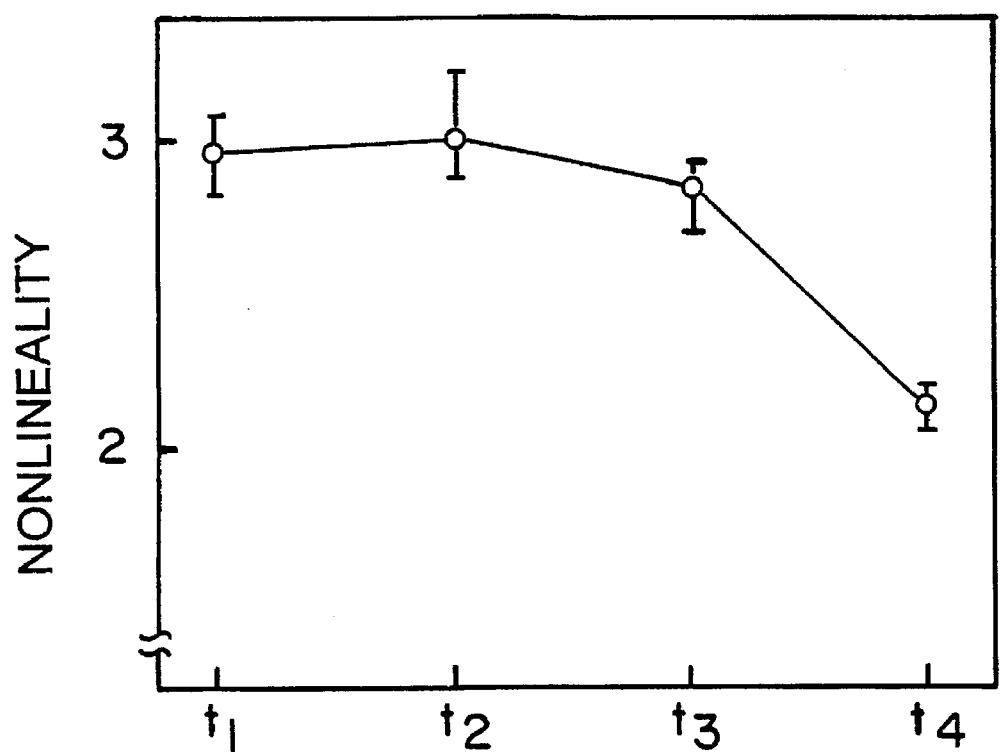
FIG. 45 is a diagram showing the nonlinearity of a conventional MIM device formed by using the β-Ta film, the nonlinearity being shown for each step.

In Example 2, a sintered TaN body is used as the sputtering target, and Ar gas is used as the sputtering gas. However, the inventors of the present invention found that Ta thin films having a satisfactory uniform resistance have not been obtained by using Ar gas. The inventors of the present invention formed Ta thin films by using a sintered TaN body and Ar gas as the sputtering gas and measured the specific resistance of the resultant Ta thin films. FIG. 44 shows the specific resistance of the Ta thin films which were formed on twenty base plates consecutively in one batch. The horizontal axis represents the test number. Curve 71 represents the results of the first batch of Ta thin films formed in the experiment, and curve 72 represents the results of the tenth batch of Ta thin films. Both batches belong to one and the same lot. Even in the same batch (in the respective first and tenth batches), the specific resistances were different test by test. In the first batch and the tenth batch, the values deviated in different manners from each other. As can be understood from such results, when Ar gas is used as the sputtering gas, it is difficult to maintain specific resistance at a certain level due to the influence of the conditions of the sputtering apparatus even if a sintered TaN body is used.

Ta is extremely chemically active in a plasma atmosphere and thus reacts actively with residual gas. Accordingly, deposition of a Ta thin film by sputtering need to be performed in a high vacuum environment. The level of pressure is influenced by the heating state of a heater for heating a base plate on which the Ta thin film will be formed. The specific resistance of the Ta thin film is greatly influenced by the voltage applied to the target, the current flowing through the target, and the amount of residual gas. It is assumed that such parameters influence the specific resistance of the Ta thin film because the influence of the size and the density of crystals of Ta and the residual gas exerted on the specific resistance of the Ta thin film changes in accordance with the conditions of the sputtering apparatus used for thin film formation. Accordingly, the specific resistance of the Ta thin film is influenced by the conditions of the sputtering apparatus, which are, for example, the heating state of the heater, the state of the cryopump and stability of sputtering gas introduction.

EXAMPLE 5

Hereinafter, the fifth example of the present invention, in which the batch-by-batch deviation and the area-by-area deviation of the resistance of the Ta thin films are made very small and thus the uniformity of the resistance of the Ta thin films is improved, will be described. In this specification, "deviation" means the ratio of the difference of each measured value from the average value, the average value obtained by averaging all values.

Figure 34:
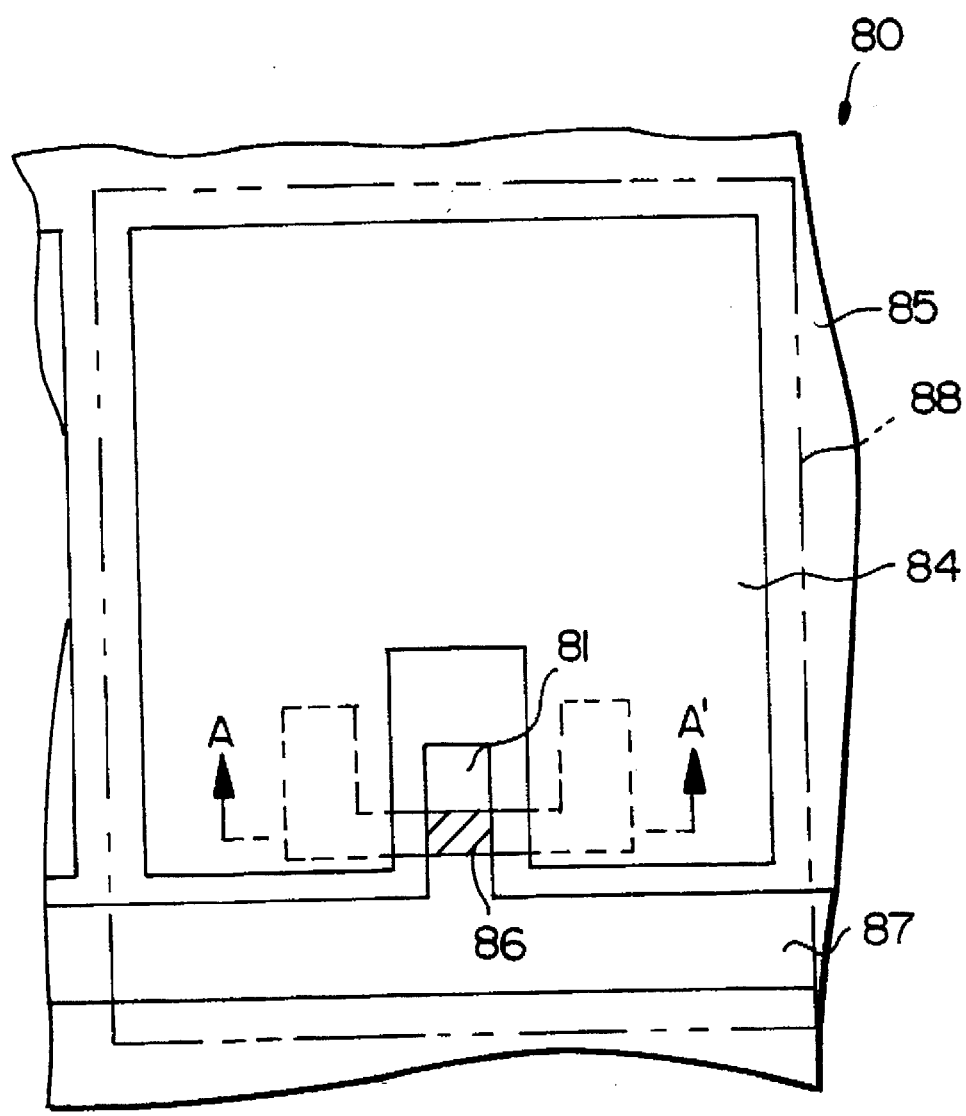
FIG. 34 is a plan view of one pixel area and the vicinity thereof of a liquid crystal display device including an MIM device according to the present invention.
Figure 35:
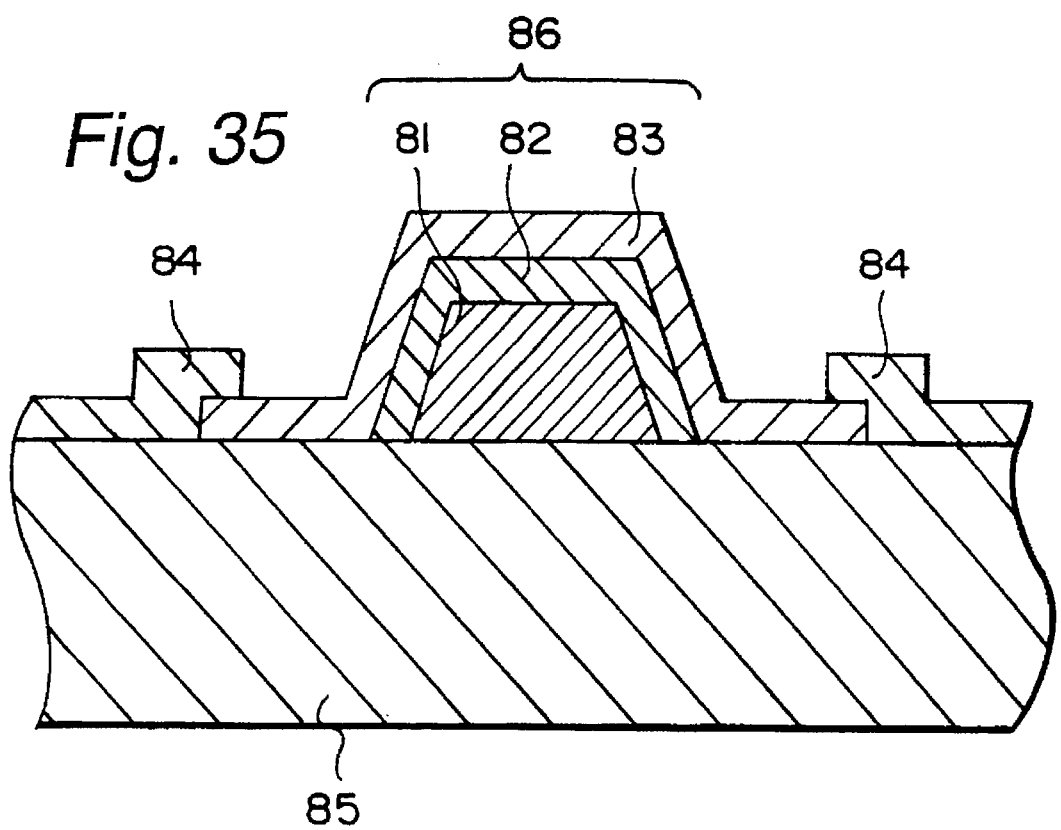
FIG. 35 is a cross-sectional view of an active matrix substrate of the liquid crystal display device shown in FIG. 34 taken along lines A—A' in FIG. 34.

FIG. 34 is a plan view of a liquid crystal display device 80 including a two-terminal nonlinear device as a switching device. In detail, FIG. 34 shows one pixel area enclosed by a two-dot chain line 88 and the vicinity thereof of an active matrix substrate (a lower substrate indicated by reference numeral 91 in FIG. 36). FIG. 35 is a cross sectional view of the lower substrate 91 taken along lines A—A' in FIG. 34.

As is shown in FIGS. 34 and 35, the lower substrate 91 includes a base plate 85. On the base plate 85, a signal line 87 and a lower electrode 81 branched from the signal line 87 both formed of a Ta thin film are located. The signal line 87 and the lower electrode 81 are covered with an insulator 82 formed by anodic oxidation of the signal line 87 and the lower electrode 81. On the insulator 83, an upper electrode 83 formed of Ta, Cr, Ti, Al or the like is located. The lower electrode 81, the insulator 82 and the upper electrode 83 form an MIM device 86. The MIM device 86 is electrically connected to a pixel electrode 84 formed of a transparent conductive film such as an ITO film.

The lower substrate 91 is produced in the following manner.

On the base plate 85, a base coating insulator (indicated by reference numeral 96 in FIG. 36) is formed of $Ta_2O_5$ by sputtering or the like at a thickness of 3,000 angstroms. Although the formation of the base coating insulator may be omitted, such a film prevents a thin film which will be formed thereon or a liquid crystal material from being contaminated by the base plate 85 and thus contributes to better characteristics of the resultant liquid crystal display device 80. In this example, a $BaO$—$Al_2O_3$—$B_2O_3$—$SiO_2$ glass plate such as #7059 Fusion Pilex Glass (manufactured by Corning Japan Co., Ltd.) is used as the base plate 85. Also usable are, for example, a plate having a surface treated in a prescribed manner for formation of an MIM device, for instance, a glass plate formed of quartz, highly silicic acid, borosilicate, soda lime or the like; a plastic plate having a processed surface; a metal plate having an insulator film on a surface thereof; and a ceramic plate. When necessary, the above-mentioned plates may be covered with a film for the purpose of smoothing or protecting the surface thereof, for example, an insulation oxide film formed of $Ta_2O_5$, $SiO_2$ or the like. A plate having a protection film on a surface thereof may also be used.

On the base plate 85 having the base coating insulator thereon, a Ta thin film which will be formed into the lower electrode 81 and the signal line 87 is formed by sputtering. FIG. 23A is a schematic front view of an in-line sputtering apparatus used in this example. In this type of sputtering apparatus, the base plate 85 is transported straight. As is shown in FIG. 23A, the sputtering apparatus includes a sputtering target 52, a tank 53 accommodating sputtering gas, a gas flow rate adjusting valve 53a, and a chamber 54 in which the base plate 85 is movable in the direction of arrow.

Sputtering is performed in the following manner.

The base plate 85 is set in the chamber 54, and the inner pressure of the chamber 54 is decreased down to $1.0 \times 10^{-4}$ Pa or less by absorption.

Next, Kr gas is introduced into the chamber 54 at a constant rate in the range of 100 to 200 SCCM while the base plate 85 is heated at a constant temperature in the range of 140° to 180° C. As the sputtering target 52, a sintered TaN body containing nitrogen at a ratio of 4 to 5 mol % is used. The distance between the base plate 85 and the target 52 is 50 to 100 mm, and the base plate 85 is transported at a rate of 160 to 460 mm/min.

Then, pre-sputtering is performed at an input power density of 3.0 W/cm$^2$ or more. The above-mentioned input power density is the density of the power applied to the target 52 in the sputtering apparatus. Thereafter, the input power density is set at 7.0 W/cm$^2$ or more, and Kr gas is sputtered in order to form a Ta thin film.

When a preferable thickness of the Ta thin film is obtained, supply of the power is stopped. Simultaneously, introduction of the gas to the chamber 54 is stopped. The base plate 85 is cooled for a prescribed time period, and then is taken out of the chamber 54. In this manner, a Ta thin film is formed on the base plate 85.

Instead of the in-line sputtering apparatus shown in FIG. 23A, a rotary sputtering apparatus shown in FIG. 23B may also be used. In this type of sputtering apparatus, the base plate 85 is rotated in the direction of arrow. Sputtering is performed under the conditions of: a sputtering pressure of $7 \times 10^{-2}$ to $10 \times 10^{-1}$ Pa, an input power density of 5.0 W/cm$^2$, a heating temperature of the base plate 85 of 240° C., a rotating rate of the base plate 85 of 160 sec./rotation, and a distance between the base plate 85 and the target 52 of 200 mm. In FIG. 23B, four targets are located inside an area where the base plate 85 is rotated and four more targets are located outside such an area. Alternatively, the targets may be located only inside or only outside such an area. Any number of targets may be used.

The Ta thin film formed in this manner is patterned as is prescribed by photolithography to form the lower electrode 81 and the signal line 87.

Thereafter, a surface of the lower electrode 81 and a surface of the signal line 87 are anodized in a 1% solution of ammonium tartrate as an electrolyte except for an area used a terminal which will be connected to an external driving circuit. In this way, the insulator 82 is formed. In this example, anodic oxidation is performed under the conditions of: a temperature of the electrolyte of approximately 25° C., a voltage of approximately 31 V, and a current of 10 to 70 mA. The resultant insulator 82 of TaO$_x$ has a thickness of 600 angstroms.

The entire surface of the base plate 85 having the above-described elements thereon is covered with a metal thin film by sputtering or the like at a thickness of, for example, 4,000 angstroms. The metal thin film is patterned as is prescribed by photolithography to form the upper electrode 83. The upper electrode 83 is generally formed of Ta, Cr, Ti, Al or the like. Ti is used in this example.

On the base plate 85 having the above-described elements, a transparent conductive film such as an ITO film is formed and patterned to form the pixel electrode 84. In this way, formation of the lower substrate 91 is completed.

Figure 36:
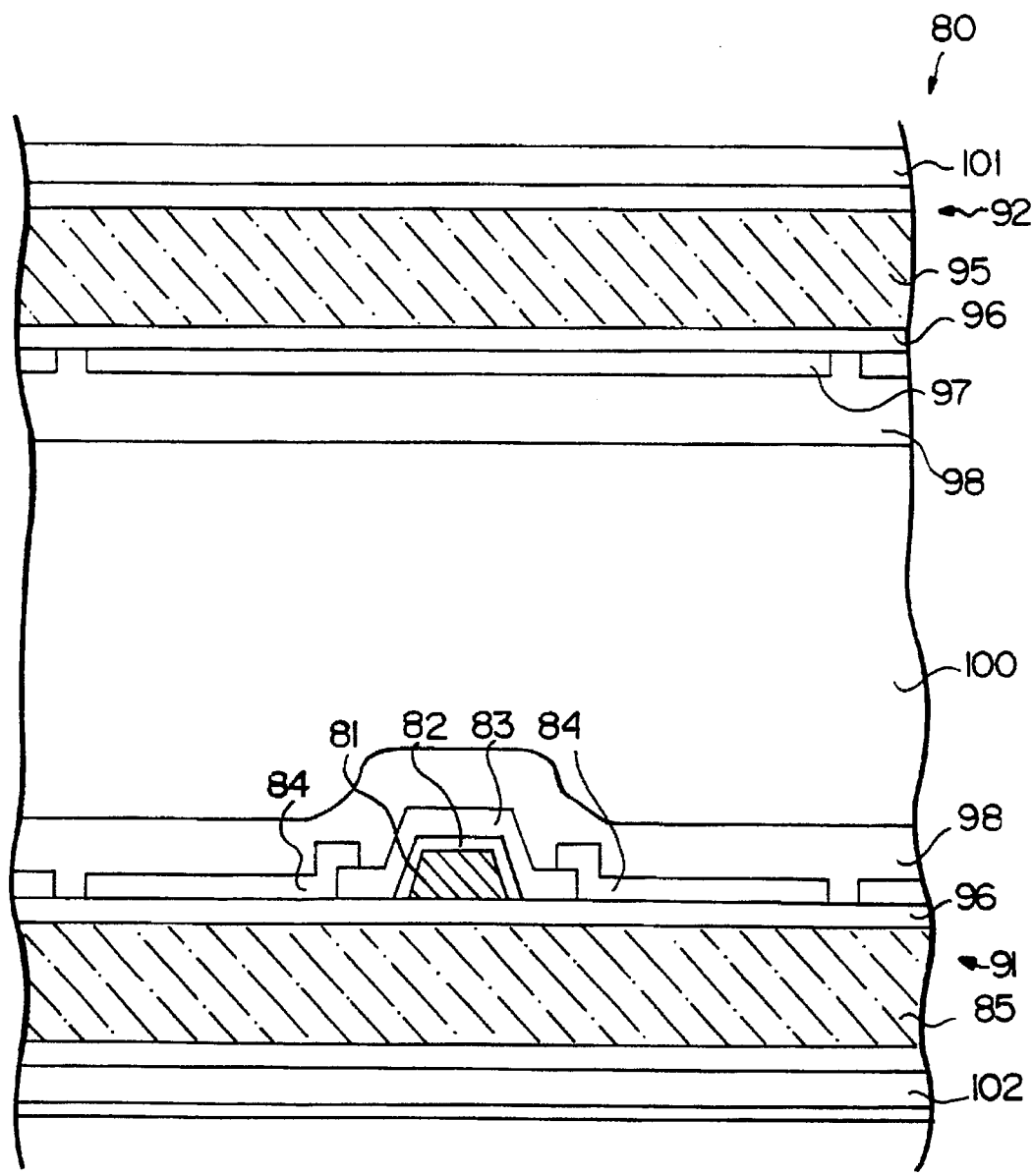
FIG. 36 is a cross sectional view of the liquid crystal display device shown in FIG. 34.

FIG. 36 shows a cross sectional view of the liquid crystal display device 80 including a counter substrate (an upper substrate) 92 and the lower substrate 91. The counter substrate 92 is formed in the following manner.

On a base plate 95, a base coating insulator 96 is formed. A counter electrode 97 is formed of a transparent conductive film such as an ITO film is provided in stripes on the base coating insulator 96 in such a manner as to be perpendicular to the signal line 87 located on the lower substrate 91. In this example, the counter electrode 97 has a thickness of 1,000 angstroms. If a color filter layer is also formed, color display is realized in the resultant liquid crystal display device.

The lower substrate 91 and the upper substrate 92 are assembled to form a liquid crystal cell in the following manner.

Orientation films 98 are formed on a surface of the lower substrate 91 having the signal line 87 and a surface of the upper substrate 92 having the counter electrode 97 at a temperature of approximately 200° C. Next, the orientation films 98 are rubbed.

A sealing material is applied to one of the substrates 91 and 92, and spacers are scattered on the other substrate. The substrates 91 and 92 are assembled together in the state where the orientation films 98 are opposed to each other in such a relative direction that molecules of the liquid crystal material which will be injected therebetween will be twisted at 90 degrees. Then, the substrates 91 and 92 are fixed to each other by heat and pressure. The temperature for this process is approximately 150° to 200° C.

The liquid crystal material is injected between the two substrates 91 and 92 through an injection opening to form a liquid crystal layer 100, and the injection opening is sealed. In this way, the liquid crystal cell is produced.

A transmission type liquid crystal display device is produced by interposing the liquid crystal cell obtained in the above-described manner between two light-transmissive polarizing plates 101. The liquid crystal display device 80 illustrated in FIG. 36 is a reflection type liquid crystal display device which is produced by interposing the above-described liquid crystal cell between a light-transmissive polarizing plate 101 and another polarizing plate 102 provided with a reflective plate formed of Al or Ag (silver).

Figure 37:
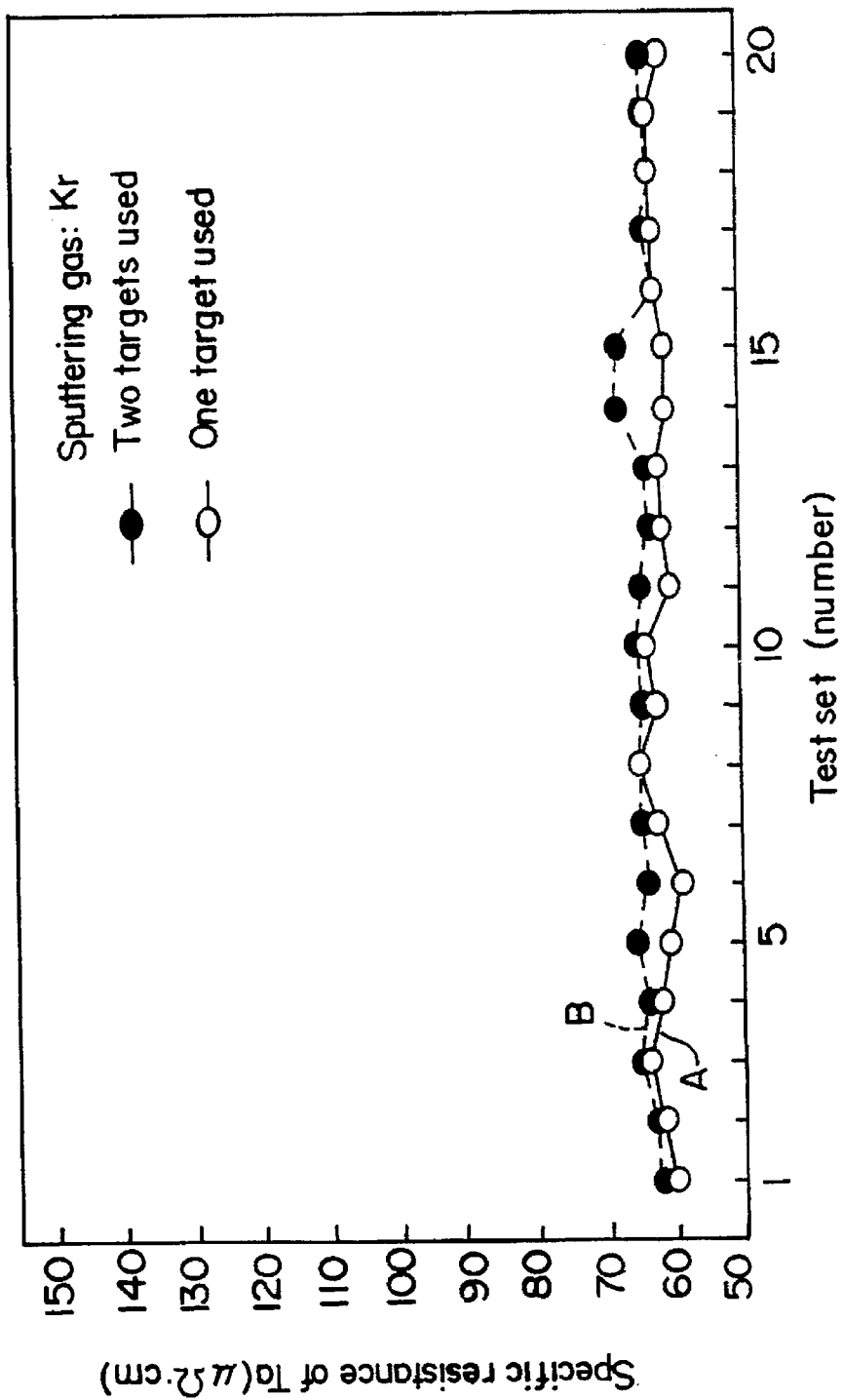
FIG. 37 is a graph illustrating the specific resistance of Ta thin films with respect to the test number when Kr gas is used as sputtering gas.

FIG. 37 is a graph illustrating the specific resistance of Ta thin films obtained in two batches. In one batch, the Ta thin films were formed on twenty base plates consecutively in the sputtering apparatus shown in FIG. 23A. The horizontal axis represents the test number. Curve 103 represents the results of the first batch of Ta thin films when one sintered TaN body containing nitrogen at a ratio of 4.5 mol % was used as a sputtering target. The average specific resistance of the Ta thin films was 60.9 µΩcm. The deviation of the specific resistances with respect to the average value was ±4.5%. The uniformity of the Ta thin films is sufficiently high. As is described above, "deviation" means the ratio of the difference of each measured value from the average value in this specification.

Curve 104B represents the results of the tenth batch of Ta thin films when two sintered TaN bodies each containing nitrogen at a ratio of 4.5 mol % were used as the sputtering targets. The average specific resistance of the Ta thin films was 63.3 µΩcm. The deviation of the specific resistances with respect to the average value was ±4.6%. The uniformity of the Ta thin films is also sufficiently high, as in the case of the first batch.

Briefly returning to FIG. 44 for comparison with the related art using Ar gas as the sputtering gas. The conditions for thin film formation resulting in the values shown in FIGS. 37 and 44 were the same except for the type of sputtering gas. In FIG. 44, curve 71 represents the results obtained in the first batch and curve 72 represents the results obtained in the tenth batch. In both cases, one sintered TaN body containing nitrogen at a ratio of 4.5 mol % was used as the sputtering target.

In the first batch (curve 71), the average specific resistance was 94.2 µΩcm, and the deviation of the specific resistances with respect to the average value was ±29.7%. In the tenth batch (curve 72), the average specific resistance was 124.0 µΩcm, and the deviation of the specific resistances with respect to the average value was ±13.9%. As is appreciated from such comparison, when Ar gas is used as the sputtering gas, the deviation of the specific resistances of the Ta thin films is much higher than the results obtained when Kr gas is used.

Table 6 shows the area-by-area deviation of the specific resistances of a Ta thin film in one and the same liquid crystal cell produced in this example. (a) shows the results obtained when Kr gas was used, and (b) shows the results obtained when Ar gas was used. In both cases, the specific resistance was measured at 25 points on the base plate, and the deviation was calculated with respect to the average value of the 25 values. As the sputtering target, one sintered TaN body containing nitrogen at a ratio of 4.5 mol % was used in both cases. The size of the base plate was 320 mm×400 mm, and the size of the sintered TaN body was 127 mm×410 mm.

TABLE 6

| (a) Kr gas used | (b) Ar gas used |
|---|---|
| ⊚ ⊚ ⊚ ⊚ ⊚ | ⊚ ⊚ ⊘ ▲ ⊘ |
| ⊚ ⊚ ⊚ ⊚ ⊚ | ▲ ▲ ▲ ▲ ▲ |
| ⊚ ⊚ ⊚ ⊚ ⊚ | ▲ ▲ ▲ ▲ ▲ |
| ⊚ ⊚ ⊚ ⊚ ⊚ | △ ⊚ ⊚ ⊘ ⊚ |
| ⊚ ⊚ ⊚ ⊚ ⊚ | △ △ △ △ △ |

▲ ... Deviation with respect to average Value ~ −10%
⊘ ... Deviation with respect to average Value −10% ~ −5%
⊚ ... Deviation with respect to average Value −5% ~ 5%
○ ... Deviation with respect to average Value 5% ~ 10%
△ ... Deviation with respect to average Value 10% ~

When Kr gas was used, the deviation of the specific resistances with respect to the average value was −4.3% to +4.4%, and the standard deviation σ was 0.024. When Ar gas was used, the deviation of the specific resistances with respect to the average value was −35% to +75%, and the standard deviation σ was 0.912. From these results, use of Kr gas as the sputtering gas is highly effective in restricting the deviation with respect to the average value within ±5% (standard deviation σ=0.1 or less).

14-size liquid crystal panels each having a diagonal line length of 35.6 cm were produced in the same manner as described above. The deviation of the specific resistances with respect to the average value was ±4.4% or less in each panel. 4.7-size liquid crystal panels each having a diagonal line length of 11.9 cm were also produced in the same manner as described above. The deviation of the specific resistances with respect to the average value was ±4.2% or less in each panel. In both cases, the standard deviation σ was 0.1 or less and thus the display quality was satisfactory.

From the above description, the uniformity of the Ta thin films produced using Kr gas is much higher than that of the Ta thin films produced using Ar gas.

Figure 38:
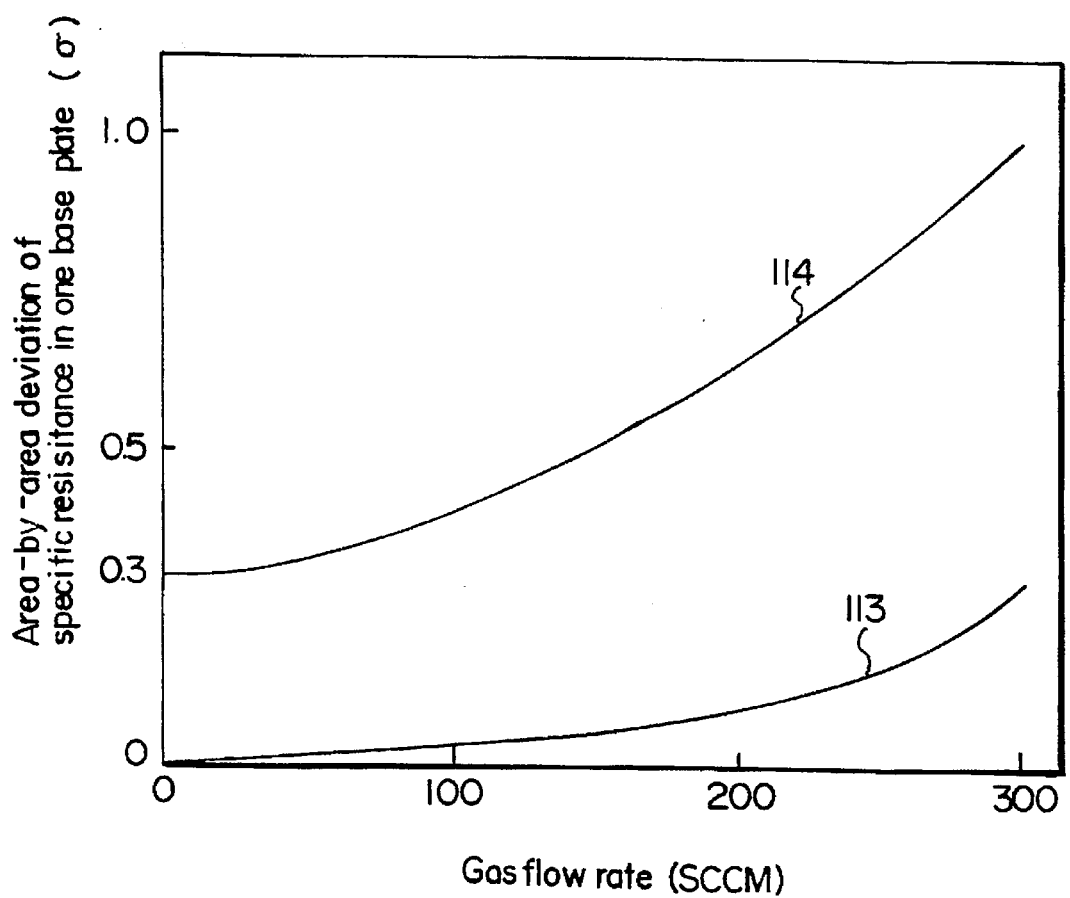
FIG. 38 is a graph illustrating the specific resistance of Ta thin films produced using Kr gas as sputtering gas and Ta thin films produced using Ar gas as the sputtering gas by a function of the flow rate of the sputtering gas.

The inventors of the present invention have confirmed that the area-by-area deviation of the specific resistances of a Ta thin film in one and the same liquid crystal cell is influenced by the flow rate of the sputtering gas. FIG. 38 is a graph illustrating such area-by-area deviation of the specific resistances by a function of the gas flow rate. Curve 113 represents the results obtained when Kr gas was used, and curve 114 represents the results obtained when Ar gas was used.

As is appreciated from FIG. 38, the area-by-area deviation tends to increase as the gas flow rate increases in either case. However, curve 113 (Kr gas) rises more slowly than curve 114 (Ar gas). Use of Kr gas reduces the area-by-area deviation by 40 to 95% compared to the case when Ar gas is used. Kr gas is preferably introduced at a flow rate of 30 to 300 SCCM. If the flow rate is lower than 30 SCCM, no discharge occurs and thus sputtering is impossible. If the flow rate is higher than 300 SCCM, the area-by-area deviation of the specific resistances in one, and the same cell becomes 0.3 or more, which adversely affects the display quality. More preferably, Kr gas is introduced at a flow rate of 100 to 200 SCCM. With a flow rate within such a range, the display quality is satisfactory even in a large panel such as a 14-size panel (diagonal line length: 35.6 cm). The gas flow rate is adjusted by the gas flow rate adjusting value 53a shown in FIG. 23A.

Figure 39:
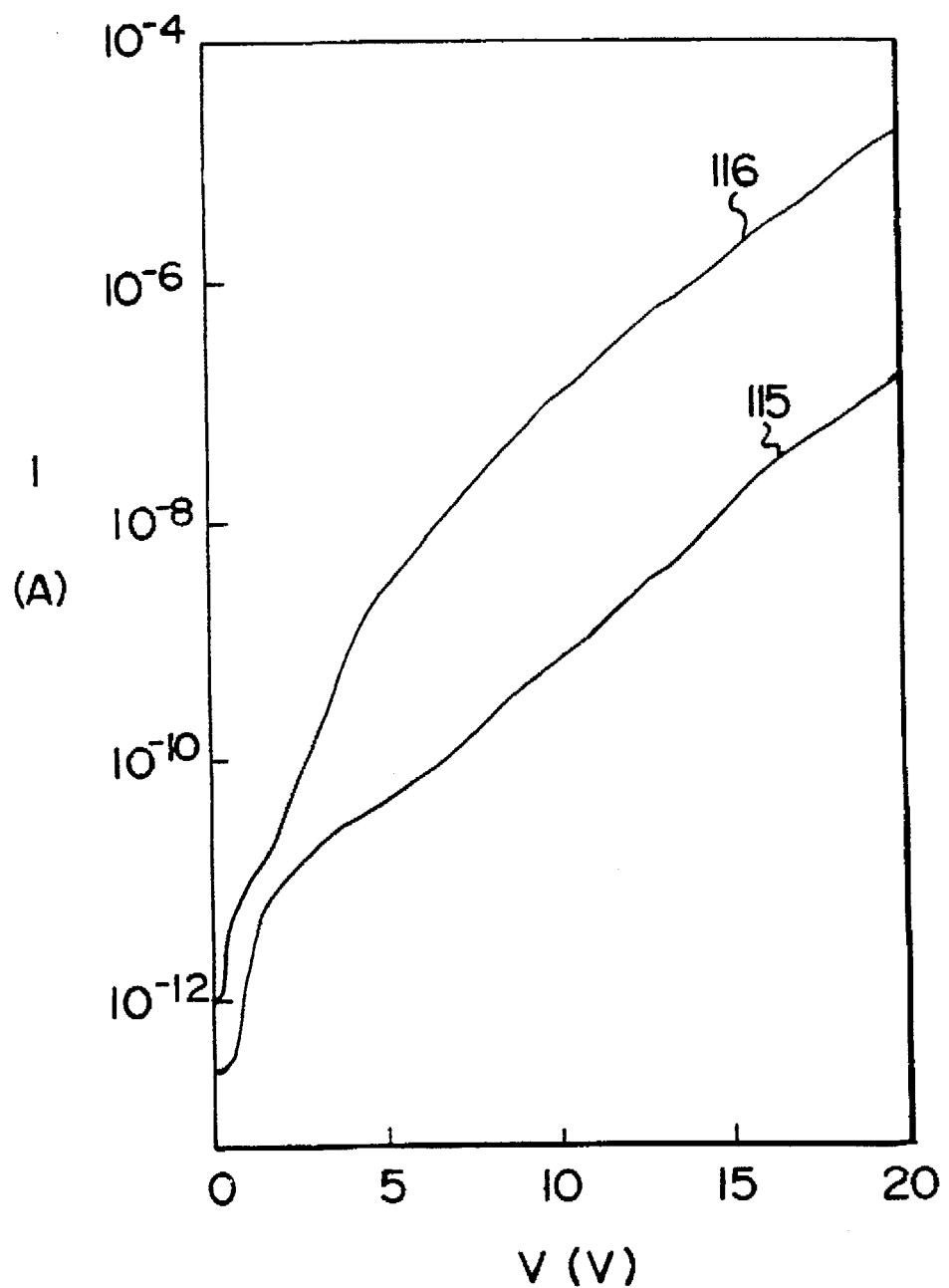
FIG. 39 is a graph illustrating the current-voltage characteristic of MIM devices produced using Kr gas as sputtering gas and MIM devices produced using Ar gas as the sputtering gas.

FIG. 39 shows the nonlinearity of the current vs. voltage characteristic of an MIM device in a liquid crystal display device. Curve 115 represents the results obtained when Kr gas is used, and curve 116 represents the results obtained when Ar gas is used.

In an MIM device, the current flowing between a lower electrode and an upper electrode is expressed in accordance with the Poole-Frenkel current indicated by above-mentioned equation (1).

Based on curves 115 and 116 in FIG. 39, coefficients B and lnA are obtained by the Poole-Frenkel plot ($\sqrt{V}$ vs ln (I/V)). In curve 115 (Kr gas), B=3.1 and lnA=−32.6. In curve 116 (Ar gas), B=3.1 and lnA=−27.9. From these results, the MIM device having a Ta thin film produced using Kr gas is equal to or higher than the MIM device having a Ta thin film produced using Ar gas in electric conductivity and nonlinearity.

Figure 40:
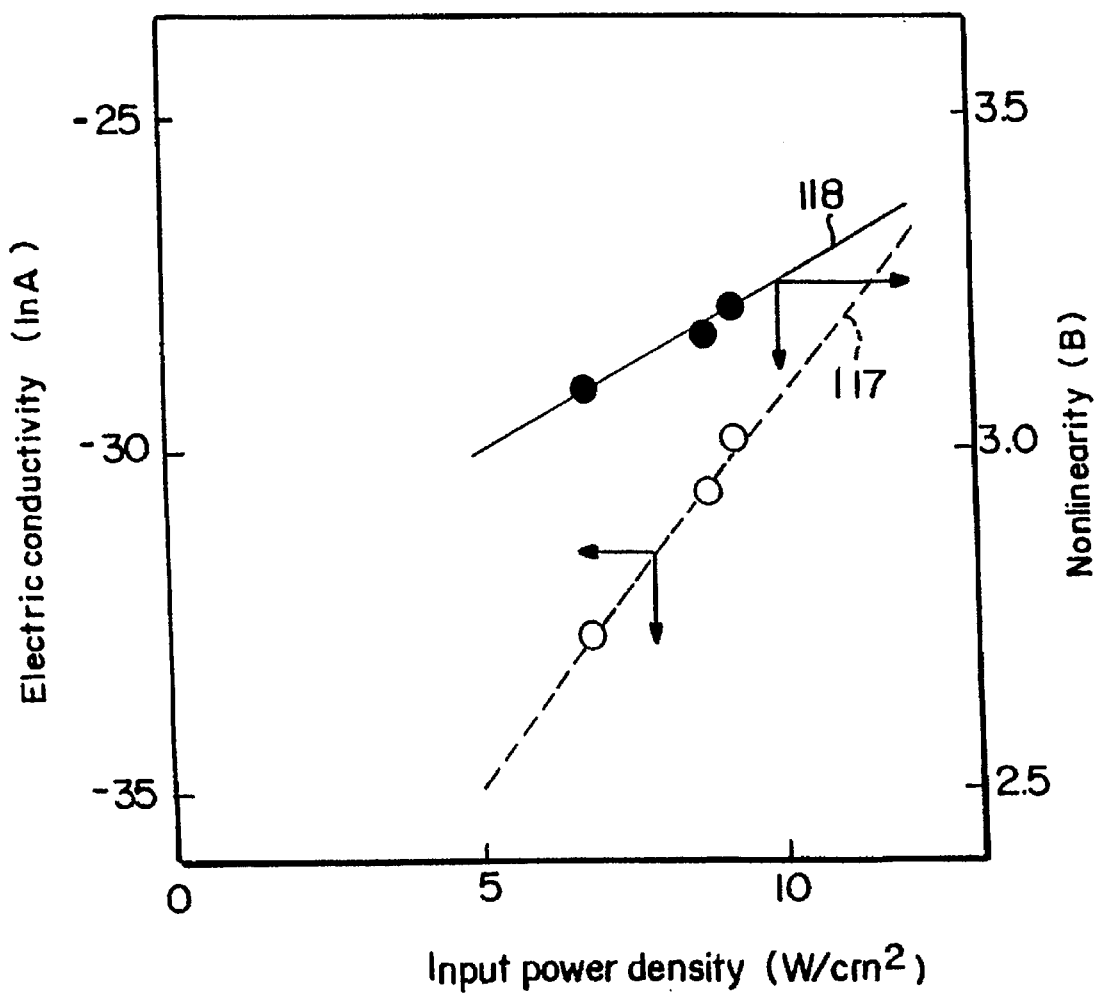
FIG. 40 is a graph illustrating the relationship among the electric conductivity, the nonlinearity and the input power density of MIM devices produced using Kr gas as sputtering gas.

FIG. 40 is a graph illustrating the Poole-Frenkel characteristic of an MIM device with respect to the input power density applied to the sputtering target in the formation of the Ta thin film. Line 117 represents the nonlinearity B, and line 118 represents the electric conductivity lnA with respect to the input power density.

As is appreciated from FIG. 40, the electric conductivity and the nonlinearity of the MIM device changes in accordance with the input power density. This is assumed to occur for the following reason: when the input power density increases to enhance the sputtering rate, the inter-lattice distance of Ta is increased during the thin film formation and thus free electrons move more easily, thus causing the current to flow more easily. Another conceivable reason is: increase in the input power density slightly reduces the amount of nitrogen doped into Ta and thus slightly decreases the impurity level, which lowers the energy barrier, resulting in an increase in the electric conductivity and the nonlinearity.

In general, an MIM device having lnA of −35 to −27.5 shows satisfactory characteristics. From FIG. 40, an input power density of 5.0 to 11.5 W/cm² fulfills such a range of lnA and is preferable. If the input power density is lower than 5.0 W/cm², lnA is too small to cause discharge although charging occurs. Therefore, the rectification function is sufficient to cause the current to flow in one direction as in a capacitor. If the input power density is higher than 11.5 W/cm², the load applied on the sputtering target is sufficiently large to break the target easily. More preferably, the input power density is 7.0 to 10.0 W/cm² because the corresponding range of lnA is −32 to −28, and such a range provides highly satisfactory characteristics of the MIM device.

Figure 41:
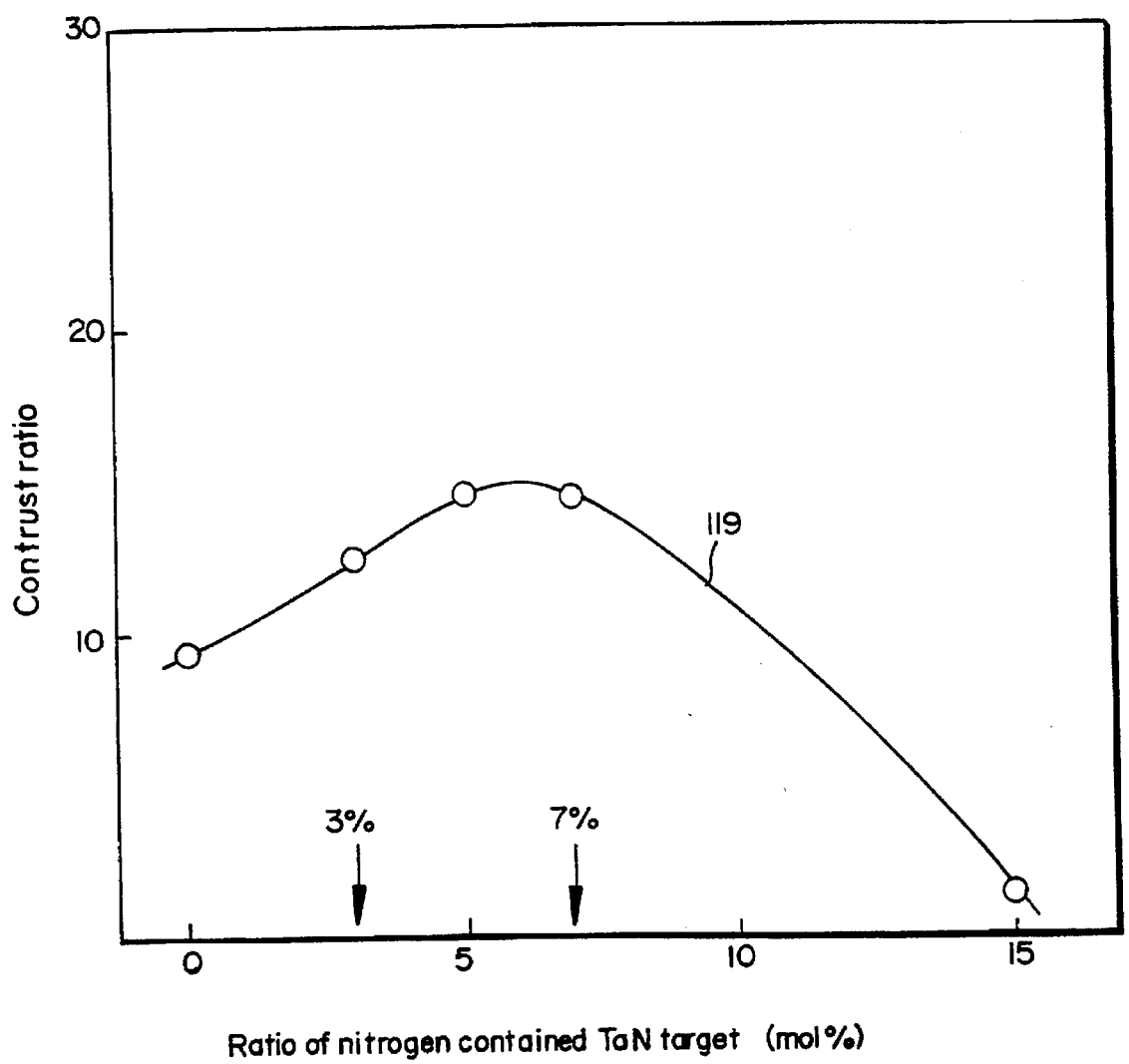
FIG. 41 is a graph illustrating the contrast ratio of a liquid crystal display device including an MIM device having Ta thin films produced using a sintered TaN body as a sputtering target by a function of the ratio of nitrogen contained in the sintered TaN body.

FIG. 41 is a graph illustrating the contrast ratio of a liquid crystal display device with respect to the ratio of nitrogen contained in a sintered TaN body used as a sputtering target.

As is appreciated from FIG. 41, a high contrast ratio is obtained when nitrogen is contained at a ratio of 3 to 7 mol %. If the ratio is lower than 3 mol %, the characteristics of the resultant Ta thin film are close to those of a β-Ta thin film. Therefore, the characteristics of the Ta thin film change by heat which is used during the cell production. As a result, the characteristics of the MIM device such as the nonlinearity deteriorate. If the ratio is higher than 7 mol %, the energy barrier is too high at the interface between a lower electrode and an insulator to be leaky, which also deteriorates the characteristics of the MIM device.

Figure 42:
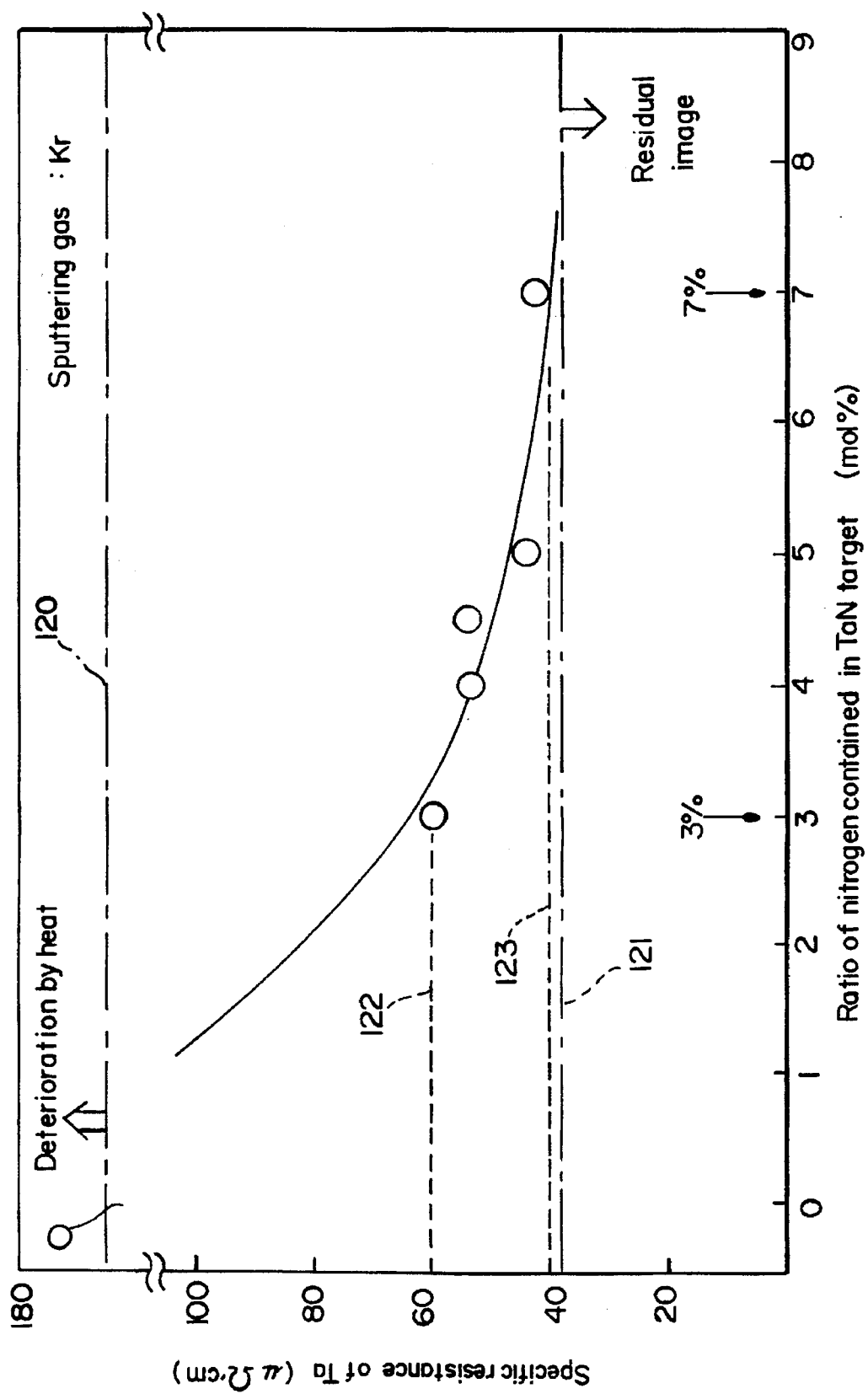
FIG. 42 is a graph illustrating the specific resistance of Ta thin films produced using Kr gas as sputtering gas by a function of the ratio of nitrogen contained in a sintered TaN body used as a sputtering target.

FIG. 42 is a graph illustrating the specific resistance of a Ta thin film produced using Kr gas as sputtering gas by a function of the ratio of nitrogen contained in a sintered TaN body used as a sputtering target. The specific resistance was measured when the ratio of nitrogen was 0 mol %, 3 mol %, 4 mol %, 4.5 mol %, 5 mol % and 7 mol %.

The deterioration of the MIM device by heat caused when the liquid crystal display device is turned on and generation of residual images can be prevented by maintaining the specific resistance of the Ta thin film used as the lower electrode in the range of 40 μΩcm to 165 μΩcm (between chain lines 120 and 121 in FIG. 42). More stable characteristics of the MIM device can be realized by maintaining the specific resistance in the range of 40 μΩcm to 60 μΩcm (between dashed lines 122 and 123 in FIG. 42). From FIG. 42, such a range of specific resistance is stably realized by using a sintered TaN body containing nitrogen at a ratio of 4 to 5 mol %.

Figure 43:
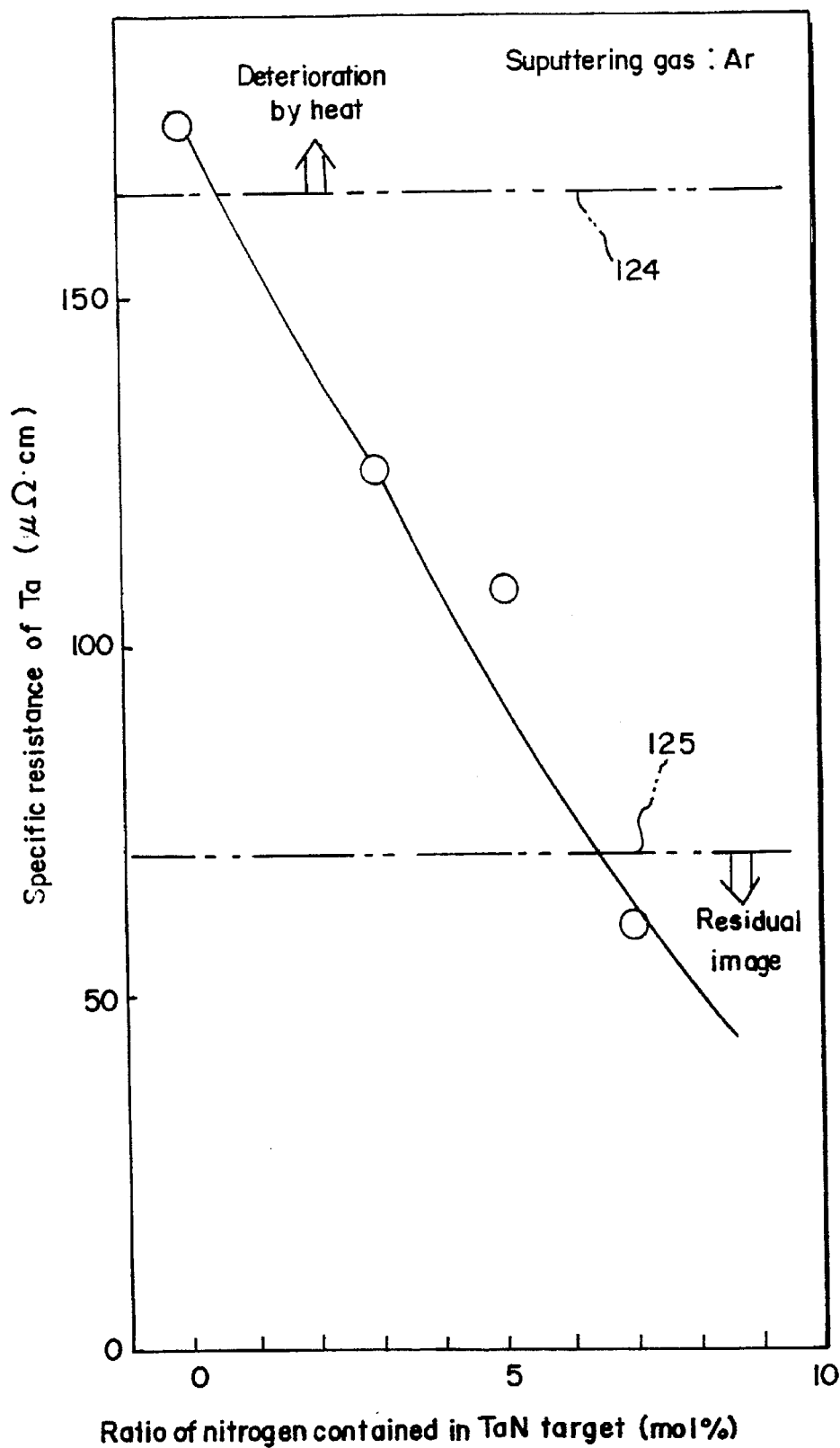
FIG. 43 is a graph illustrating the specific resistance of Ta thin films produced using Ar gas as sputtering gas by a function of the ratio of nitrogen contained in a sintered TaN body used as a sputtering target.

FIG. 43 is a graph illustrating the specific resistance of a Ta thin film produced using Ar gas as sputtering gas by a function of the ratio of nitrogen contained in a sintered TaN body used as a sputtering target. The specific resistance was measured when the ratio of nitrogen was 0 mol %, 3 mol %, 5 mol % and 7 mol %. FIG. 43 is presented for the purpose of comparison between the present invention and the related art.

The deterioration of the MIM device by heat caused when the liquid crystal display device is turned on and generation of residual images can be prevented by maintaining the specific resistance of the Ta thin film used as the lower electrode in the range of 70 μΩcm to 165 μΩcm (between two-dot chain lines 124 and 125 in FIG. 43). However, the lowest possible specific resistance for preventing generation of residual images is as high as 70 μΩcm. Due to such a high resistance, if the width of the signal line is reduced in order to increase the aperture ratio and enhance the precision of the liquid crystal display device, the resistance of the signal line becomes too high to provide the liquid crystal display device with satisfactory performance.

From the above description, it is appreciated that use of Kr gas as the sputtering gas realizes more stable and uniform Ta thin film formation compared to the use of Ar gas, and further prevents generation of residual images even in a large and highly precise liquid crystal display device. Accordingly, use of Kr gas is preferable in obtaining satisfactory display.

As is appreciated from the above description, the lower electrode of the MIM device is formed by sputtering using a sintered TaN body as a sputtering target and using an inert gas of a 0-group element having an atomic weight which is equal to or higher than the atomic weight of Kr as sputtering gas. Due to use of the sintered TaN body as the sputtering target, the amount of nitrogen contained in the Ta thin film used as the lower electrode is uniform. The 0-group element having an atomic weight which is equal to or higher than that of Kr has ion energy higher than that of Ar. Accordingly, gas of such an element has a high sputtering ratio and thus can be sputtered at a high sputtering rate. Due to such a high sputtering rate, the influence of the conditions of the sputtering apparatus on thin film formation is alleviated. As a result, Ta thin films formed using such gas as the sputtering gas are uniform with very small batch-by-batch deviation. The area-by-area deviation in one Ta thin film is also very small. In this specification, "deviation" means the ratio of the difference of each measured value from the average value.

The sputtering rate can also be increased by raising the input power density applied to the sputtering target. However, the inventors of the present invention have found that such a rise in the input power density results in a rise in the specific resistance of the Ta thin film. By using sputtering gas of a 0-group element having an atomic weight which is equal to or higher than that of Kr, the sputtering rate can be increased without raising the input power density.

When a two-terminal nonlinear device is used as the switching device of a liquid crystal display device, the contrast ratio of the liquid crystal display device can be increased by using a sintered TaN body containing nitrogen at a ratio of 3 to 7 mol % as a sputtering target. By introducing Kr gas at a flow rate of 30 to 300 SCCM for sputtering, the area-by-area deviation of the specific resistances of the Ta thin film in one and the same cell can be reduced to a level lower than that of the Ta thin film on the plate obtained using Ar gas as the sputtering gas. Especially when the flow rate of the sputtering gas is 100 to 200 SCCM, the discharge state in the sputtering apparatus is stable, and the gas flow is not disturbed much. Accordingly, the batch-by-batch and area-by-area deviation of the specific resistances of the Ta thin film is small, realizing stable thin film formation.

By using a sintered TaN body containing nitrogen at a ratio of 4 to 5 mol %, deterioration of the MIM device by heat caused when the liquid crystal display device is turned on and generation of residual images are prevented. By setting the input power density applied to the sputtering target to the range of 5.0 to 11.5 W/cm$^2$, coefficient 1nA expressed by the Poole-Frenkel current is in the range of –35 to –27.5, which provides the MIM device with satisfactory characteristics. By restricting the input power density to the range of 7.0 to 10.0 W/cm$^2$, the characteristics of the MIM device are further improved, and thus the contrast ratio of the liquid crystal display device is raised.

By a method according to the present invention, the Ta thin films are uniform in the specific resistance both batch by batch and area by area even when produced consecutively in an in-line sputtering apparatus or a rotary sputtering apparatus.

As mentioned above, according to the present invention, a lower electrode of a two-terminal nonlinear device has a structure in which Ta poor portions (containing a small amount of nitrogen) and Ta rich portions (containing a large amount of nitrogen) are alternately deposited. The structure of the Ta poor portion is close to that of a thin β-Ta film and the structure of the Ta rich portion is close to that of a TaN film. Accordingly, an MIM device including an insulator obtained by the anodization of such a thin Ta film has the nonlinearity as excellent as that of a MIM device including an insulator obtained by the anodization of the β-Ta thin film. Further, nitrogen is taken in the Ta thin film, whereby the nonlinearity of the MIM device becomes thermally stable. Such a thin Ta film is obtained by a reactive sputtering using N$_2$ gas and a plurality of pieces of target (practically, 3 or 4 pieces of target) aligned in series.

Further, as mentioned in Example 2, when a thin Ta film is obtained by sputtering using sintered TaN containing nitrogen by amount in the range of 4 mol % to 7 mol %, the thin Ta film thus obtained has a structure in which the β-Ta films and α-Ta thin films are coexistent. Accordingly, an MIM device including an insulator obtained by the anodization of the thin Ta film has an excellent and thermally stable nonlinearity. Further, since the thin Ta film contains nitrogen, the structure of the thin Ta film is uniform and fine. When the thin Ta film is formed with the resistance coefficient (lnA) in the range of −32 to −28, the sputtering rate becomes 1.3 to 1.9 times as high as the ordinary one. As a result, although the thin Ta film has a uniform and fine structure, the intervals in a Ta lattice are enlarged, whereby the current can easily flow.

When a thin Ta film is formed by the combination of the above-mentioned two sputtering methods using sintered TaN target and $N_2$ gas, a sufficient amount of nitrogen for obtaining an excellent and thermally stable nonlinearity can be taken into the thin Ta film, even though the amount of nitrogen contained in sintered TaN is reduced. Due to this, intervals in a Ta lattice in the structure of the thin Ta film can be enlarged, whereby the current can flow more easily. Further, since the flow rate ratio of $N_2$ gas can be decreased, it is possible that the flow rate of $N_2$ gas introduced into a chamber can be strictly regulated, thereby obtaining a uniform Ta thin film.

Moreover, when the specific resistance of the thin Ta film is set in the above-mentioned range, the deterioration of the nonlinearity of the MIM device and the occurrence of a residual image can be prevented.

Furthermore, a more symmetrical curve of a current-voltage characteristic can be obtained by the anodization in a solution containing the ammonium group.

In Examples 1, 3 and 4, three pieces of target are employed. It is appreciated that the number of pieces of target is not limited to three. As long as two or more pieces of target are employed, the same effects as in Example 1, 3 and 4 can be obtained.

In Example 5, the batch-by-batch and area-by-area deviation of the specific resistances of the Ta thin film used as a lower electrode of an MIM device can be restricted to be low by using Kr gas as sputtering gas. Accordingly, more stable and uniform Ta thin film formation is realized.

Since the sputtering ratio of Kr gas is higher than that of Ar gas, the sputtering rate of Kr gas is higher than that of Ar gas. For this reason, the load applied to the sputtering target is alleviated and thus the production yield is enhanced when Kr gas is used. Further, the influence by the conditions of thin film formation of the sputtering apparatus on the resultant thin film is sufficiently small to secure stable thin film formation.

By forming a Ta thin film while maintaining the ratio of nitrogen contained in the sintered TaN body used as the sputtering target between 3 and 7 mol %, the deterioration of the MIM device by heat and generation of residual images are prevented, and the contrast ratio of the liquid crystal display device is raised. Further, by restricting the above ratio to the range of 4 to 5 mol %, the specific resistance of the Ta thin film used as the lower electrode is maintained in the range of 40 μΩcm to 60 μΩcm. Such a range is suitable for an MIM device.

By maintaining the Kr gas flow rate in the range between 30 and 300 SCCM, the area-by-area deviation of the specific resistances in one, and the same liquid crystal cell can be restricted to be low. Further, by keeping the gas flow rate in the range between 100 and 200 SCCM, the discharge state of the sputtering apparatus is stabilized, and thus the gas flow in the chamber is not disturbed much. As a result, the deviation of the specific resistances is reduced, and thus stable thin film formation is realized.

By setting the input power density applied to the sintered TaN body used as the sputtering target to the range between 5.0 and 11.5 W/cm², coefficient lnA expressed by the Poole-Frenkel current is −35 to −27.5. At such a range of lnA, the characteristics of the MIM device are satisfactory. Further, by restricting the input power density to the range from 7.0 to 10.0 W/cm², the characteristics of the MIM device are still enhanced and the contrast ratio of the liquid crystal display device is raised.

A liquid crystal display device including such an MIM device as a switching device enjoys high quality display with very few residual images and a high contrast ratio. Accordingly, such an MIM device is advantageously used in large-sized, highly precise liquid crystal display devices.

Various other modification will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a two-terminal non-linear device having a lower electrode, an insulator and an upper electrode, comprising the steps of:

forming the lower electrode on a substrate, forming an anodized oxide film by anodizing the lower electrode, and forming the upper electrode on the anodized oxide film, the step for forming the lower electrode including the steps of:

depositing a thin Ta film doped with nitrogen by a reactive sputtering using two or more pieces of a sintered TaN target in a mixed gas of argon gas and nitrogen gas, while conveying the substrate in a desired direction, the two or more pieces of the sintered TaN target being aligned in series in a direction where the substrate is conveyed, patterning the thin Ta film into a desired shape to form the lower electrode, wherein the amount of nitrogen contained in each piece of the sintered TaN target is 5 mol % or less, and wherein the thin Ta film is deposited at a sputtering power of 4 W/cm² for a unit area of each piece of the sintered TaN target.

2. A method for fabricating a two-terminal nonlinear device having a lower electrode, an insulator, and an upper electrode, comprising the steps of:

forming a lower electrode on a substrate, forming an anodized oxide film by anodizing the lower electrode, and forming the upper electrode on the anodized oxide film, the step for forming the lower electrode comprising the steps of:

depositing a thin Ta film doped with nitrogen on the substrate by sputtering using a sintered TaN target containing nitrogen in an amount substantially in the range of 4 mol % to 7 mol %, while conveying the substrate, and patterning the thin Ta film into a desired shape to form the lower electrode, wherein the step for forming the thin Ta film is conducted by a DC sputtering at such a sputtering power that a conductivity coefficient lnA is in the range of −32 to −28; wherein the conductivity coefficient is defined by the Poole-Frenkel equation, $\ln(A)=\ln(I/V)B^{\sqrt{V}}$, wherein I is the Poole-Frenkel current flowing between the upper electrode and the lower electrode of the device, V is the applied voltage and B is the non-linearity coefficient of the two-terminal device, and wherein the step for forming the thin Ta film is conducted under the condition that a sputtering power is in the range of 2.2 kW to 3.2 kW.

3. A method for fabricating a two-terminal nonlinear device according to claim 2, wherein the step for forming the thin Ta film is conducted under the condition that a temperature and the time for heating the substrate, a conveyance rate of the substrate, a distance between the substrate and the sintered TaN target, and a sputtering gas pressure are 100° C., 180 seconds, 100 mm/min, 77 mm and 0.40 Pa, respectively.

4. A method for producing a liquid crystal display device including two plates opposed to each other and a liquid crystal material interposed between the two plates, one of the two plates having, on a surface thereof opposed to the other plate, a plurality of pixel electrodes arranged in a matrix and a plurality of two-terminal nonlinear devices respectively connected to the plurality of pixel electrodes, the method comprising the steps of:

forming a Ta thin film used as a lower electrode of each two-terminal nonlinear device on the surface of the one of the plates by depositing Ta by sputtering using a sintered TaN body as a sputtering target and using an inert gas of a O-group element having an atomic weight which is at least equal to the atomic weight of Kr as sputtering gas;

forming an insulator on the Ta thin film; and forming a metal thin film used as an upper electrode of the two-terminal nonlinear device on the insulator; and wherein an input power density of 5.0 to 11.5 W/cm$^2$ is applied to the sintered TaN body.

5. A method according to claim 4, wherein nitrogen is contained in the sintered TaN body at a ratio of 3 to 7 mol %, and the sputtering gas is introduced at a flow rate of 30 to 300 SCCM.

6. A method according to claim 4, wherein nitrogen is contained in the sintered TaN body at a ratio of 4 to 5 mol %, and the sputtering gas is introduced at a flow rate of 100 to 200 SCCM.

7. A method for producing a liquid crystal display device including two plates opposed to each other and a liquid crystal material interposed between the two plates, one of the two plates having, on a surface thereof opposed to the other plate, a plurality of pixel electrodes arranged in a matrix and a plurality of two-terminal nonlinear devices respectively connected to the plurality of pixel electrodes, the method comprising the steps of:

forming a Ta thin film used as a lower electrode of each two-terminal nonlinear device on the surface of the one of the plates by depositing Ta by sputtering using a sintered TaN body as a sputtering target and using an inert gas of a O-group element having an atomic weight which is at least equal to the atomic weight of Kr as sputtering gas;

forming an insulator on the Ta thin film; and forming a metal thin film used as an upper electrode of the two-terminal nonlinear device on the insulator; and wherein an input power density of 7.0 to 10.0 W/cm$^2$ is applied to the sintered TaN body.

* * * * *